US010290573B2

(12) United States Patent
Fujita

(10) Patent No.: US 10,290,573 B2
(45) Date of Patent: May 14, 2019

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Masashi Fujita, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 94 days.

(21) Appl. No.: 15/189,123

(22) Filed: Jun. 22, 2016

(65) Prior Publication Data

US 2017/0005669 A1   Jan. 5, 2017

(30) Foreign Application Priority Data

Jul. 2, 2015   (JP) ................................. 2015-133572
Jun. 14, 2016   (JP) ................................. 2016-118083

(51) Int. Cl.
| H03M 1/66 | (2006.01) |
| H01L 23/50 | (2006.01) |
| H01L 29/786 | (2006.01) |
| H01L 27/12 | (2006.01) |
| H03M 1/00 | (2006.01) |
| H03M 1/74 | (2006.01) |

(52) U.S. Cl.
CPC .......... *H01L 23/50* (2013.01); *H01L 27/1214* (2013.01); *H01L 27/1255* (2013.01); *H01L 29/7869* (2013.01); *H03M 1/002* (2013.01); *H03M 1/745* (2013.01)

(58) Field of Classification Search
CPC ........ H03M 1/747; H03M 1/66; H03M 1/742; H03M 3/464; H03M 1/74; H03M 1/745; H03M 3/502
USPC .......................................... 341/144–154, 122
See application file for complete search history.

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1737044 A   12/2006
EP   2226847 A   9/2010
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Linh V Nguyen
(74) *Attorney, Agent, or Firm* — Fish & Richardson P.C.

(57) ABSTRACT

A semiconductor device with low power consumption is provided. The semiconductor device can serve as a current output DA converter. The semiconductor device converts a current corresponding to a digital signal into a voltage and then holds the voltage, which allows output of the analog voltage even after stopping supply of the current. A plurality of circuits that converts a current into a voltage is provided, whereby a settling time for changing the analog output voltage is reduced.

20 Claims, 41 Drawing Sheets

(56) References Cited

U.S. PATENT DOCUMENTS

| | | | |
|---|---|---|---|
| 6,294,274 B1 | 9/2001 | Kawazoe et al. | |
| 6,337,647 B1* | 1/2002 | Masson | H03M 1/0863 332/109 |
| 6,563,174 B2 | 5/2003 | Kawasaki et al. | |
| 6,727,522 B1 | 4/2004 | Kawasaki et al. | |
| 6,914,470 B2 | 7/2005 | Watanabe et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,230,561 B2* | 6/2007 | Lee | G06J 1/00 341/144 |
| 7,256,756 B2 | 8/2007 | Abe | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,797,440 B2* | 8/2014 | Matsuura | H04N 5/378 341/155 |
| 2001/0046027 A1 | 11/2001 | Tai et al. | |
| 2002/0056838 A1 | 5/2002 | Ogawa | |
| 2002/0084840 A1 | 7/2002 | Tsuchi | |
| 2002/0132454 A1 | 9/2002 | Ohtsu et al. | |
| 2003/0030054 A1 | 2/2003 | Hector et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0206543 A1* | 9/2005 | Draxelmayr | H03M 3/372 341/143 |
| 2006/0012501 A1* | 1/2006 | Lee | H03M 1/682 341/144 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0055141 A1* | 3/2008 | Ryu | H03M 3/464 341/144 |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0040164 A1* | 2/2009 | Yamashita | G09G 3/3688 345/98 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117730 A1* | 5/2010 | Kawai | H03F 3/2173 330/251 |
| 2011/0121880 A1* | 5/2011 | Lee | H03F 3/45968 327/307 |
| 2011/0193733 A1* | 8/2011 | Kuramochi | H03M 1/1061 341/144 |
| 2012/0001784 A1* | 1/2012 | Pedersen | H03M 1/1004 341/120 |
| 2012/0306678 A1* | 12/2012 | Hezar | H03M 1/747 341/146 |
| 2013/0090873 A1* | 4/2013 | Lundstrum | H03K 17/962 702/64 |
| 2013/0126879 A1* | 5/2013 | Kimura | G09G 3/3241 257/59 |
| 2013/0234874 A1* | 9/2013 | Bailey | H03M 1/822 341/150 |
| 2015/0060864 A1 | 3/2015 | Kimura et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2012-060618 A | 3/2012 |
| WO | WO-2004/114391 | 12/2004 |

OTHER PUBLICATIONS

Asaoka.Y et al., "29.1:Polarizer-Free Reflective LCD Combined With Ultra Low-Power Dricing Technology", SID Digest '09 : SID International Symposium Digest of Technical Ppers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"". Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102.3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Wmploying MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '09 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "SPINEL,YbFe2O4, and Yb2Fe3O7 Types of Structures for Compounds in the In2O3 and Sc2O3—A2O3—BO Systems [A; Fe, Ga or Al; B: Mg, Mn, FE, Ni, Cu,or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '09 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW'02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

100

100

200c

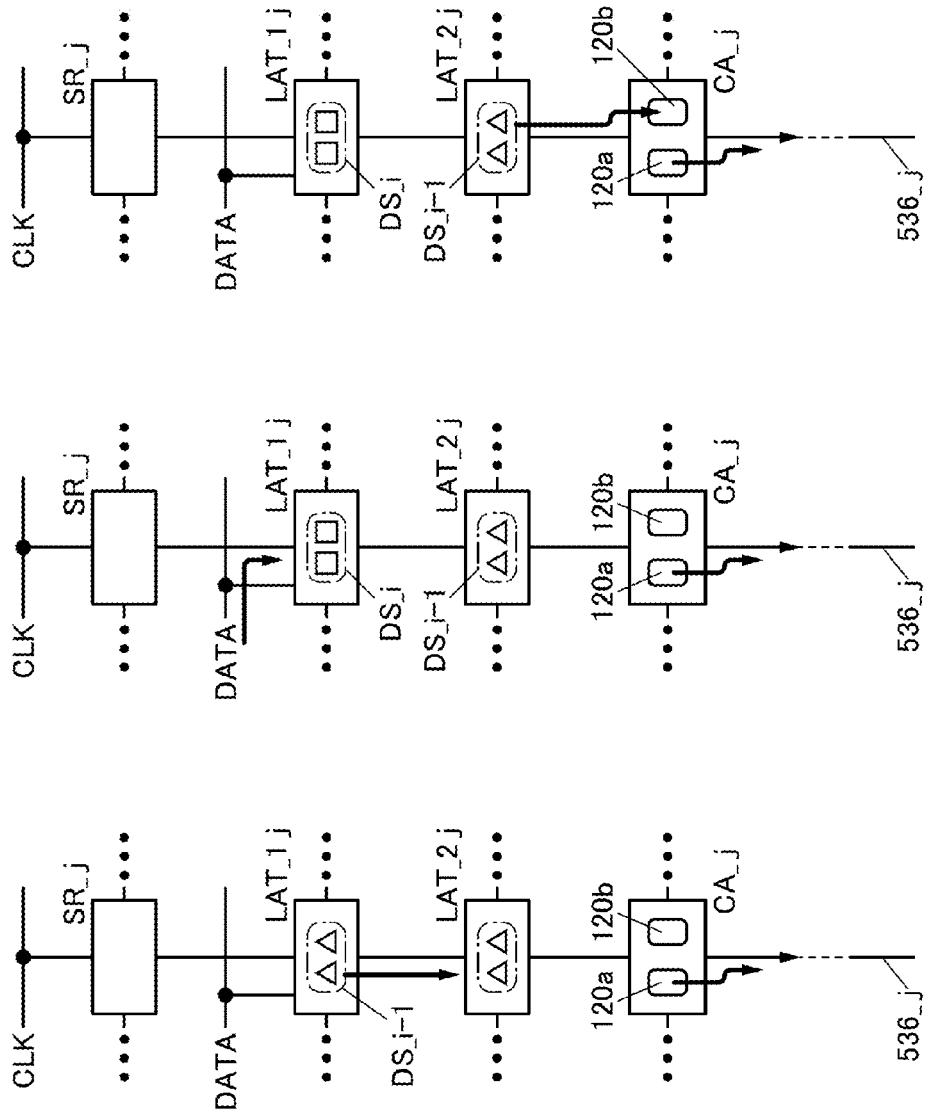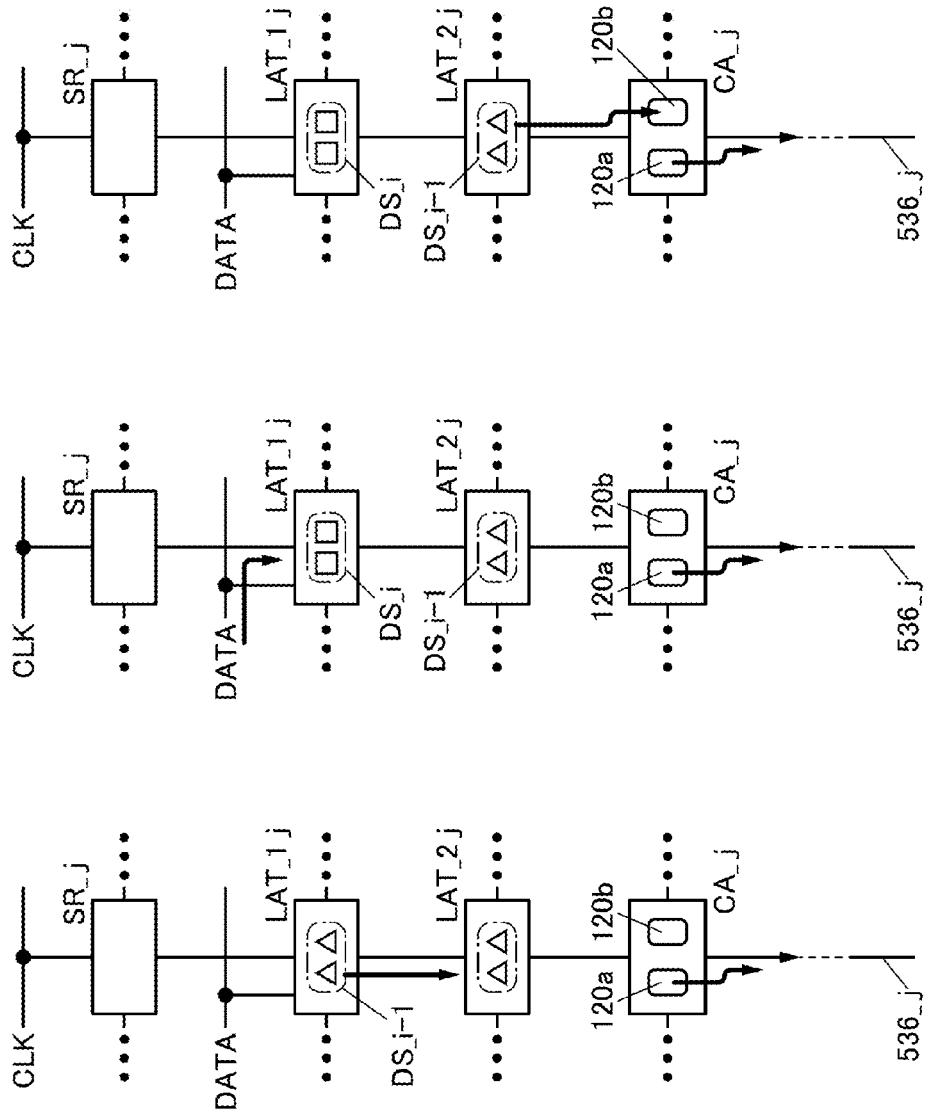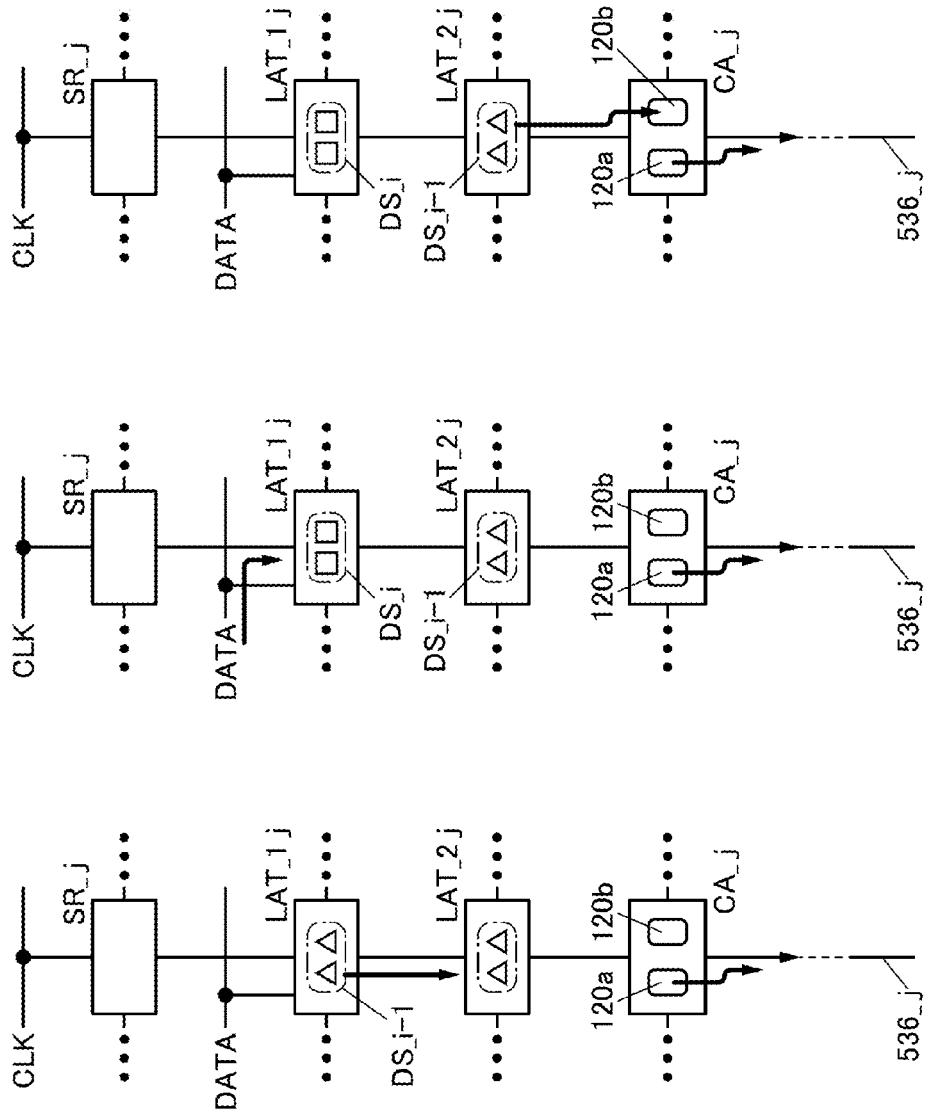

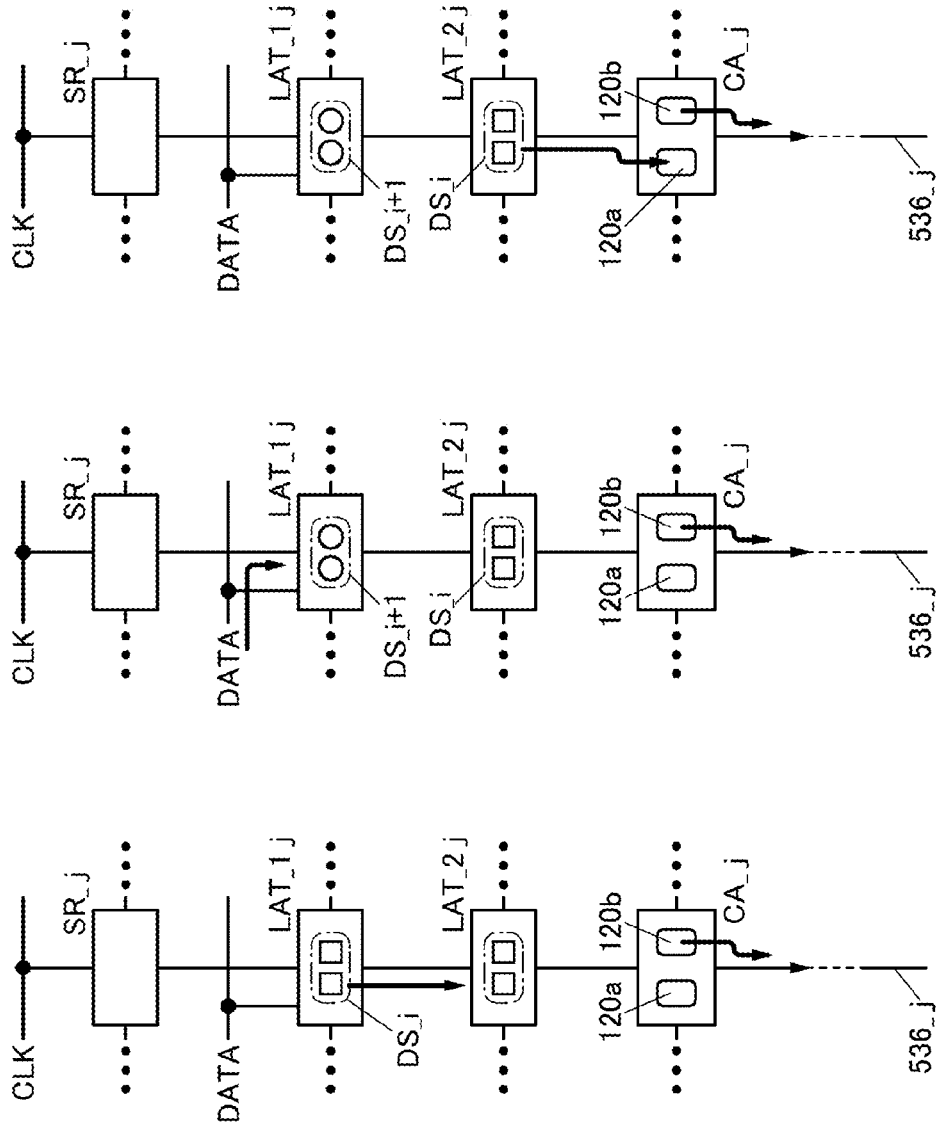

FIG. 25A1
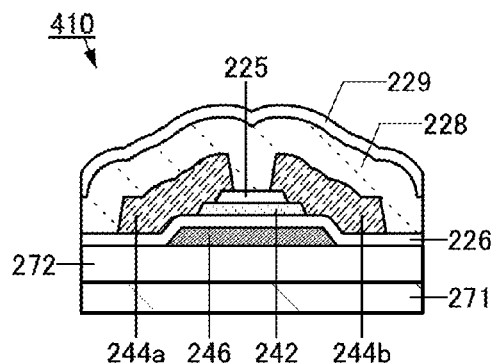
FIG. 25A2
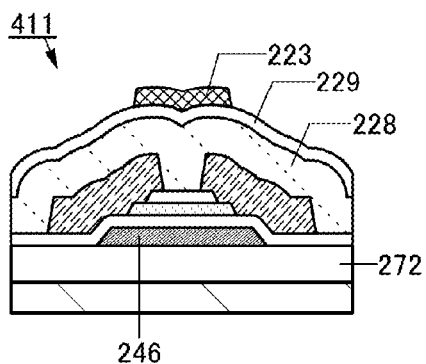
FIG. 25B1
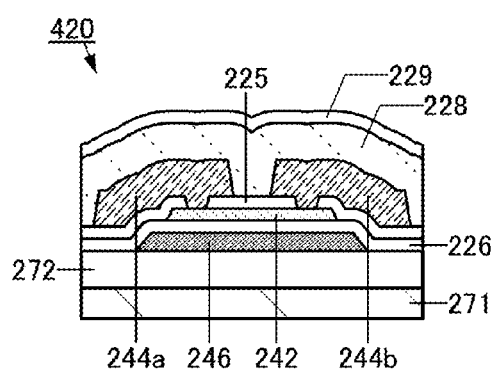
FIG. 25B2
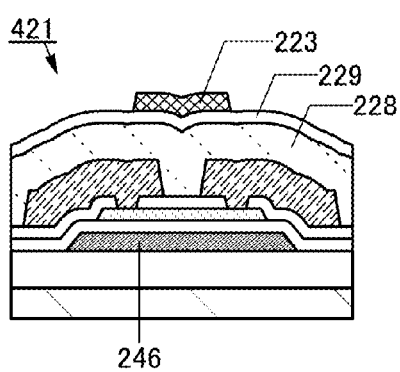
FIG. 25C1
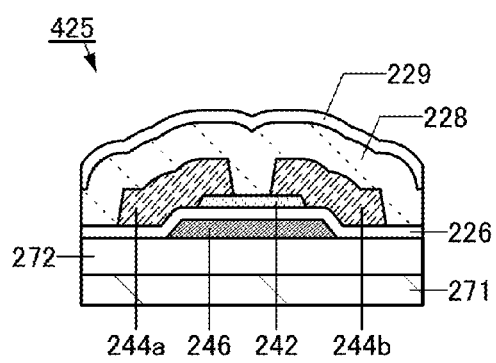
FIG. 25C2
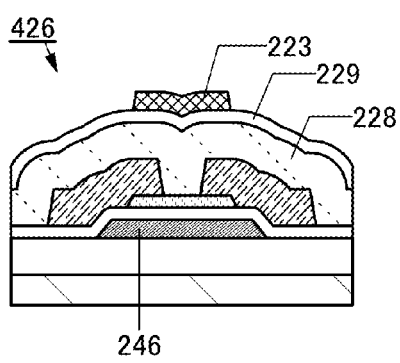

FIG. 26A1
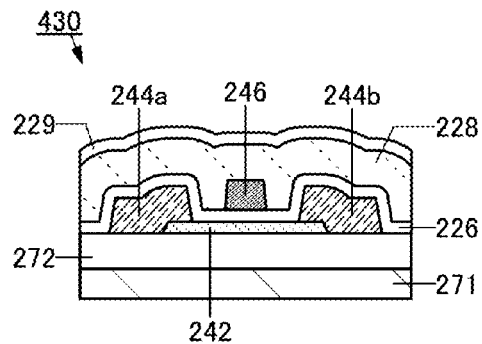
FIG. 26A2
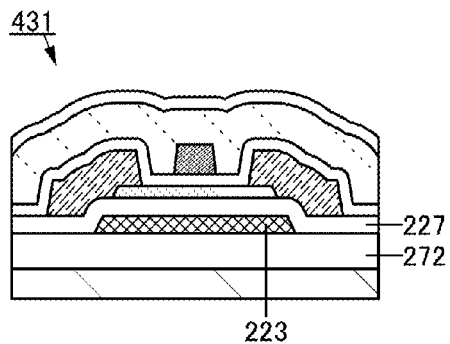
FIG. 26A3
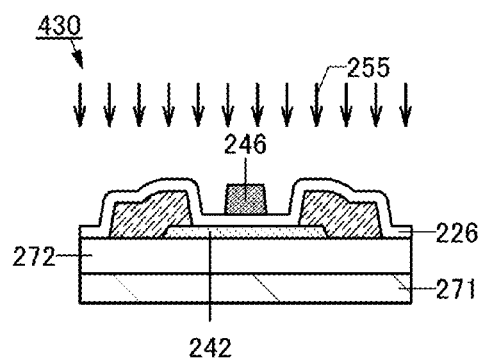
FIG. 26B1
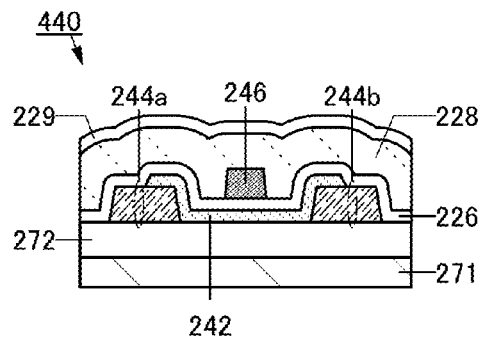
FIG. 26B2
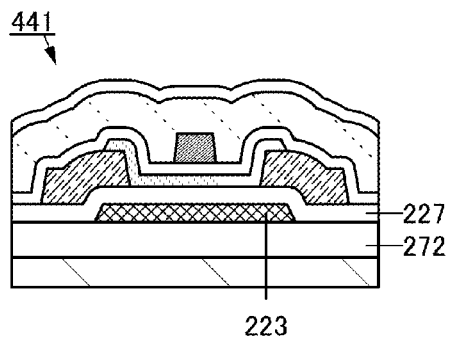

FIG. 27A1
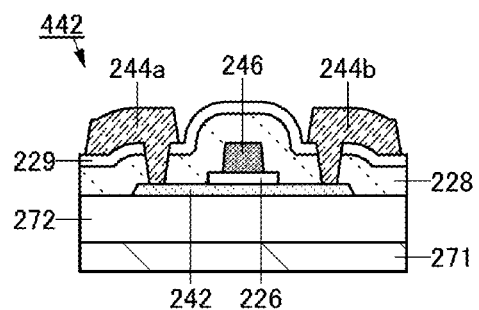
FIG. 27A2
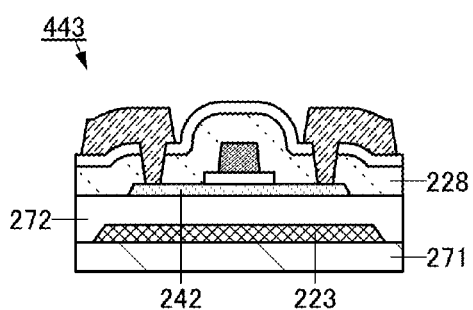
FIG. 27A3
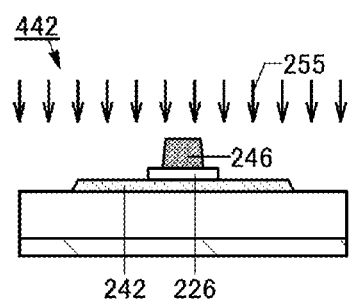
FIG. 27B1
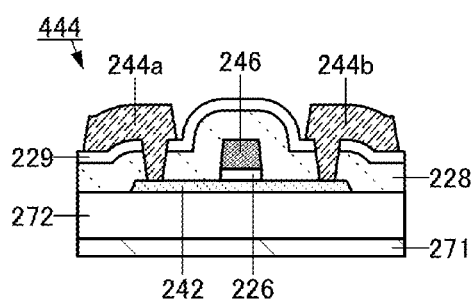
FIG. 27B2
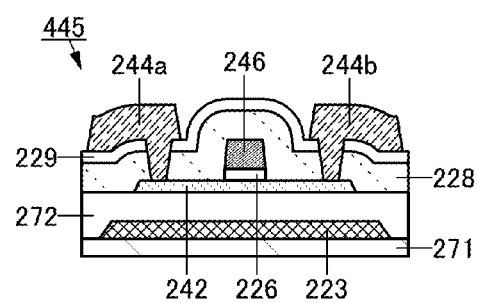
FIG. 27C1
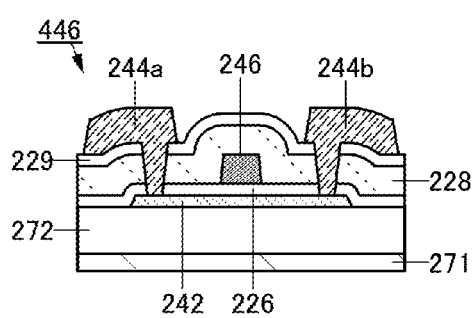
FIG. 27C2
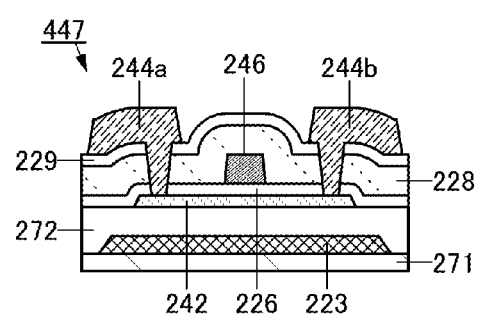

FIG. 28A
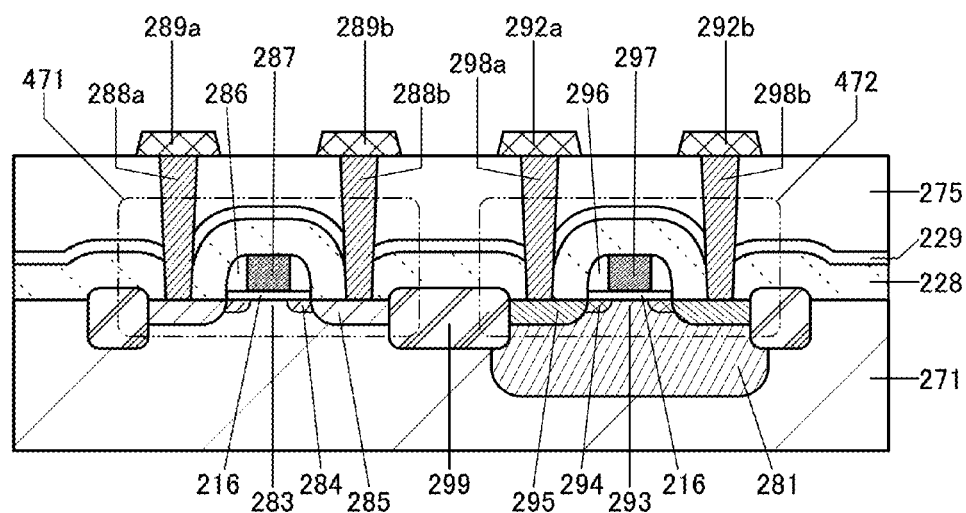
FIG. 28B1
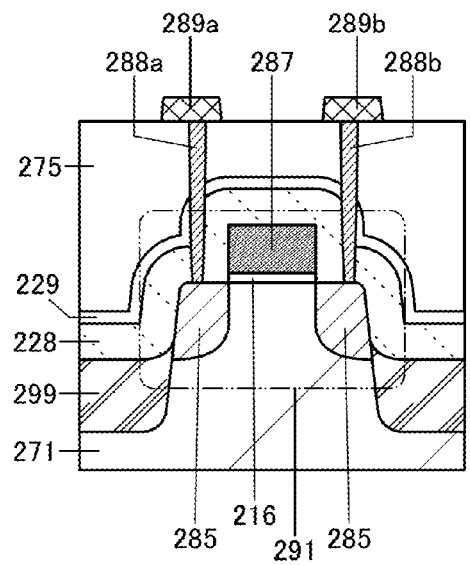
FIG. 28B2
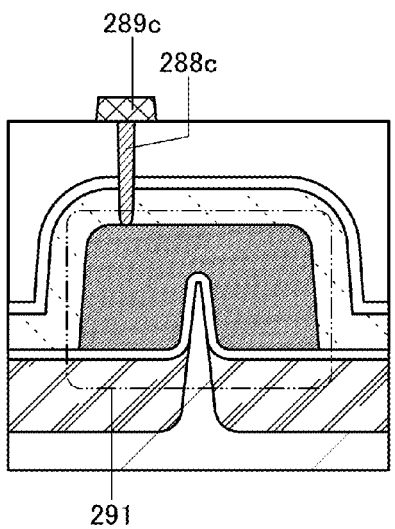

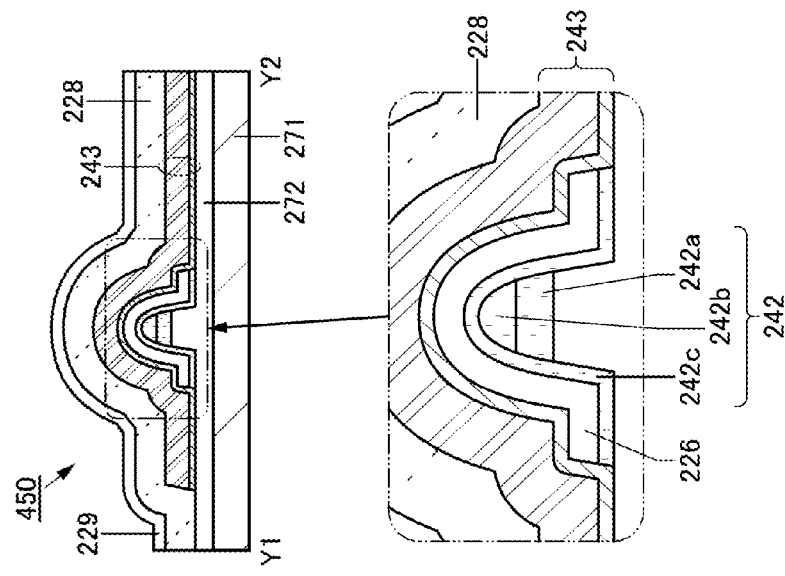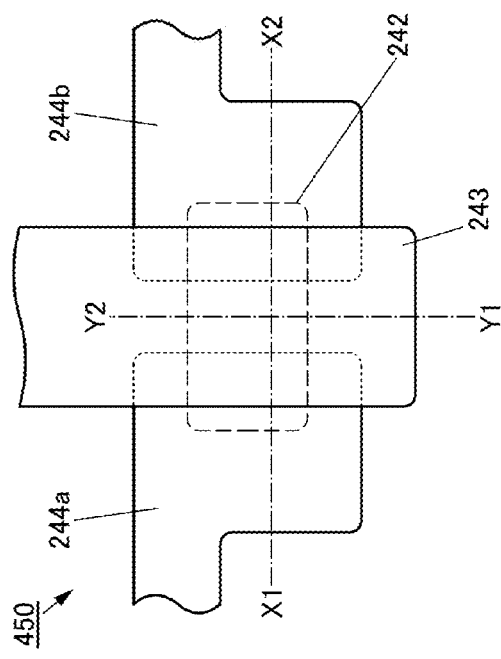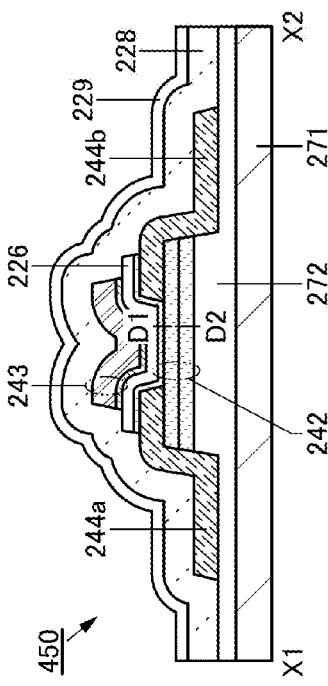

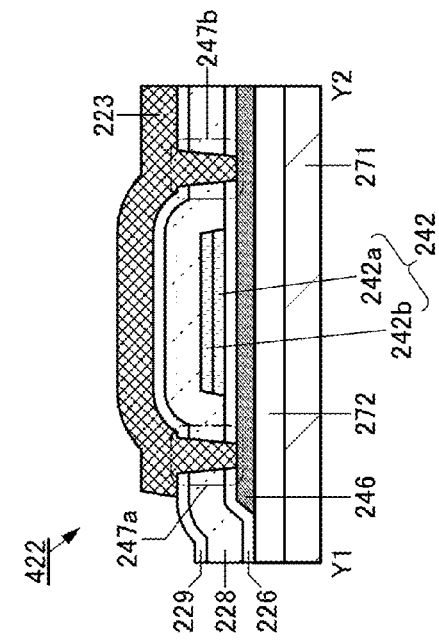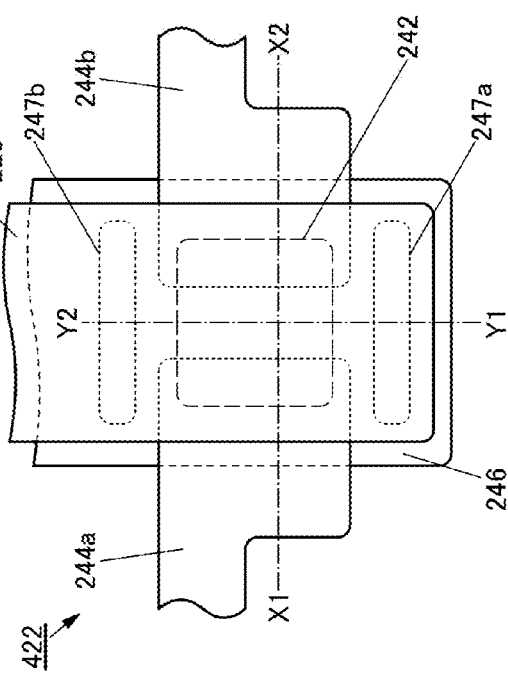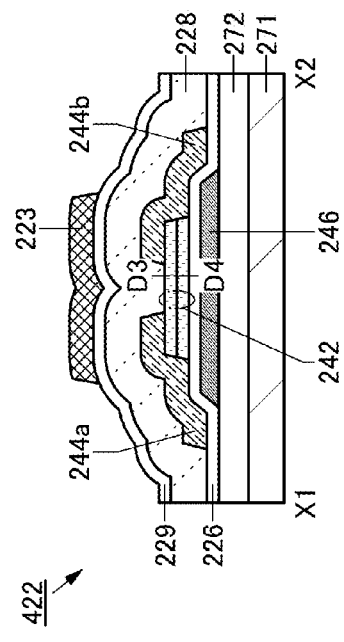

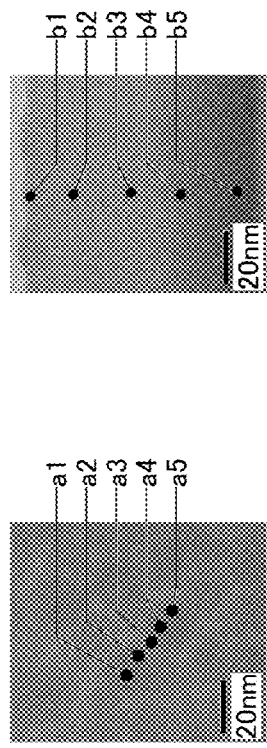
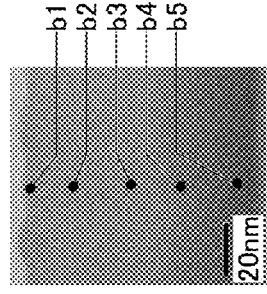
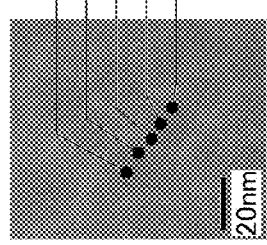
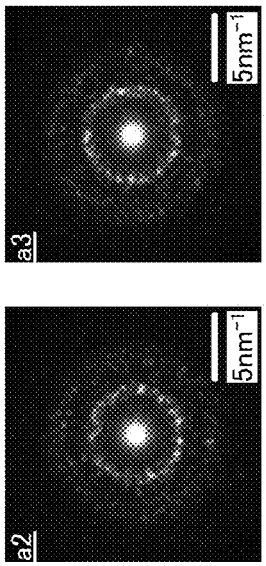
FIG. 40A
FIG. 40B
FIG. 40C
FIG. 40D
FIG. 40E
FIG. 40F
FIG. 40G
FIG. 40H
FIG. 40I
FIG. 40J
FIG. 40K
FIG. 40L

SEMICONDUCTOR DEVICE AND ELECTRONIC DEVICE

BACKGROUND OF THE INVENTION

1. Field of the Invention

One embodiment of the present invention relates to a semiconductor device and a driving method thereof.

Note that one embodiment of the present invention is not limited to the above technical field. For example, one embodiment of the present invention relates to an object, a method, or a manufacturing method. Further, one embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an electronic device, and the like include a semiconductor device in some cases.

2. Description of the Related Art

With the recent rapid spread of portable information terminals such as smartphones, improvement in performance of portable information terminals has progressed rapidly. Display devices used in portable information terminals are required to have high definition, high image quality, low power consumption, and the like.

An active-matrix display device where a transistor for driving a display element is provided in each pixel is known. For example, an active-matrix liquid crystal display device that includes a liquid crystal element as a display element, an active-matrix EL display device that includes an organic EL element as a display element, and the like are known. An active-matrix display device is easy to increase in display size or definition as compared to a simple-matrix display device, and is advantageous in reduction in power consumption and the like.

Along with an increase in the definition and image quality of display devices, digitally-driven display devices have attracted increased attention. A display device digitally driven converts a video signal supplied as a digital signal into an analog signal (greyscale signal) to display an image. In order to convert a digital signal into an analog signal, a DA converter or DAC (also referred to as a digital-to-analog converter) is used. Various types of DA converters (e.g., a pulse width modulation type, a resistor ladder type, a resistor string type, a capacitor array type, a delta-sigma type, and a current output type) are known. For example, a current output DA converter disclosed in Patent Document 1 is known.

REFERENCE

[Patent Document 1] Japanese Published Patent Application No. 2012-60618

SUMMARY OF THE INVENTION

The DA converter disclosed in Patent Document 1 generates an output voltage VREF with the use of resistance R and total current Itotal that is supplied in response to a digital input signal. The output voltage VREF is determined by the product of the total current Itotal and the resistance R; therefore, the total current Itotal should always flow in the resistance R during a period of outputting the output voltage VREF. Thus, it is difficult to reduce the power consumption of the DA converter.

An object of one embodiment of the present invention is to provide a low-power-consumption semiconductor device or the like. Another object is to provide a highly reliable semiconductor device or the like. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first circuit and a second circuit. The first circuit includes t current sources $I_1$ to $I_t$ (t is a natural number of 2 or more) and t switches $S_1$ to $S_t$. A j-th current source $I_j$ (j is a natural number larger than or equal to 1 and smaller than or equal to t) is electrically connected to one terminal of a j-th switch $S_j$, and the other terminals of the switches $S_1$ to $S_t$ are electrically connected to a first node. The second circuit includes a third circuit and a fourth circuit. The third circuit includes first to third switches and a first capacitor. One terminal of the first switch is electrically connected to the first node, and the other terminal of the first switch is electrically connected to a second node. One terminal of the second switch is electrically connected to the second node, and the other terminal of the second switch is electrically connected to a third node. One terminal of the third switch is electrically connected to the second node, and the other terminal of the third switch is electrically connected to a sixth node. One terminal of the first capacitor is electrically connected to the second node, and the other terminal of the first capacitor is electrically connected the third node. The fourth circuit includes fourth to sixth switches and a second capacitor. One terminal of the fourth switch is electrically connected to the first node, and the other terminal of the fourth switch is electrically connected to a fourth node. One terminal of the fifth switch is electrically connected to the fourth node, and the other terminal of the fifth switch is electrically connected to a fifth node. One terminal of the sixth switch is electrically connected to the fourth node, and the other terminal of the sixth switch is electrically connected to the sixth node. One terminal of the second capacitor is electrically connected to the fourth node, and the other terminal of the second capacitor is electrically connected to the fifth node.

As the switches $S_1$ to $S_t$, transistors can be used. As the first to sixth switches, transistors can be used. For the transistors, a transistor that includes an oxide semiconductor in a semiconductor layer in which a channel is formed is preferable.

Another embodiment of the present invention is the semiconductor device where a fifth circuit is electrically connected to the sixth node. It is preferable that the fifth circuit can serve as a buffer. The fifth circuit may serve as a differential amplifier circuit.

A low-power-consumption semiconductor device or the like can be provided. Alternatively, a highly reliable semiconductor device or the like can be provided. Alternatively, a novel semiconductor device or the like can be provided.

Note that the descriptions of these effects do not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 22A to 22C show operation of a semiconductor device;

FIGS. 23A to 23C show operation of a semiconductor device;

FIGS. 25A1 to 25C2 each illustrate a semiconductor device;

FIGS. 26A1 to 26B2 each illustrate a semiconductor device;

FIGS. 27A1 to 27C2 each illustrate a semiconductor device;

FIGS. 28A to 28B2 each illustrate a semiconductor device;

FIGS. 29A to 29C illustrate a semiconductor device;

FIGS. 30A to 30C illustrate a semiconductor device;

FIGS. 40A and 40B are TEM images of samples and FIGS. 40C to 40L are electron diffraction patterns thereof.

DETAILED DESCRIPTION OF THE INVENTION

Figure 1:
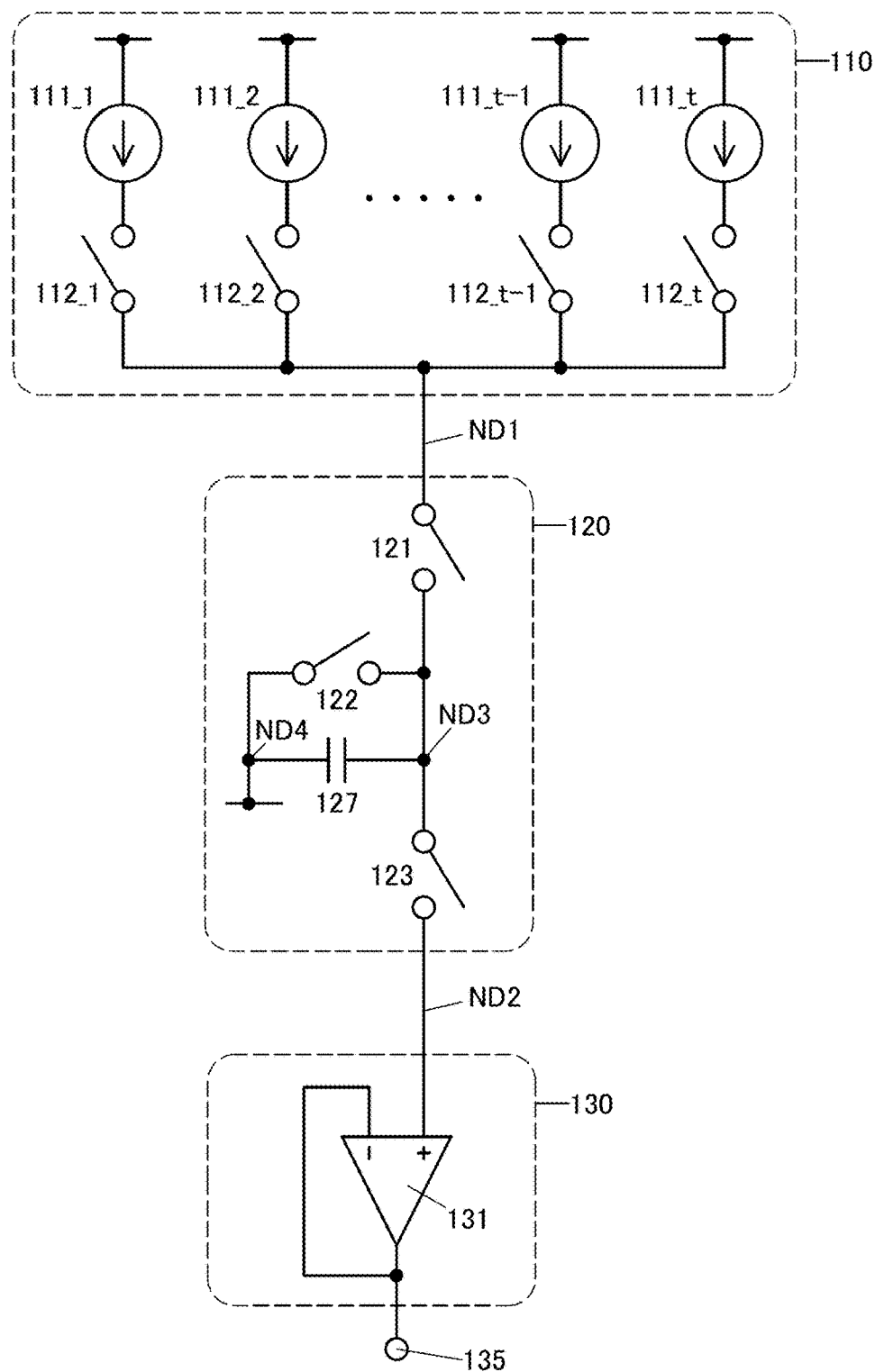
FIG. 1 is a circuit diagram illustrating a semiconductor device.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the present invention is not necessarily limited to the position, size, range, or the like disclosed in the drawings and the like.

In the drawings, some components might not be illustrated for easy understanding of the invention. In addition, some hidden lines and the like might not be shown.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings".

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Further, functions of the source and the drain might be switched depending on operation conditions, e.g., when a transistor having a different polarity is employed or a direction of current flow is changed in circuit operation. Thus, the terms "source" and "drain" can be switched in this specification.

In this specification and the like, when it is explicitly described that X and Y are connected, the case where X and Y are electrically connected, the case where X and Y are functionally connected, and the case where X and Y are directly connected are included therein. Accordingly, without being limited to a predetermined connection relation, for example, a connection relation shown in drawings or text, another connection relation is included in the drawings or the text.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "to be electrically connected" is used in this specification, there is a case in which no physical connection is made and a wiring is just extended in an actual circuit.

Note that a channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed (also referred to as a "channel formation region") in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (also referred to as an "effective channel width") is different from a channel width shown in a top view of a transistor (also referred to as an "apparent channel width") in some cases. For example, in a transistor having a gate electrode covering side surfaces of a semiconductor layer, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor may be increased. In that case, an effective channel width is greater than an apparent channel width.

In such a case, an effective channel width is difficult to measure in some cases. For example, to estimate an effective channel width from a design value, it is necessary to assume that a semiconductor has a known shape. Therefore, in the case where the shape of a semiconductor is unclear, it is difficult to measure an effective channel width accurately.

In this specification, an apparent channel width is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; the specific examples are hydrogen (included also in water), lithium, sodium, silicon, boron, phosphorus, carbon, nitrogen, and the like. In the case of an oxide semiconductor, oxygen vacancy may be formed by entry of impurities such as hydrogen. Further, in the case where the semiconductor is silicon, examples of an impurity which changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "substantially parallel" indicates that the angle formed between two straight lines is greater than or equal to $-30°$ and less than or equal to $30°$. The term "perpendicular" or "orthogonal" indicates that the angle formed between two straight lines is greater than or equal to $80°$ and less than or equal to $100°$, and accordingly also includes the case where the angle is greater than or equal to $85°$ and less than or equal to $95°$. The term "substantially perpendicular" indicates that the angle formed between two straight lines is greater than or equal to $60°$ and less than or equal to $120°$.

In the specification and the like, the terms "identical," "the same," "equal," "uniform," and the like (including synonyms thereof) used in describing calculation values and actual measurement values allow for a margin of error of $±20\%$ unless otherwise specified.

In this specification, in the case where an etching step is performed after a photolithography process, a resist mask formed in the photolithography process is removed after the etching step, unless otherwise specified.

In this specification and the like, a high power supply potential VDD (hereinafter also simply referred to as VDD or H potential) is a power supply potential higher than a low power supply potential VSS. The low power supply potential VSS (hereinafter also simply referred to as VSS or L potential) is a power supply potential lower than the high power supply potential VDD. A ground potential can be used as VDD or VSS. For example, in the case where a ground potential is used as VDD, VSS is lower than the ground potential, and in the case where a ground potential is used as VSS, VDD is higher than the ground potential.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification, trigonal and rhombohedral crystal systems are included in a hexagonal crystal system.

(Embodiment 1)

In this embodiment, a semiconductor device 100 of one embodiment of the present invention is described with reference to drawings. The semiconductor device 100 has a function of converting a t-bit digital signal (t is a natural number of 2 or more) into a voltage signal.

<Structure of Semiconductor Device 100>

FIG. 1 is a circuit diagram illustrating a structure of the semiconductor device 100. The semiconductor device 100 includes a DA converter 110, a current-voltage converter 120, and an amplifier 130. The DA converter 110 is electrically connected to the current-voltage converter 120 through a node ND1. The current-voltage converter 120 is electrically connected to the amplifier 130 through a node ND2.

[DA Converter 110]

The DA converter 110 includes t current sources 111 (current source 111_1 to 111_t) and t switches 112 (switch 112_1 to switch 112_t). A k-th current source 111 (current source 111_k) is electrically connected to one terminal of a k-th switch 112 (switch 112_k; k is a natural number larger than or equal to 1 and smaller than or equal to t), and the other terminal of the switch 112_k is electrically connected to the node ND1.

The switches 112 respectively correspond to digits of the t-bit digital signal. For example, the switch 112_1 corresponds to the first digit (first bit) of the digital signal, and the switch 112_k corresponds to the k-th digit (k-th bit) of the digital signal.

The current sources 111 respectively correspond to the digits of the t-bit digital signal. For example, the current source 111_1 corresponds to the first digit (first bit) of the digital signal, and the current source 111_k corresponds to the k-th digit (k-th bit) of the digital signal.

The current source 111_1 has a function of supplying the node ND1 with a constant current when the switch 112_1 is on (in a conduction state). The current source 111_2 has a function of supplying the node ND1 with a current twice as large as that from the current source 111_1 when the switch 1122 is on. The current source 111_k has a function of supplying the node ND1 with a current $2^n$ times as large as that from the current source 111_1 when the switch 112_k is on.

For example, when a 4-bit digital signal "1011" is input to the DA converter 110, the switches 112_1, 112_2, and 112_4 are turned on while the switch 112_3 is off (in a non-conduction state). When the value of a current supplied from the current source 111_1 to the node ND1 is S amperes, 11S (S+2S+8S) amperes are supplied to the ND1 in total. In this way, the DA converter 110 can supply the node ND1 with a current corresponding to the value of a digital signal.

[Current-Voltage Converter 120]

The current-voltage converter 120 includes switches 121, 122, and 123, and a capacitor 127. One terminal of the switch 121 is electrically connected to the node ND1, and the other terminal is electrically connected to a node ND3. One terminal of the switch 122 is electrically connected to the node ND3, and the other terminal is electrically connected to a node ND4. One terminal of the switch 123 is electrically connected to the node ND3, and the other terminal is electrically connected to a node ND2. One terminal of the capacitor 127 is electrically connected to the node ND3, and the other terminal is electrically connected to the node ND4. A constant potential is supplied to the node ND4. A potential supplied to the node ND4 can be any potential as long as it is a constant potential, and may be a ground potential or a common potential. In this embodiment, a ground potential is supplied to the node ND4.

The switch 121 has a function of electrically connecting the node ND1 with the node ND3. The switch 122 has a function of supplying the potential of the node ND4 to the node ND3. The switch 123 has a function of electrically connecting the node ND3 with the node ND2. The capacitor 127 has a function of holding charge supplied from the DA converter 110.

The current-voltage converter 120 has a function of converting the current supplied from the DA converter 110 through the node ND1 into a voltage (potential). The current-voltage converter 120 also has a function of holding the potential of the node ND3 for a certain period even after supply of the current stops.

[Amplifier 130]

The amplifier 130 has a function of amplifying the supplied signal and outputting the amplified signal from an output terminal 135. In this embodiment, an operation amplifier 131 is used in the amplifier 130. A non-inverting input terminal of the operation amplifier 131 in the amplifier 130 is electrically connected to the node ND2, and an inverting input terminal is electrically connected to the output terminal 135.

The amplifier 130 in FIG. 1 outputs, from the output terminal 135, the same potential as that in the node ND3. In that case, although the potential of the signal output from the output terminal 135 is the same as the potential of the signal input to the amplifier 130, the current supply capability of the signal is increased. The amplifier 130 in FIG. 1 can serve as a buffer.

Figure 2A:
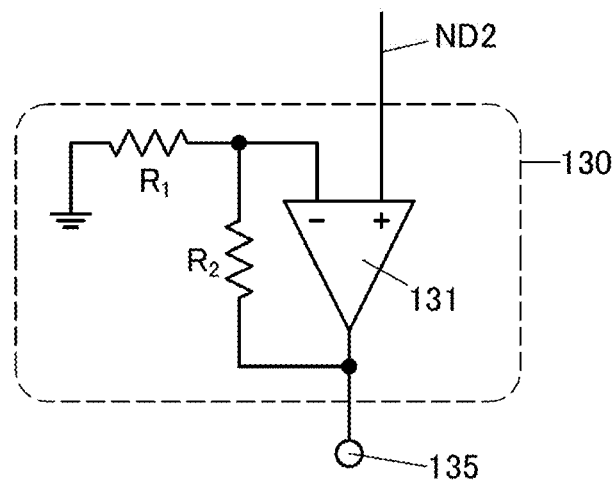
FIGS. 2A and 2B are circuit diagrams each illustrating a semiconductor device.
Figure 2B:
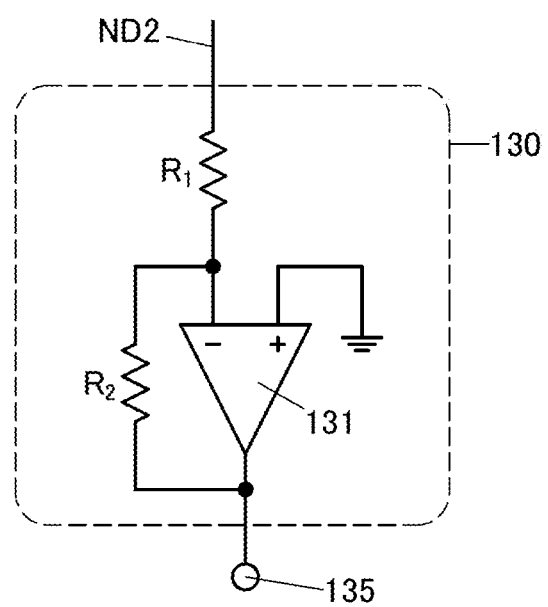

The amplifier 130 may serve as a differential amplifier circuit. FIGS. 2A and 2B show structure examples of the amplifier 130 that can serve as a differential amplifier circuit. As shown in FIG. 2A, the inverting input terminal is connected to the ground potential through a resistor $R_1$ and is also connected to the output terminal 135 through a resistor $R_2$, whereby the potential of a signal supplied to the node ND2 can be amplified and output to the output terminal 135. When the potential of a signal supplied to the node ND2 and that of a signal output from the output terminal 135 are respectively expressed as $V_{in}$ and $V_{out}$, the relationship between the potentials can be represented by Formula 1.

[Formula 1]

$$V_{out} = \left(1 + \frac{R_2}{R_1}\right) V_{in} \qquad (1)$$

Alternatively, when the inverting input terminal is connected to the node ND2 through the resistor $R_1$ and is also connected to the output terminal 135 through the resistor $R_2$ as shown in FIG. 2B, the phase of a signal supplied to the node ND2 can be changed by 180° and output to the output terminal 135. When the potential of a signal supplied to the node ND2 and that of a signal output from the output terminal 135 are respectively expressed as $V_{in}$ and $V_{out}$, the relationship between the potentials can be represented by Formula 2.

[Formula 2]

$$V_{out} = -\frac{R_2}{R_1} V_{in} \quad (2)$$

Figure 3:
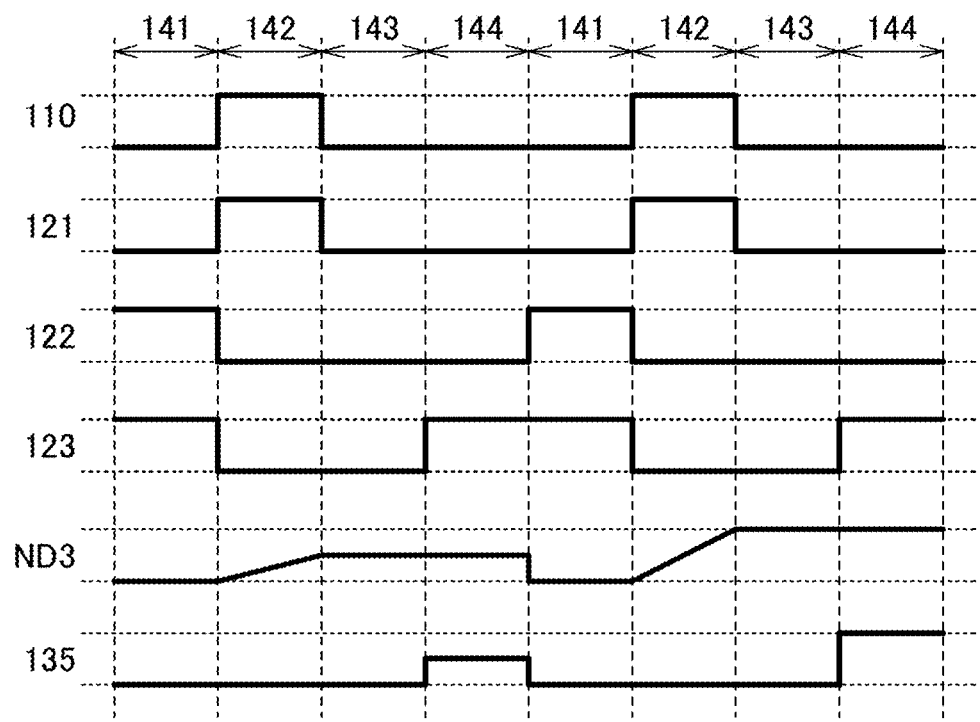
FIG. 3 is a timing chart illustrating operation of a semiconductor device.

The structure of the amplifier 130 is not limited to those shown in this embodiment.
<Operation of Semiconductor Device 100>
Operation of the semiconductor device 100 in FIG. 1 is described with reference to a timing chart in FIG. 3. The timing chart of FIG. 3 shows the operation or non-operation of the DA converter 110. In addition, the timing chart of FIG. 3 shows the on/off states of the switches 121, 122, and 123, and the potential changes of the node ND3 and the output terminal 135.

In a period 141, the switch 121 is off and the switches 122 and 123 are on. As a result, the potential of the node ND4 is supplied to the nodes ND3 and ND2 (reset operation).

In a period 142, the switches 122 and 123 are turned off and the switch 121 is turned on. In addition, a current corresponding to a digital signal input to the DA converter 110 is supplied from the DA converter to the node ND1. The current is supplied to the node ND3 through the nodes ND1 and the switch 121, whereby the potential of the node ND3 changes (writing operation).

In a period 143, the switch 121 is turned off, whereby the potential change of the node ND3 stops (holding operation). At this time, the node ND3 has a potential corresponding to the digital signal input to the DA converter 110. In addition, the current supply operation by the DA converter 110 also stops.

In a period 144, the switch 123 is turned on, whereby the potential of the node ND3 is input to the non-inverting input terminal of the operation amplifier 131 through the node ND2. Furthermore, the same potential as the potential input to the non-inverting terminal is output from the output terminal 135 (output operation).

Since the node ND3 is connected to the capacitor 127, the potential of the node ND3 can be held even after switching off the switch 121. Thus, it is not necessary to continuously supply the current to the node ND3 during the output operation, which reduces power consumption by the semiconductor device 100.

The switches in the semiconductor device 100 may be elements whose on/off states can be switched by electric signals; for example, a transistor (e.g., a bipolar transistor or a field effect transistor (FET)), a diode, a relay, or the like can be used.

Figure 4:
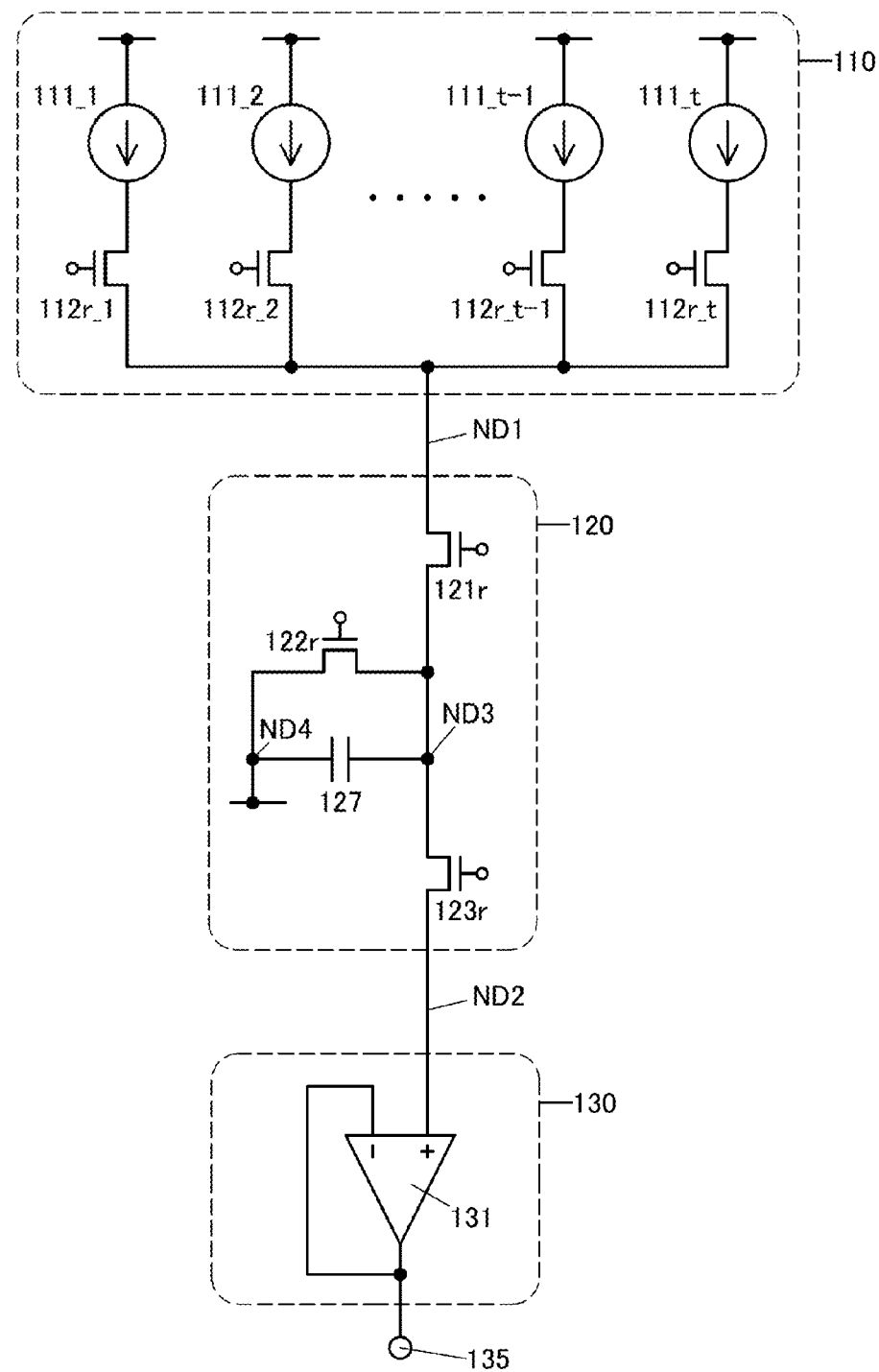
FIG. 4 is a circuit diagram illustrating a semiconductor device.

As an example, a circuit diagram of the semiconductor device 100 in which FETs are used for the switches 112, 121, 122, and 123 are shown in FIG. 4. In FIG. 4, the switches 112, 121, 122, and 123 are replaced with transistors 112r, 121r, 122r, and 123r, respectively. The transistors used as the switches may be n-channel or p-channel transistors. As appropriate, n-channel transistors and p-channel transistors may be used in combination.

When an FET is used as the switch, it is preferably a transistor in which a semiconductor layer where a channel is formed is an oxide semiconductor (hereinafter also referred to as an OS transistor). The oxide semiconductor has a band gap of 2 eV or more; therefore, a transistor including an oxide semiconductor in a semiconductor layer in which a channel is formed has an extremely small off-state current. Specifically, the off-state current per micrometer in channel width at room temperature (25° C.) at a source-drain voltage of 3.5 V can be lower than $1 \times 10^{-20}$ A, lower than $1 \times 10^{-22}$ A, or lower than $1 \times 10^{-24}$ A. That is, the on/off ratio of the transistor can be greater than or equal to 20 digits and less than or equal to 150 digits.

Figure 5:
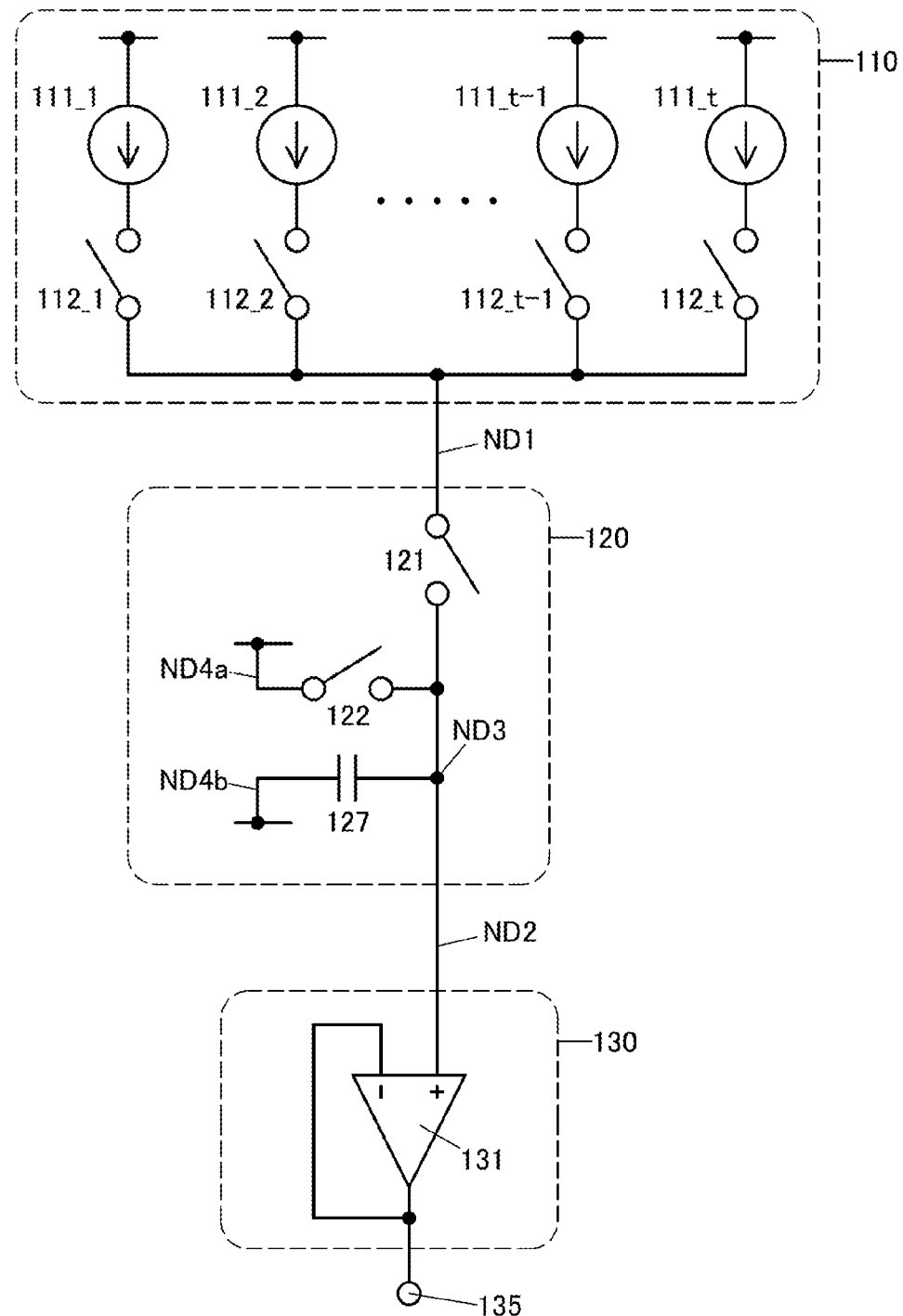
FIG. 5 is a circuit diagram illustrating a semiconductor device.

In particular, the use of OS transistors for the switches 121, 122 and 123 enables the retention of the potential of the node ND3 without the capacitor 127.
<Modification Examples of Semiconductor Device 100>
Next, modification examples of the semiconductor device 100 are described with reference to drawings.
[Modification Example 1]
A semiconductor device 100a shown in FIG. 5 is different from the semiconductor device 100 in the structure of the current-voltage converter 120. Specifically, the one terminal of the switch 122 is electrically connected to the node ND3 and the other terminal is electrically connected to a node ND4a. The one terminal of the capacitor 127 is electrically connected to the node ND3 and the other terminal is electrically connected to a node ND4b.

Figure 6:
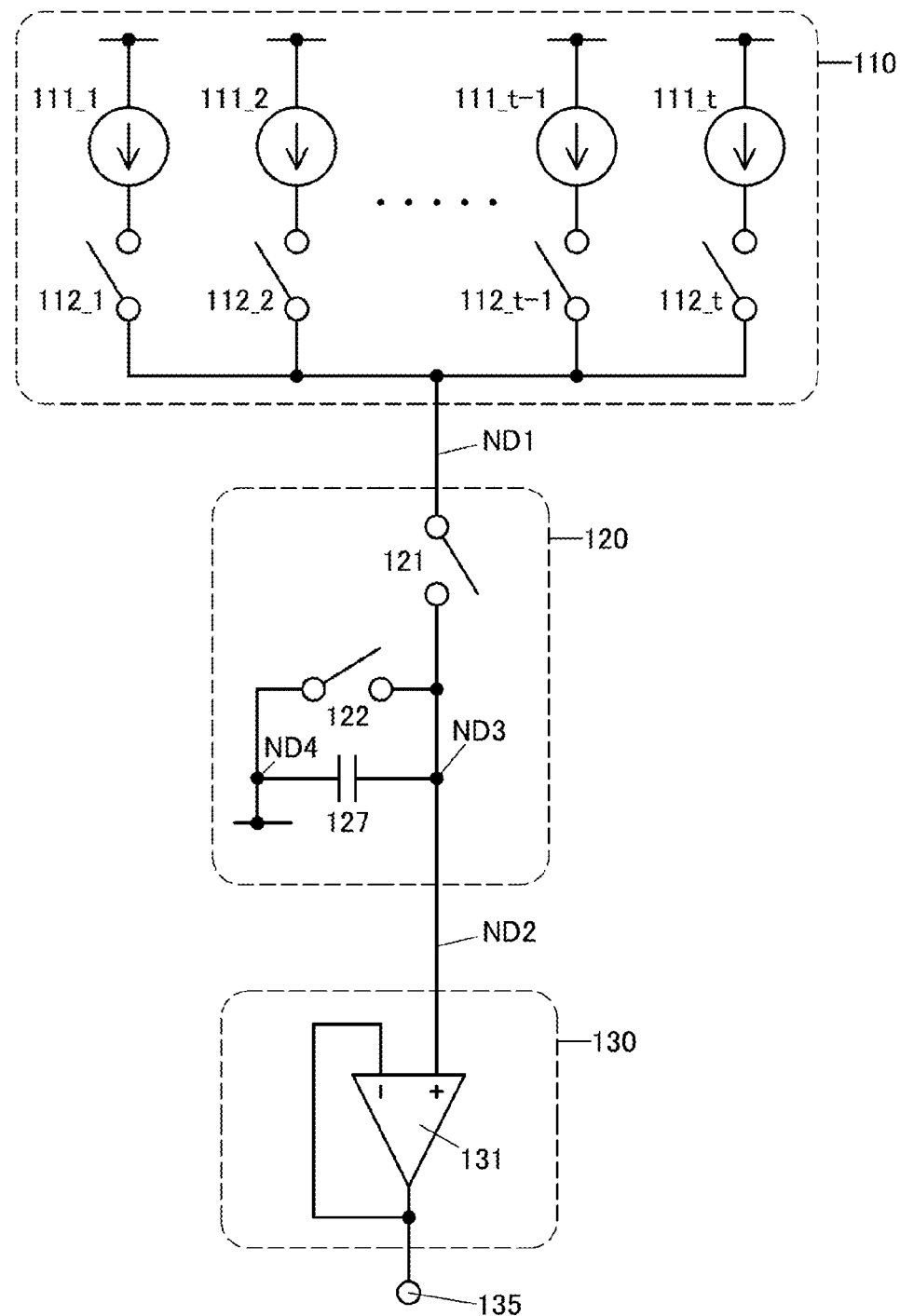
FIG. 6 is a circuit diagram illustrating a semiconductor device.

The nodes ND4a and ND4b do not necessarily have the same potential. Since the other terminal of the switch 122 and the other terminal of the capacitor 127 are connected to different nodes, a voltage that the capacitor 127 holds at the reset operation can be changed.
[Modification Example 2]
A semiconductor device 100b shown in FIG. 6 has the same structure as the semiconductor device 100 except that the nodes ND2 and ND3 are electrically connected to each other without the switch 123. Owing to the absence of the switch 123, the area occupied by the semiconductor device 100b can be smaller than that occupied by the semiconductor device 100.

Figure 7:
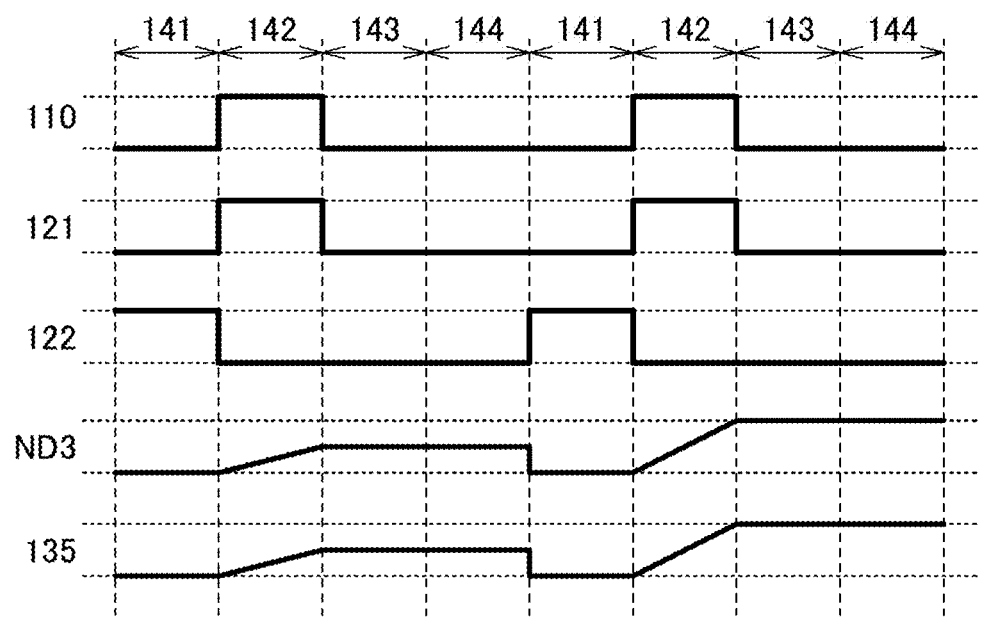
FIG. 7 is a timing chart illustrating operation of a semiconductor device.

FIG. 7 is a timing chart illustrating an operation example of the semiconductor device 100b. The timing chart of FIG. 7 shows the operation or non-operation of the DA converter 110. In addition, the timing chart of FIG. 7 shows the on/off state of the switches 121 and 122, and the potential changes of the node ND3 and the output terminal 135.

Figure 8:
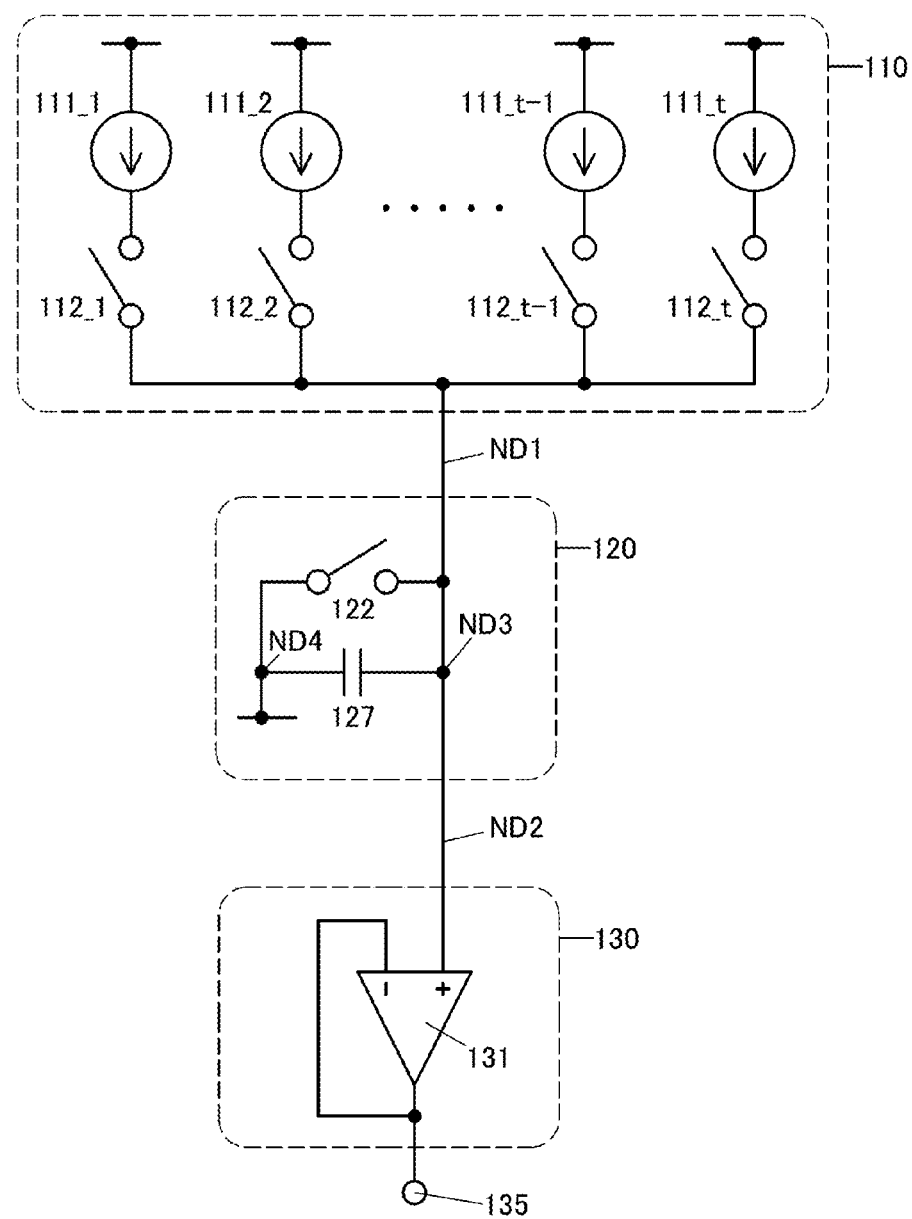
FIG. 8 is a circuit diagram illustrating a semiconductor device.
Figure 9A:
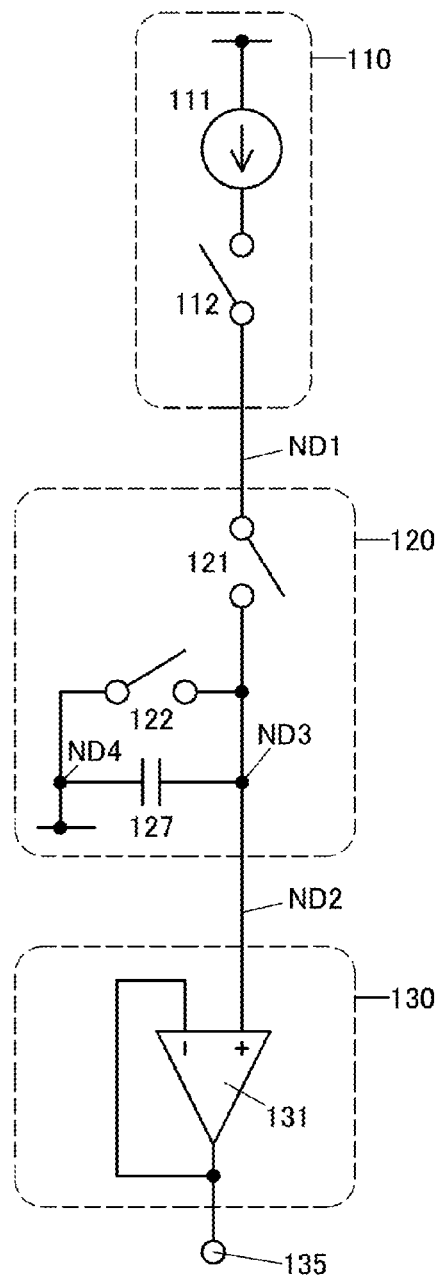
FIGS. 9A and 9B are circuit diagrams each illustrating a semiconductor device.

Since the switch 123 is not provided in the semiconductor device 100b, the potential change of the output terminal 135 is coincident with the potential change of the node ND3. Therefore, either the period 143 or 144 can be omitted. Note that the semiconductor device 100 can perform the same operation as the semiconductor device 100b by keeping the switch 123 on.
[Modification Example 3]
A semiconductor device 100c shown in FIG. 8 has the same structure as the semiconductor device 100b except that the nodes ND1, ND2 and ND3 are electrically connected to each other without the switch 121. Owing to the absence of the switch 121, the area occupied by the semiconductor device 100c can be smaller than that occupied by the semiconductor device 100b.
[Modification Example 4]
A semiconductor device 100d shown in FIG. 9A has the same structure as the semiconductor device 100b except that the DA converter 110 has one current source 111 and one switch 112. The DA converter 110 of the semiconductor device 100d can supply charge to the node ND3 by keeping the switch 112 on during a period corresponding to an input digital signal. For example, when an 8-bit digital signal is input to the DA converter, the switch 112 is kept on until a counter circuit counts up to 255 pulses of a clock signal.

The semiconductor device 100d tends to have a longer time to set the potential of the node ND3 (settling time) than the semiconductor devices 100, 100b, and 100c; however, the semiconductor device 100d can lower its occupation area, power consumption, or the like because it has the reduced total number of the current sources 111 and the switches 112.

[Modification Example 5]

Figure 9B:
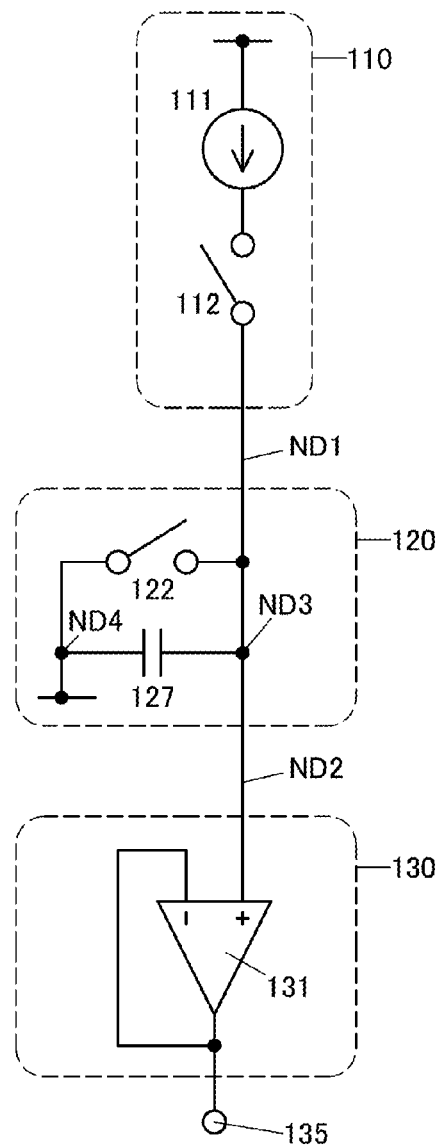

A semiconductor device 100e shown in FIG. 9B has the same structure as the semiconductor device 100d except that the nodes ND1, ND2 and ND3 are electrically connected to each other without the switch 121. Owing to the absence of the switch 121, the area occupied by the semiconductor device 100e can be smaller than that occupied by the semiconductor device 100d.

This embodiment can be implemented in an appropriate combination with any of the structures described in the other embodiments.

(Embodiment 2)

This embodiment describes a semiconductor device 200 that has a different structure from the semiconductor device 100, with reference to drawings. To avoid repeated description, points of the semiconductor device 200 that are different from the semiconductor device 100 are described in this embodiment in principle.

<Structure of Semiconductor Device 200>

Figure 10:
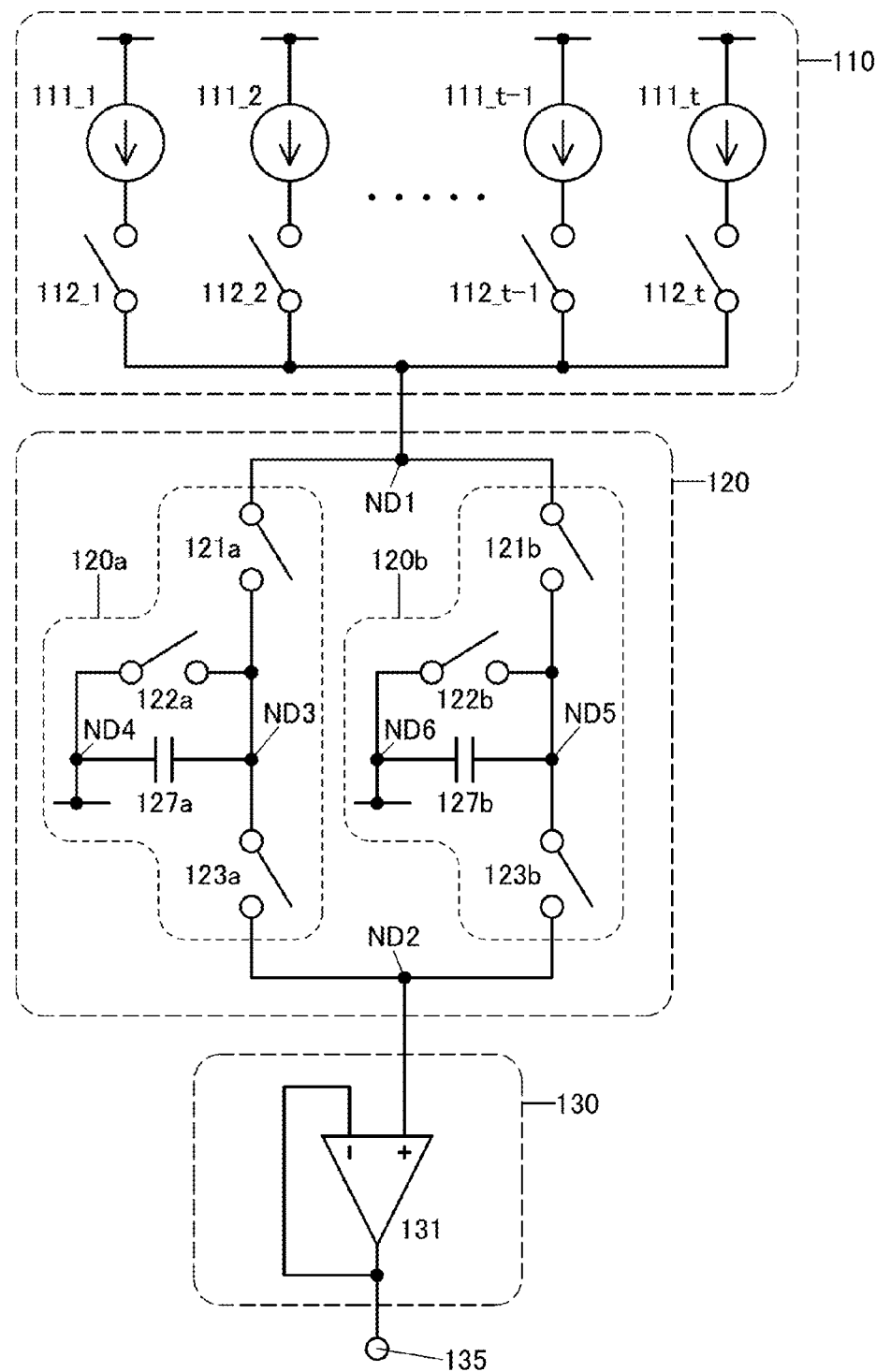
FIG. 10 is a circuit diagram illustrating a semiconductor device.

The semiconductor device 200 shown in FIG. 10 is different from the semiconductor device 100 in the structure of the current-voltage converter 120. The current-voltage converter 120 of the semiconductor device 200 has a plurality of current-voltage converters. Specifically, the current-voltage converter 120 of the semiconductor device 200 includes current-voltage converters 120a and 120b.

The current-voltage converter 120a includes switches 121a, 122a, and 123a, and a capacitor 127a. One terminal of the switch 121a is electrically connected to the node ND1, and the other terminal is electrically connected to the node ND3. One terminal of the switch 122a is electrically connected to the node ND3, and the other terminal is electrically connected to the node ND4. One terminal of the switch 123a is electrically connected to the node ND3, and the other terminal is electrically connected to the node ND2. One terminal of the capacitor 127a is electrically connected to the node ND3, and the other terminal is electrically connected to the node ND4.

The current-voltage converter 120b includes switches 121b, 122b, and 123b, and a capacitor 127b. One terminal of the switch 121b is electrically connected to the node ND1, and the other terminal is electrically connected to a node ND5. One terminal of the switch 122b is electrically connected to the node ND5, and the other terminal is electrically connected to a node ND6. One terminal of the switch 123b is electrically connected to the node ND5, and the other terminal is electrically connected to the node ND2. One terminal of the capacitor 127b is electrically connected to the node ND5, and the other terminal is electrically connected to the node ND6. The node ND6 is supplied with the same potential as that of the node ND4.

Each of the switches 121a and 121b can operate similarly to the above-mentioned switch 121. Each of the switches 122a and 122b can operate similarly to the above-mentioned switch 122. Each of the switches 123a and 123b can operate similarly to the above-mentioned switch 123. Each of the capacitors 127a and 127b can operate similarly to the above-mentioned capacitor 127.

The node ND5 can operate similarly to the node ND3. The node ND6 can operate similarly to the node ND4.

<Operation of Semiconductor Device 200>

The above-mentioned semiconductor devices 100 and 100b require the reset operation, the writing operation, and the like in order to make the node ND3 have a potential corresponding to a digital signal input to the DA converter 110 and to output the potential from the output terminal 135. Therefore, to obtain a potential corresponding to a new digital signal from the output terminal 135, a certain period (settling time) is needed to stabilize the potential of the node ND3. The semiconductor device 200 with the plurality of current-voltage converters can decrease the settling time.

Figure 11:
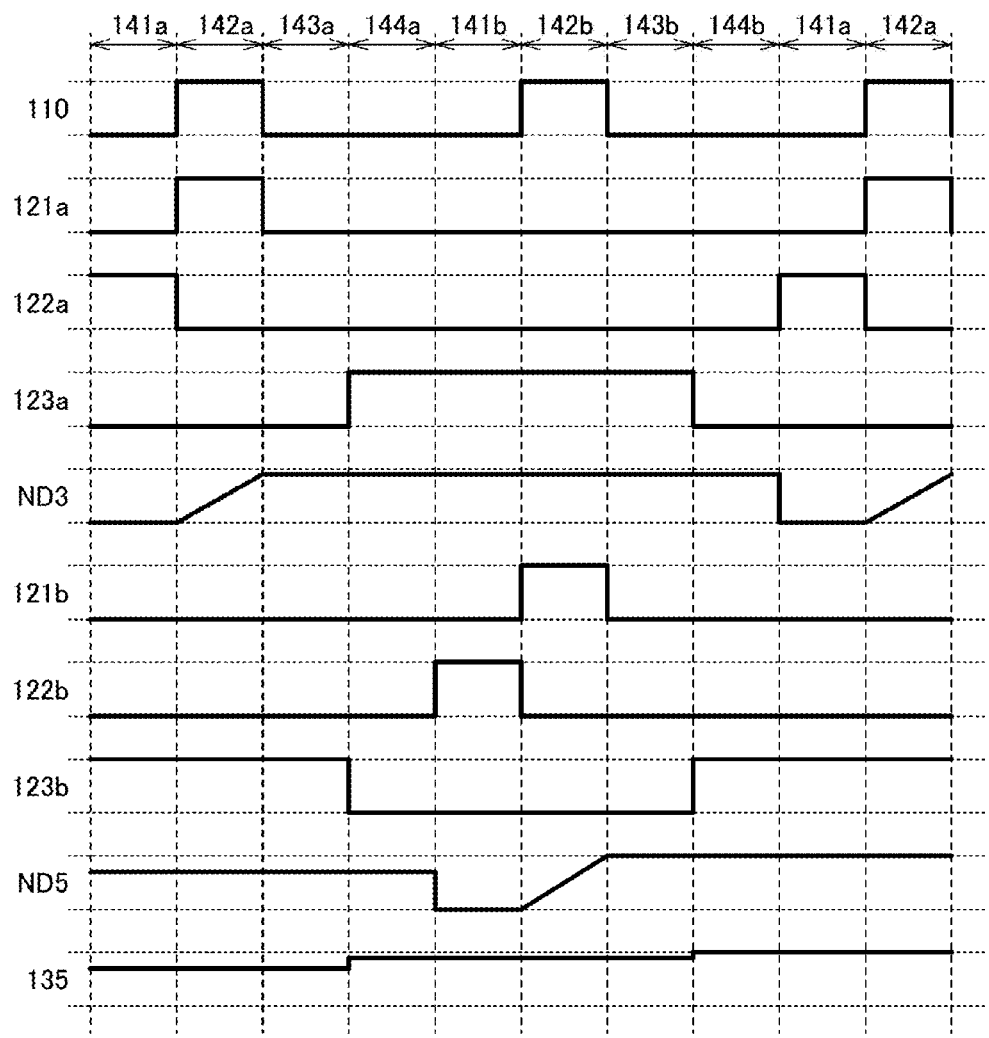
FIG. 11 is a timing chart illustrating operation of a semiconductor device.
Figure 12A:
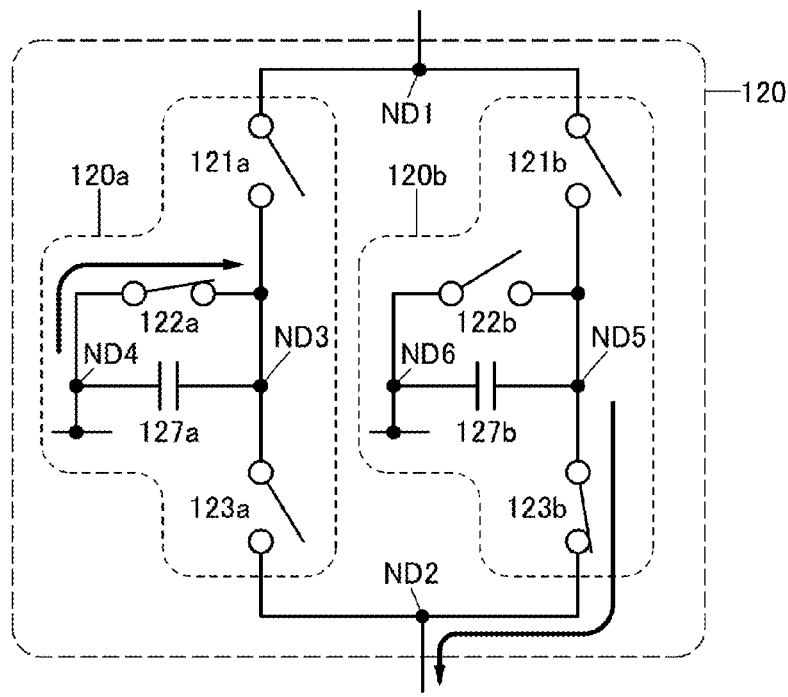
FIGS. 12A and 12B show operation of a semiconductor device.
Figure 12B:
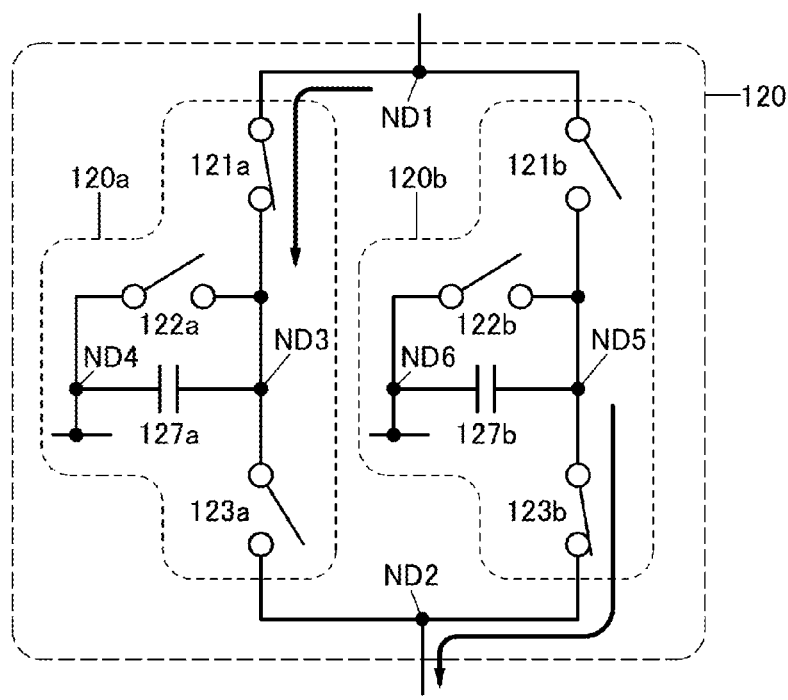

Operation of the semiconductor device 200 is described with reference to a timing chart in FIG. 11 and circuit diagrams in FIGS. 12A and 12B, FIGS. 13A and 13B, FIGS. 14A and 14B, and FIGS. 15A and 15B. The timing chart of FIG. 11 shows the operation or non-operation of the DA converter 110. In addition, the timing chart shows the on/off states of the switches 121a, 122a, 123a, 121b, 122b, and 123b, and the potential changes of the nodes ND3 and ND5 and the output terminal 135.

In a period 141a, the switches 121a and 123a are off and the switch 122a is on. As a result, the potential of the node ND4 is supplied to the nodes ND3 (reset operation; see FIG. 12A). At this time, when the switch 123b is on, the same potential as that of the node ND5 is output from the output terminal 135.

In a period 142a, the switch 122a is turned off, the switch 121a is turned on, and a current is supplied from the DA converter 110 to the node ND1. As a result, the potential of the node ND3 heightens at a speed corresponding to the value of the current supplied to the node ND1 (writing operation; see FIG. 12B).

Figure 13A:
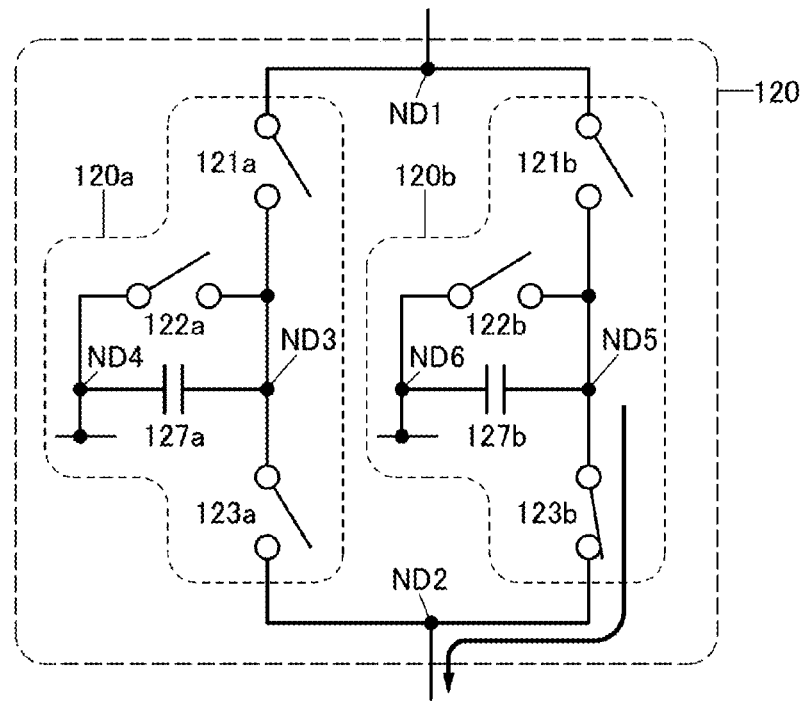
FIGS. 13A and 13B show operation of a semiconductor device.
Figure 13B:
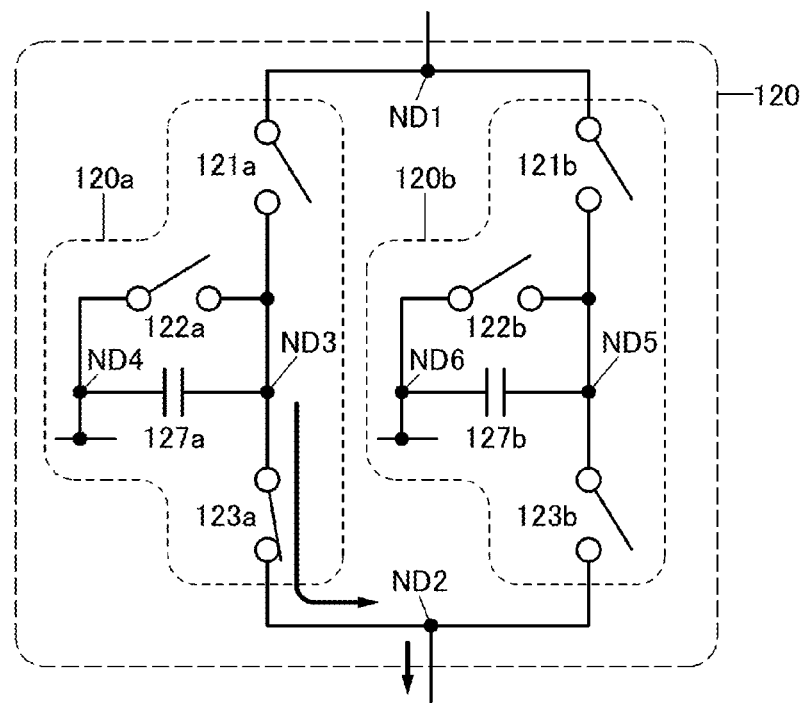

In a period 143a, the switch 121a is turned off, whereby the node ND3 is brought into a floating state; thus, the potential difference between the nodes ND3 and ND4 is held by the capacitor 127a (holding operation; see FIG. 13A). Here, the output from the DA converter 110 stops.

In a period 144a, the switch 123b is turned off and the switch 123a is turned on. As a result, the node ND2 has the same potential as the node ND3, and the same potential as that of the node ND3 is output from the output terminal 135 (output operation; see FIG. 13B).

Figure 14A:
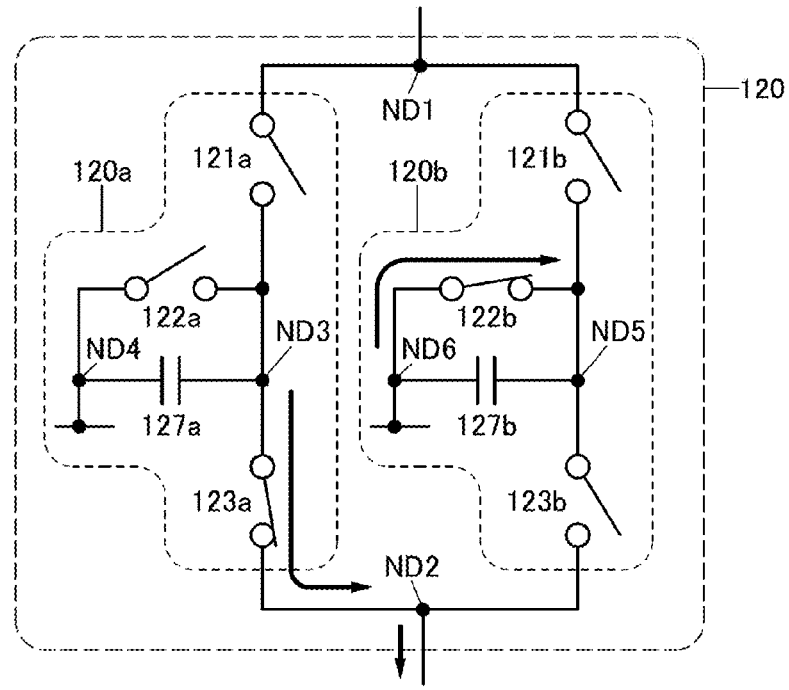
FIGS. 14A and 14B show operation of a semiconductor device.
Figure 14B:
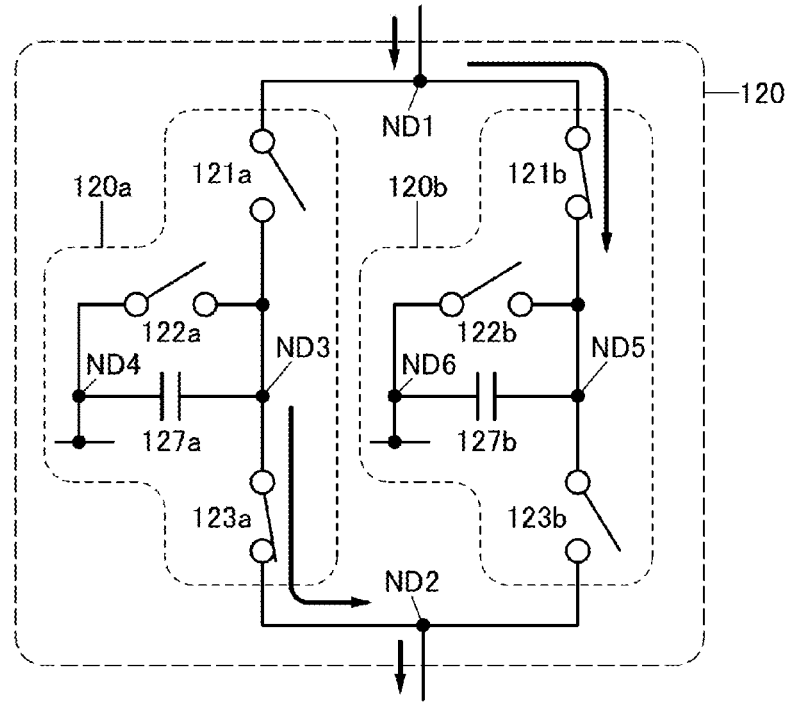

In a period 141b, the switch 122b is turned on, whereby the node ND 5 is supplied with the potential of the node ND6 (reset operation; see FIG. 14A).

In a period 142b, the switch 122b is turned off, the switch 121b is turned on, and a current is supplied from the DA converter 110 to the node ND1. As a result, the potential of the node ND5 heightens at a speed corresponding to the value of the current supplied to the node ND1 (writing operation; see FIG. 14B).

Figure 15A:
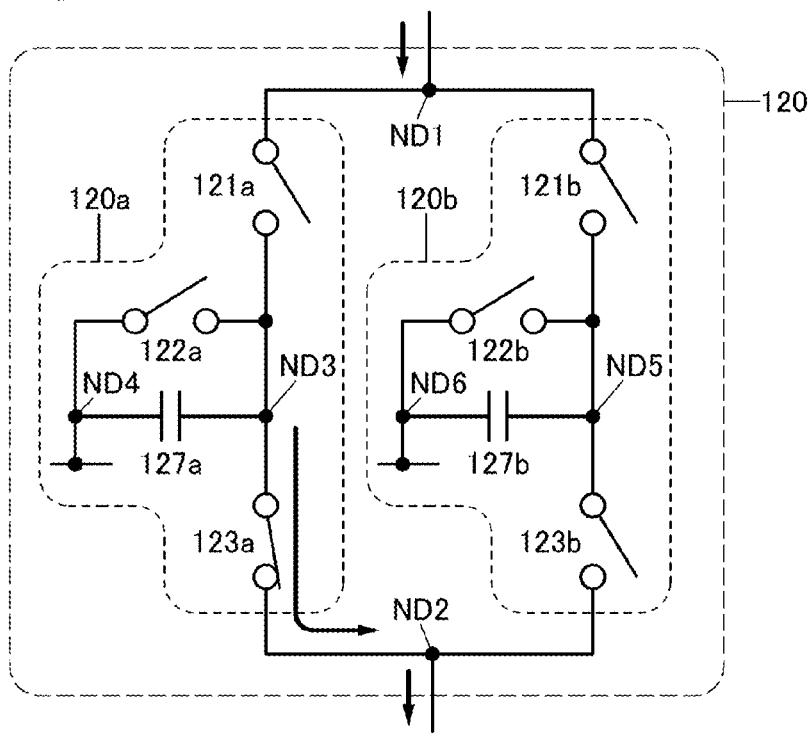
FIGS. 15A and 15B show operation of a semiconductor device.
Figure 15B:
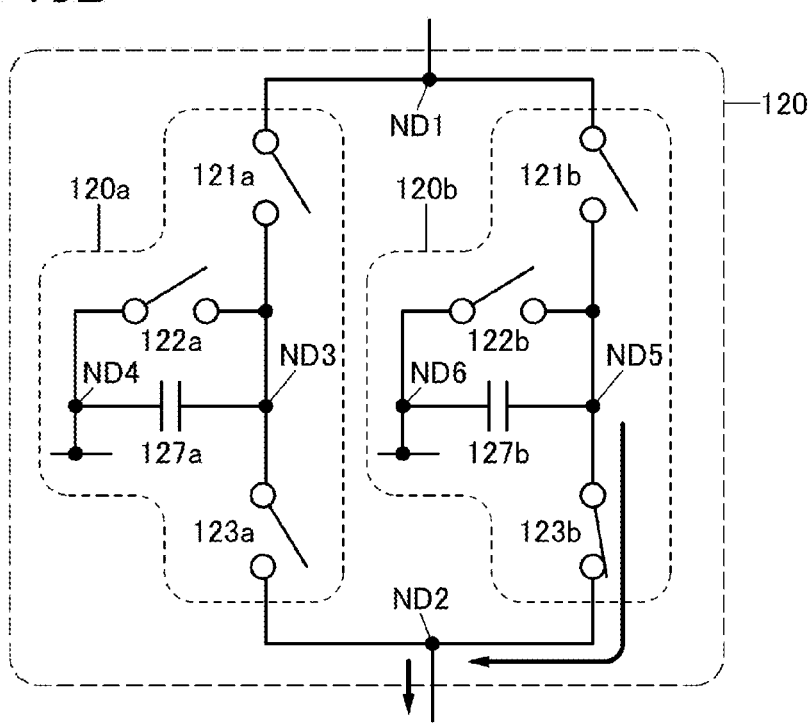

In a period 143b, the switch 121b is turned off, whereby the node ND5 is brought into a floating state; thus, the potential difference between the nodes ND5 and ND6 is held by the capacitor 127b (holding operation; see FIG. 15A). Here, the output from the DA converter 110 stops.

In a period 144b, the switch 123a is turned off and the switch 123b is turned on. As a result, the node ND2 has the same potential as the node ND5, and the same potential as that of the node ND5 is output from the output terminal 135 (output operation; see FIG. 15B).

In this manner, in the semiconductor device 200, while a potential obtained in one of the current-voltage converters

120a and 120b is output from the output terminal 135, a potential to be output next can be obtained in the other of the current-voltage converters 120a and 120b. In other words, the settling time can be significantly reduced or practically eliminated. Thus, the potential output from the output terminal 135 can be changed quickly. According to one embodiment of the present invention, a semiconductor device capable of high-speed operation can be achieved.

[Modification Example 1]

Figure 16:
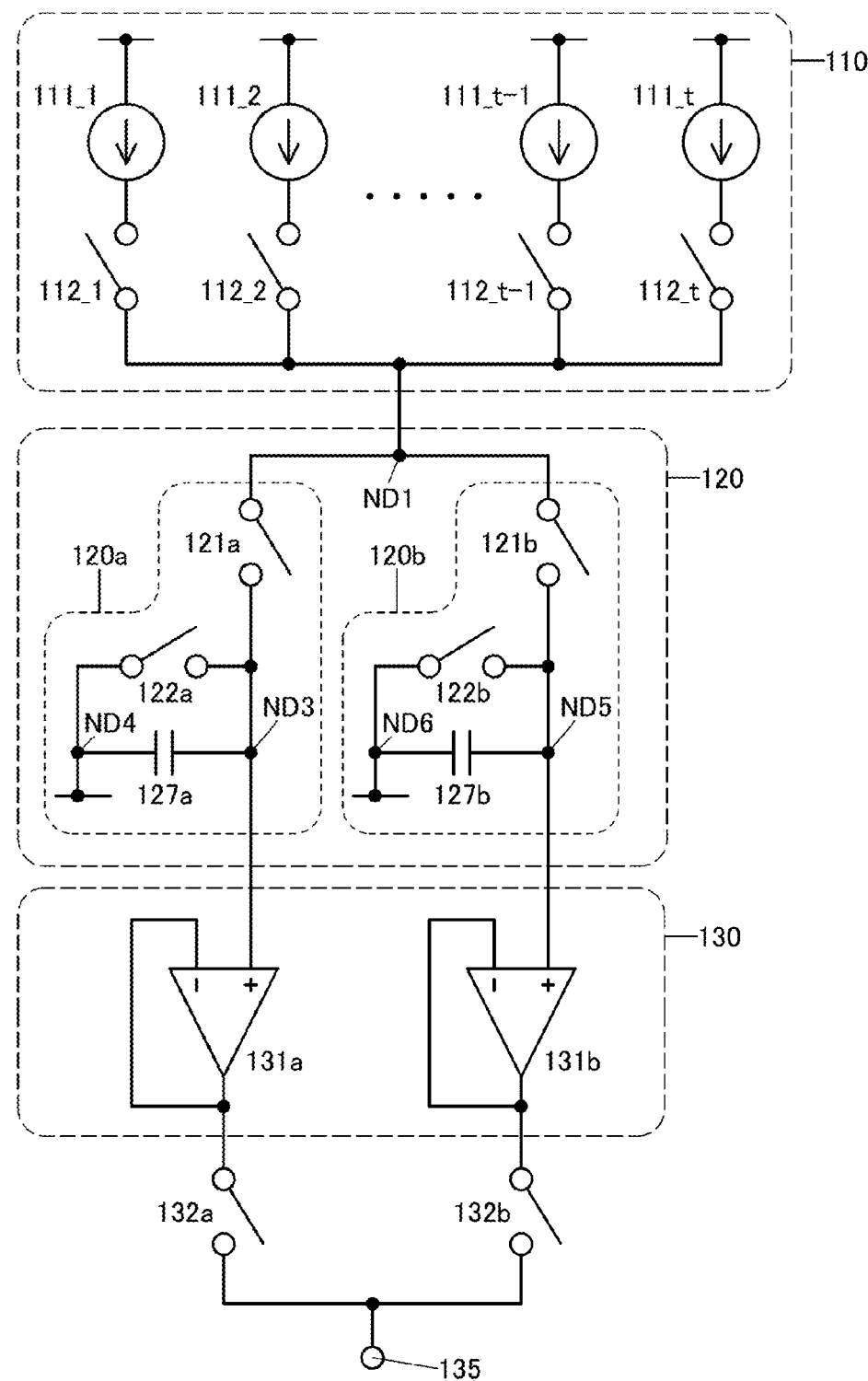
FIG. 16 is a circuit diagram illustrating a semiconductor device.

FIG. 16 illustrates a semiconductor device 200a as a modification example of the semiconductor device 200. The amplifier 130 of the semiconductor device 200a includes an operation amplifier 131a connected to the current-voltage converter 120a and an operation amplifier 131b connected to the current-voltage converter 120b.

A non-inverting input terminal of the operation amplifier 131a is electrically connected to the node ND3, and an inverting input terminal is electrically connected to an output terminal of the operation amplifier. The output terminal of the operation amplifier 131a is electrically connected to the output terminal 135 through a switch 132a. A non-inverting input terminal of the operation amplifier 131b is electrically connected to the node ND5, and an inverting input terminal is electrically connected to the output terminal of the operation amplifier. The output terminal of the operation amplifier 131b is electrically connected to the output terminal 135 through a switch 132b.

[Modification Example 2]

Figure 17:
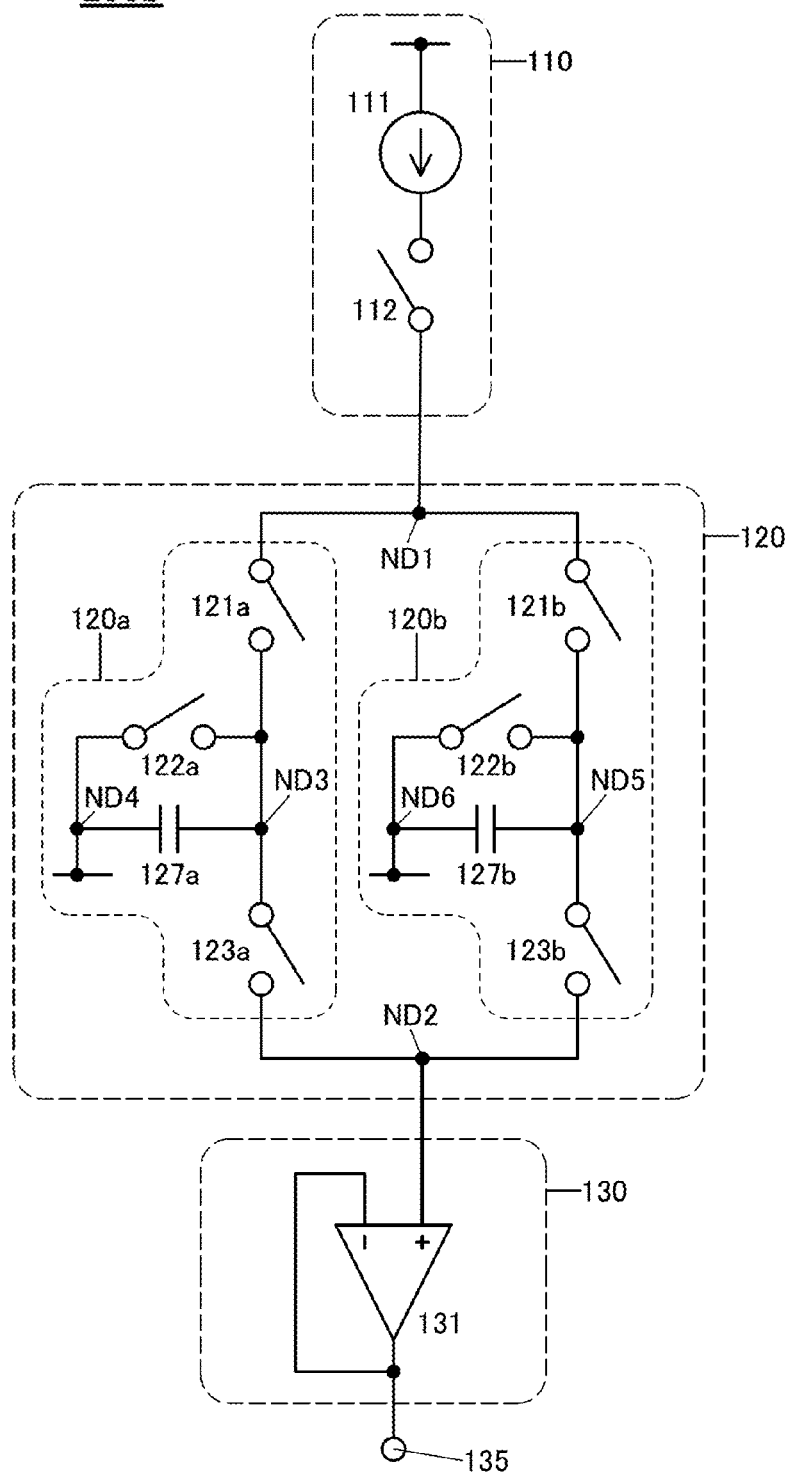
FIG. 17 is a circuit diagram illustrating a semiconductor device.

A semiconductor device 200b shown in FIG. 17 has the same structure as the semiconductor device 200 except that the DA converter 110 has one current source 111 and one switch 112. As in the semiconductor device 100d, the DA converter 110 of the semiconductor device 200b can supply charge to the node ND3 or ND5 by keeping the switch 112 on during a period corresponding to an input digital signal.

The semiconductor device 200b tends to have a longer time to set the potential of the node ND3 or ND5 (settling time) than the semiconductor devices 200 and 200a; however, the semiconductor device 200b can lower its occupation area, power consumption, or the like because it has the reduced total number of the current sources 111 and the switches 112.

[Modification Example 3]

Figure 18:
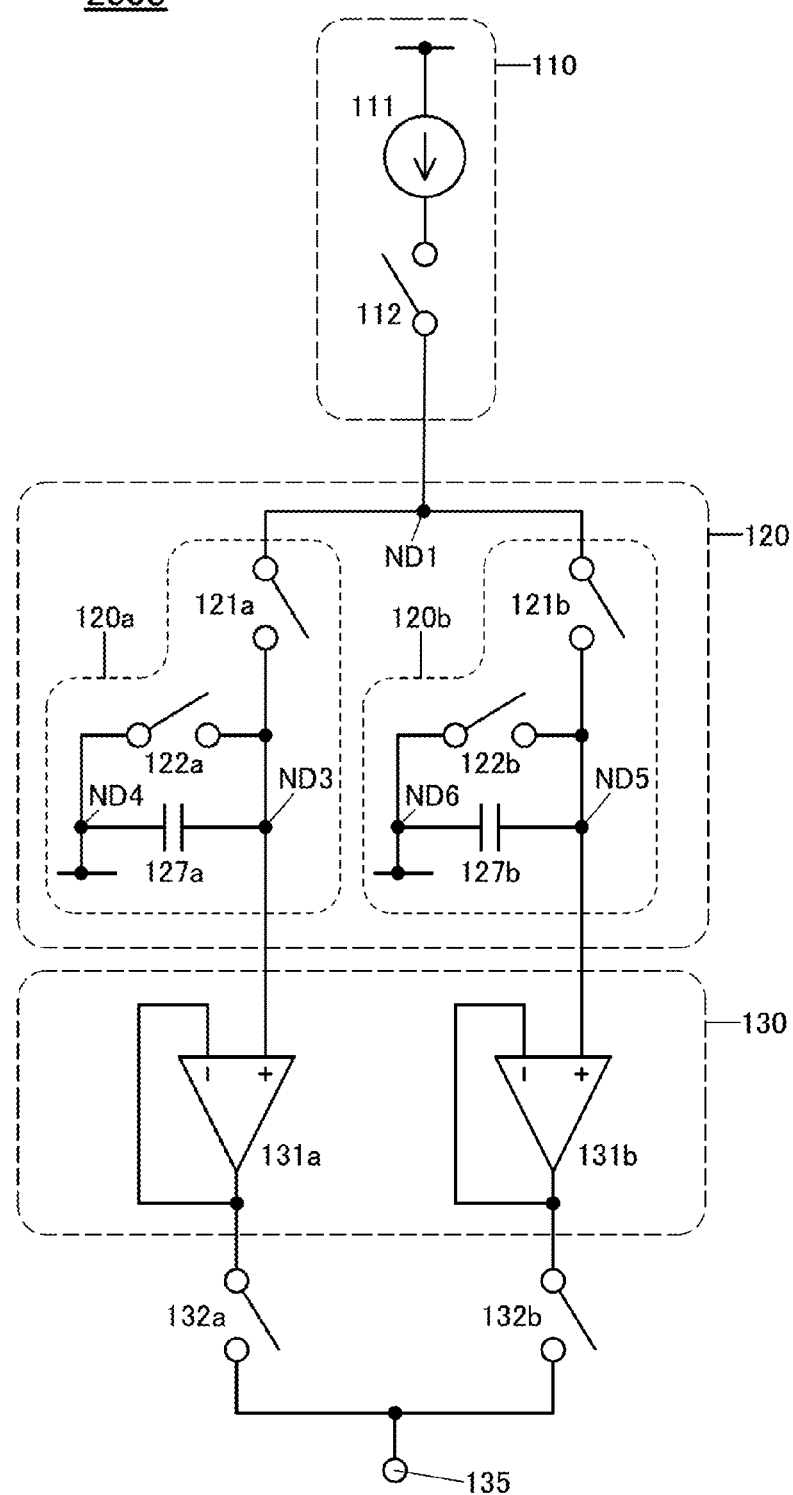
FIG. 18 is a circuit diagram illustrating a semiconductor device.

A semiconductor device 200c shown in FIG. 18 has the same structure as the semiconductor device 200a except that the DA converter 110 has one current source 111 and one switch 112. As in the semiconductor device 200b, the DA converter 110 of the semiconductor device 200c can supply charge to the node ND3 or ND5 by keeping the switch 112 on during a period corresponding to an input digital signal.

This embodiment can be implemented in an appropriate combination with any of the structures described in the other embodiments.

(Embodiment 3)

Figure 19A:
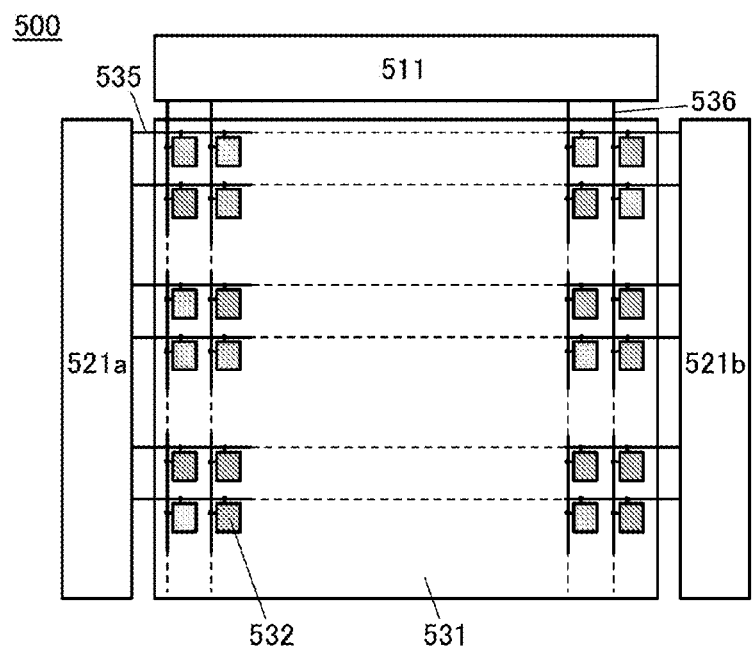
FIGS. 19A to 19C each illustrate a display device.

This embodiment describes examples where the semiconductor devices disclosed in the above embodiments are used in display devices, with reference to drawings. FIG. 19A is a block diagram illustrating a structure example of a display device 500.

The display device 500 in FIG. 19A includes driver circuits 511, 521a, and 521b, and a display region 531. Note that the driver circuits 511, 521a, and 521b are collectively referred to as a driver circuit or a peripheral driver circuit in some cases.

The driver circuits 521a and 521b can function as, for example, scan line driver circuits. The driver circuit 511 can function as, for example, a signal line driver circuit. Note that one of the driver circuits 521a and 521b may be omitted. Alternatively, some sort of circuit facing the driver circuit 511 with the display region 531 provided therebetween may be provided.

The display device 500 illustrated as an example in FIG. 19A includes m wirings 535 which are arranged substantially parallel to each other and whose potentials are controlled by the driver circuit 521a and/or the driver circuit 521b, and n wirings 536 which are arranged substantially parallel to each other and whose potentials are controlled by the driver circuit 511. The display region 531 includes a plurality of pixels 532 arranged in a matrix. The pixel 532 includes a pixel circuit 534 and a display element.

When every three pixels 532 function as one pixel, full-color display can be provided. The three pixels 532 each control the transmittance, reflectance, amount of emitted light, or the like of red light, green light, or blue light. The light colors controlled by the three pixels 532 are not limited to the combination of red, green, and blue, and may be yellow, cyan, and magenta.

A pixel 532 that controls white light may be added to the pixels controlling red light, green light, and blue light so that the four pixels 532 will collectively serve as one pixel. The addition of the pixel 532 controlling white light can heighten the luminance of the display region. When the number of the pixels 532 functioning as one pixel is increased to use red, green, blue, yellow, cyan, and magenta in appropriate combination, the range of color reproduction can be widened.

Using the pixels arranged in a matrix of 1920×1080, the display device 500 can display an image with "full high definition" (also referred to as "2K resolution", "2K1K", "2K", and the like). Using the pixels arranged in a matrix of 3840×2160, the display device 500 can display an image with "ultra high definition" (also referred to as "4K resolution", "4K2K", "4K", and the like). Using the pixels arranged in a matrix of 7680×4320, the display device 500 can display an image with "super high definition" (also referred to as "8K resolution", "8K4K", "8K", and the like). Using a larger number of pixels, the display device 500 can display an image with 16K or 32K resolution.

A wiring 535_$i$ on the i-th row (i is a natural number larger than or equal to 1 and smaller than or equal to m) is electrically connected to n pixels 532 on the i-th row among the plurality of pixels 532 arranged in m rows and n columns (m and n are each a natural number of 1 or more) in the display region 531. A wiring 536_$j$ on the j-th column (j is a natural number larger than or equal to 1 and smaller than or equal to n) is electrically connected to m pixels 532 on the j-th column among the plurality of pixels 532 arranged in m rows and n columns.

[Display Element]

The display device 500 can employ various modes and include various display elements. Examples of the display element include a display medium whose contrast, luminance, reflectance, transmittance, or the like is changed by electrical or magnetic effect, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulation (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Note that examples of display devices having EL elements include an EL display. Examples of display devices including electron emitters include a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink, electronic liquid powder (registered trademark), or electrophoretic elements include electronic paper. For example, the display device may be a plasma display panel (PDP).

In the case of a transflective liquid crystal display or a reflective liquid crystal display, some of or all of pixel electrodes function as reflective electrodes. For example, some or all of pixel electrodes contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. Provision of graphene or graphite in this way enables easy formation of a nitride semiconductor film (such as an n-type GaN semiconductor layer including crystals) thereover. Furthermore, a p-type GaN semiconductor layer including crystals or the like can be provided thereover to form the LED. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can be formed by a sputtering method.

FIGS. 19B and 19C and FIGS. 20A and 20B illustrate circuit structure examples that can be used for the pixel 532.

[Examples of Pixel Circuit for Light-Emitting Display Device]

Figure 19B:
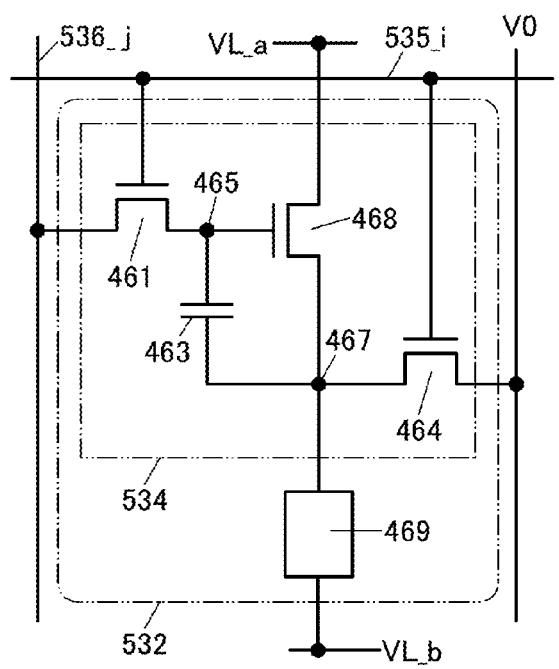

The pixel circuit 534 in FIG. 19B includes transistors 461, 468, and 464, and a capacitor 463. The pixel circuit 534 in FIG. 19B is electrically connected to a light-emitting element 469 that can function as a display element.

One of a source electrode and a drain electrode of the transistor 461 is electrically connected to the wiring 536_j. A gate electrode of the transistor 461 is electrically connected to the wiring 535_i. The wiring 536_j supplies a video signal.

The transistor 461 has a function of controlling writing of a video signal to a node 465.

One of a pair of electrodes of the capacitor 463 is electrically connected to the node 465, and the other is electrically connected to a node 467. The other of the source electrode and the drain electrode of the transistor 461 is electrically connected to the node 465.

The capacitor 463 has a function as a storage capacitor for storing data written to the node 465.

One of a source electrode and a drain electrode of the transistor 468 is electrically connected to a potential supply line VL_a, and the other of the source electrode and the drain electrode of the transistor 468 is electrically connected to the node 467. A gate electrode of the transistor 468 is electrically connected to the node 465.

One of a source electrode and a drain electrode of the transistor 464 is electrically connected to a potential supply line V0, and the other of the source electrode and the drain electrode of the transistor 464 is electrically connected to the node 467. A gate electrode of the transistor 464 is electrically connected to the wiring 535_i.

One of an anode and a cathode of the light-emitting element 469 is electrically connected to a potential supply line VL_b, and the other is electrically connected to the node 467.

As the light-emitting element 469, an organic electroluminescence element (also referred to as an organic EL element) or the like can be used, for example. Note that the light-emitting element 469 is not limited thereto and may be an inorganic EL element containing an inorganic material, for example.

A high power supply potential VDD is supplied to one of the potential supply line VL_a and the potential supply line VL_b, and a low power supply potential VSS is supplied to the other, for example.

In the display device 500 including the pixel circuits 534 in FIG. 19B, the pixel circuits 534 are sequentially selected row by row by the driver circuit 521a and/or the driver circuit 521b, so that the transistors 461 and 464 are turned on and a video signal is written to the nodes 465.

The pixel 532 in which the data has been written to the node 465 is brought into a holding state when the transistors 461 and 464 are turned off. The amount of current flowing between the source electrode and the drain electrode of the transistor 468 is controlled in accordance with the potential of the data written to the node 465. The light-emitting element 469 emits light with luminance corresponding to the amount of flowing current. This operation is sequentially performed row by row; as a result, an image is displayed.

Figure 20A:
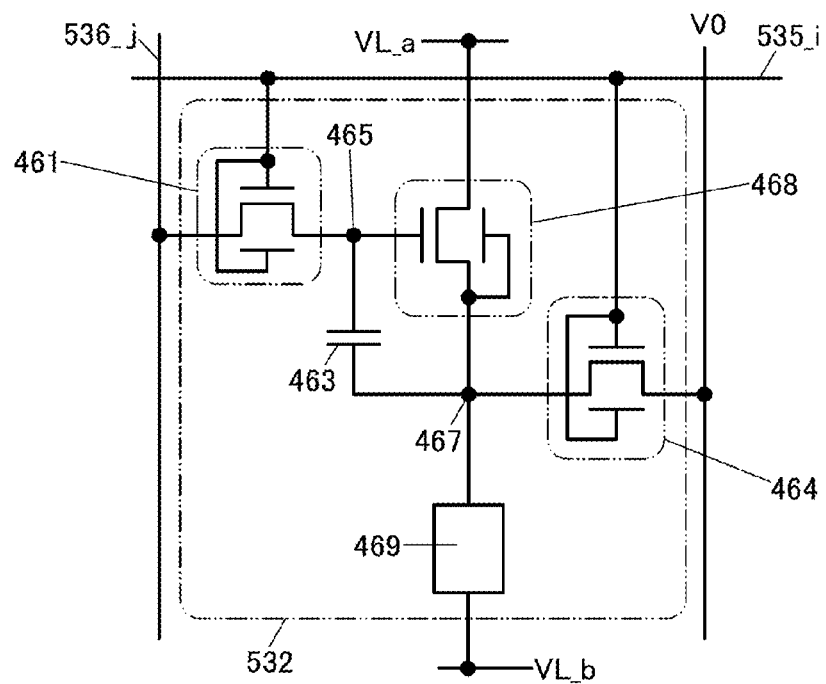
FIGS. 20A and 20B each illustrate a display device.

As shown in FIG. 20A, the transistors 461, 464, and 468 may be transistors with back gates. In each of the transistors 461 and 464 in FIG. 20A, the gate is electrically connected to the back gate. Thus, the gate and back gate always have the same potential. The back gate of the transistor 468 is electrically connected to the node 467. Therefore, the back gate always has the same potential as the node 467.

[Examples of Pixel Circuit for Liquid Crystal Display Device]

Figure 19C:
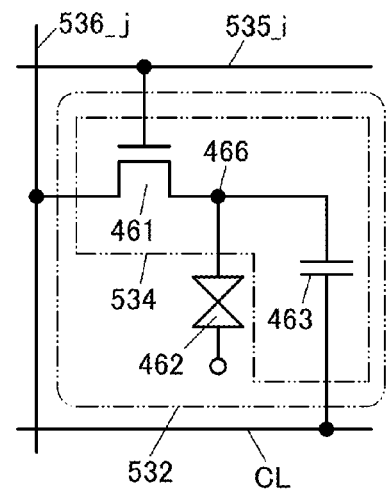

The pixel circuit 534 in FIG. 19C includes the transistor 461 and the capacitor 463. The pixel circuit 534 in FIG. 19C is electrically connected to a liquid crystal element 462 that can function as a display element.

The potential of one of a pair of electrodes of the liquid crystal element 462 is set as appropriate according to the specifications of the pixel circuit 534. For example, one of the pair of electrodes of the liquid crystal element 462 may be supplied with a common potential, or may have the same potential as a wiring to which a particular potential is supplied (hereinafter such a wiring is also referred to as a capacitor line CL). Further, the potential applied to one of the pair of electrodes of the liquid crystal element 462 may be different among the pixels 532. The other of the pair of electrodes of the liquid crystal element 462 is electrically connected to a node 466. The alignment state of the liquid crystal element 462 depends on data written to the node 466.

As examples of a driving method of the display device including the liquid crystal element 462, the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA mode, a PVA (patterned vertical alignment) mode, an IPS mode, an FFS mode, a TBA (transverse bend alignment) mode, and the like. Other examples of the driving method of the display device include an ECB (electrically controlled birefringence) mode, a PDLC (polymer dispersed liquid crystal) mode, a PNLC (polymer network liquid crystal) mode, and a guest-host mode. Note that one embodiment of the present invention is not limited thereto, and various liquid crystal elements and driving methods can be used.

In the case where a liquid crystal element is used as the display element, thermotropic liquid crystal, low-molecular liquid crystal, high-molecular liquid crystal, polymer-dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt % or more of a chiral material is mixed is used for the liquid crystal layer in order to improve the temperature range. The liquid crystal composition that includes the liquid crystal exhibiting a blue phase and a chiral material has a short response time of 1 msec or less, and has optical isotropy, which makes the alignment process unnecessary and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced. Thus, productivity of the liquid crystal display device can be improved.

Furthermore, it is possible to use a method called domain multiplication or multi-domain design, in which a pixel is divided into some regions (subpixels) and molecules are aligned in different directions in their respective regions.

The specific resistivity of the liquid crystal material is greater than or equal to $1\times10^9$ Ω·cm, preferably greater than or equal to $1\times10^{11}$ Ω·cm, still preferably greater than or equal to $1\times10^{12}$ Ω·cm. Note that the specific resistivity in this specification is measured at 20° C.

In the pixel circuit 534 on the i-th row and the j-th column, one of the source electrode and the drain electrode of the transistor 461 is electrically connected to the wiring 536_j, and the other of the source electrode and the drain electrode of the transistor 461 is electrically connected to the node 466. The gate electrode of the transistor 461 is electrically connected to the wiring 535_i. The wiring 536j supplies a video signal. The transistor 461 has a function of controlling writing of a video signal to the node 466.

One of the pair of electrodes of the capacitor 463 is electrically connected to the capacitor line CL, and the other is electrically connected to the node 466. The potential of the capacitor line CL is set appropriately in accordance with the specifications of the pixel circuit 534. The capacitor 463 has a function as a storage capacitor for storing data written to the node 466.

For example, in the display device 500 including the pixel circuit 534 in FIG. 19C, the pixel circuits 534 are sequentially selected row by row by the driver circuit 521a and/or the driver circuit 521b, so that the transistors 461 are turned on and a video signal is written to the node 466.

The pixel circuit 534 in which the video signal has been written to the nodes 466 is brought into a holding state when the transistor 461 is turned off. This operation is sequentially performed row by row; as a result, an image can be displayed on the display region 531.

Figure 20B:
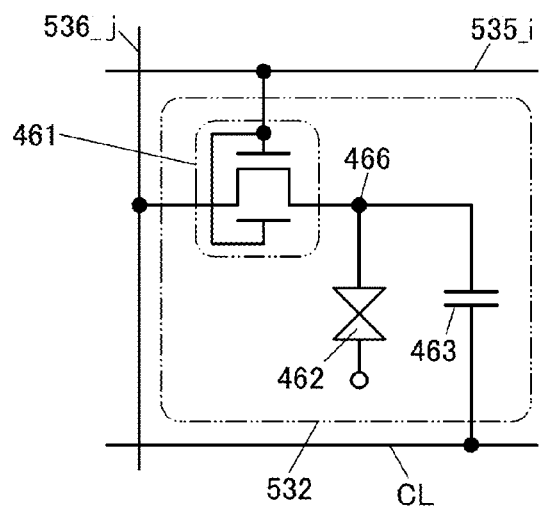

As shown in FIG. 20B, the transistor 461 may be a transistor with a back gate. In the transistor 461 in FIG. 20B, the gate is electrically connected to the back gate. Thus, the gate and back gate always have the same potential.

[Structure Example of Peripheral Circuit]

Figure 21:
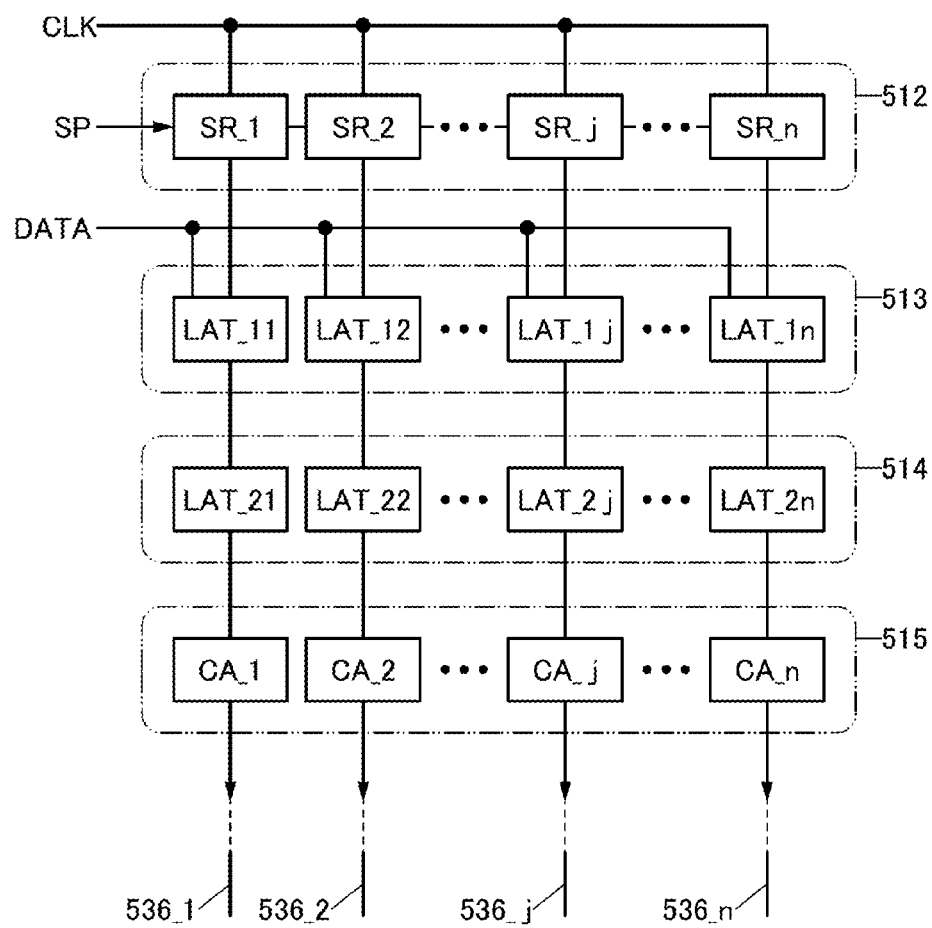
FIG. 21 illustrates a semiconductor device.

A structure example of the driver circuit 511 is described with reference to FIG. 21. The driver circuit 511 includes a shift register 512, a first latch circuit 513, a second latch circuit 514, and a DA conversion output circuit 515.

The shift register 512 has n registers SR (registers SR_1 to SR_n). A start pulse SP, a clock signal CLK, and the like are input to the shift register 512.

The first latch circuit 513 has n latches LAT_1 (LAT_11 to LAT_1n). A digital signal including video data or the like is input to the first latch circuit 513.

Each of the latches LAT_1 has a function of holding an input digital signal. Output from a j-th register SR_j is input to a j-th latch LAT_1j. The register SR_j also outputs a signal for controlling operation of the latch LAT_1j.

The second latch circuit 514 has n latches LAT_2 (LAT_21 to LAT_2n). Each of the latches LAT_2 has a function of holding an input digital signal. Output from the j-th latch LAT_1j is input to a j-th latch LAT_2j.

The DA conversion output circuit 515 has n conversion output circuits CA (conversion output circuits CA_1 to CA_n). The conversion output circuit CA has a function of converting an input digital signal to an analog voltage signal. As the conversion output circuit CA, any of the semiconductor devices disclosed in the above embodiments can be used. Output from the j-th latch LAT_2j is input to a j-th conversion output circuit CA_j. Output from the j-th conversion output circuit CA_j is supplied to the wiring 536_j.

[Operation Examples of Peripheral Circuit]

This embodiment describes operation of the driver circuit 511 by which a video signal is supplied to the wiring 536j connected to the pixel circuit 534 on the i-th row. This embodiment describes the case where the semiconductor device 200 is used as the conversion output circuit CA_j.

When the wiring 535_i on the i-th row is selected, a start pulse SP is input to the shift register 512. With the start pulse SP as a trigger, outputs from the registers SR_1 to SR_n of the shift register 512 are sent in order in synchronization with the clock signal CLK. Thus, the latches LAT_1 are sequentially selected to operate in synchronization with the clock signal CLK. Specifically, when the start pulse SP is input to the shift register 512, first, a column selection signal that notifies the selection of the first column is input from the first register SR_1 to the latch LAT_11, the latch LAT_21, and the conversion output circuit CA_1. That is, a column selection signal that notifies the selection of the j-th column is input to the latch LAT_1j, the latch LAT_2j, and the conversion output circuit CA_j.

FIGS. 22A to 22C and FIGS. 23A to 23C are block diagrams illustrating operation of the register SR_j, latch LAT_1j, latch LAT_2j, and conversion output circuit CA_j on the j-th column. When a column selection signal is input to the j-th column, the switch 123 of the current-voltage converter 120a or 120b of the conversion output circuit CA_j (semiconductor device 200), whichever is subjected to the (i−1)-th row writing operation, is turned on (for example, the switch 123a of the current-voltage converter 120a is turned on), so that a video signal is supplied to the wiring 536j (see FIG. 22A).

The latch LAT_1j transfers a digital signal DS_i−1 written in the (i−1)-th row operation to the latch LAT_2j (see FIG. 22A). After that, a digital signal DS_i is written to the latch LAT_1j from a data line DATA, and the latch LAT_1j holds the signal (see FIG. 22B).

The other of the current-voltage converters 120a and 120b (e.g., the current-voltage converter 120b) conducts reset operation, and subsequently writes a potential corresponding to the digital signal held in the latch LAT_2j and holds the potential (see FIG. 22C).

When the above operation is performed on up to the n-th column, a wiring 535_i+1 on the (i+1)-th column is selected and a start pulse SP is input to the shift register 512. A column selection signal that notifies the selection of the j-th column is input to the latch LAT_1j, the latch LAT_2j, and the conversion output circuit CA_j.

When a column selection signal is input to the j-th column, the switch 123 of the current-voltage converter 120a or 120b of the conversion output circuit CA_j (semiconductor device 200), whichever is subjected to the i-th row writing operation, is turned on (for example, the switch 123b of the current-voltage converter 120b is turned on), so that a video signal is supplied to the wiring 536_j (see FIG. 23A).

The latch LAT_1j transfers a digital signal DS_i written in the i-th row operation to the latch LAT_2j (see FIG. 23A). After that, a digital signal DS_i+1 is written to the latch LAT_1j from the data line DATA, and the latch LAT_1j holds the signal (see FIG. 23B).

The other of the current-voltage converters 120a and 120b (e.g., the current-voltage converter 120a) conducts reset operation, and subsequently writes a potential corresponding to the digital signal held in the latch LAT_2j and holds the potential (see FIG. 23C).

The above operation is repeated until it is conducted to the m-th row and n-th column, and then writing of a next frame starts. In this way, an image can be displayed on the display region 531. The conversion output circuit CA has a plurality of current-voltage converters; therefore, while one current-voltage converter outputs a video signal, another current-voltage converter can prepare to output a next video signal. Thus, the settling time can be practically eliminated or be reduced. A video signal can be quickly supplied to a pixel. According to one embodiment of the present invention, a display device that does not easily increase power consumption even with higher definition can be achieved. According to one embodiment of the present invention, a display device having a high display quality can be achieved.

Figure 24:
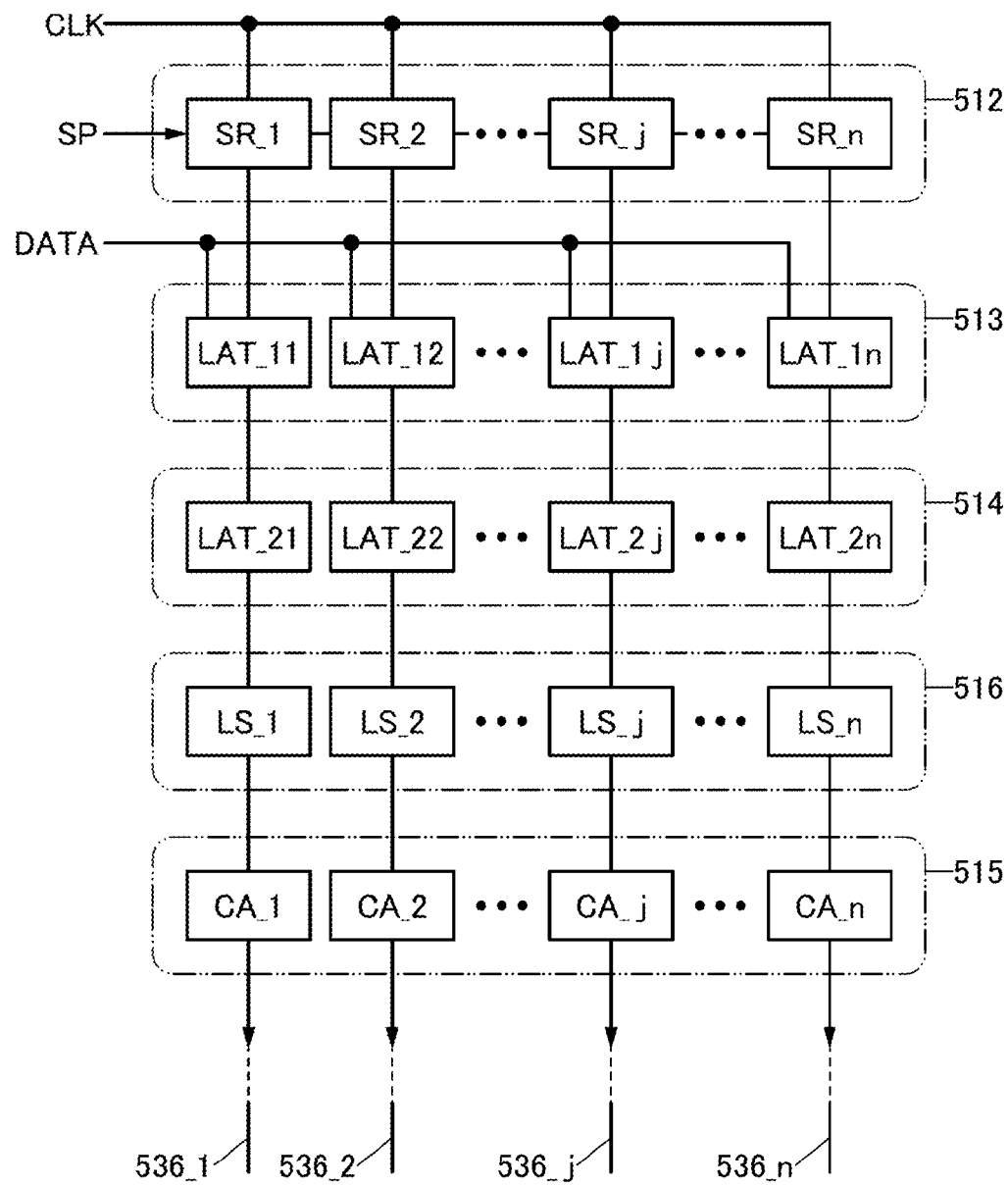
FIG. 24 illustrates a semiconductor device.

As shown by a driver circuit 511a in FIG. 24, a level shifter 516 may be provided between the second latch circuit 514 and the DA conversion output circuit 515. The level shifter 516 includes shifters LS (shifters LS_1 to LS_n) that respectively corresponds to the columns. A shifter LS_j on the j-th column has a function of widening the voltage amplitude of a signal output from the latch LAT_2j and inputting it to the conversion output circuit CA_j. With the level shifter 516, operation voltages of the shift register 512, the first latch circuit 513, and the second latch circuit 514 can be reduced. Accordingly, power consumption of the display device 500 can be reduced.

This embodiment can be implemented in an appropriate combination with any of the structures described in the other embodiments.

(Embodiment 4)

This embodiment describes examples of a transistor that can be used for the pixel circuit, the driver circuit, or the like described in the above-described embodiments.

The semiconductor device or the like of one embodiment of the present invention can be fabricated by using a transistor with any of various structures, such as a bottom-gate transistor, a top-gate transistor, or the like. Therefore, a material for a semiconductor layer or the structure of a transistor can be easily changed to comply with the existing production line.

[Bottom-gate transistor]

FIG. 25A1 is a cross-sectional view of a channel-protective transistor 410 that is a type of bottom-gate transistor. The transistor 410 includes an electrode 246 over a substrate 271 with an insulating layer 272 positioned therebetween. The transistor 410 includes a semiconductor layer 242 over the electrode 246 with an insulating layer 226 provided therebetween. The electrode 246 can function as a gate electrode. The insulating layer 226 can function as a gate insulating layer.

The transistor 410 includes an insulating layer 225 over a channel formation region in the semiconductor layer 242. The transistor 410 includes an electrode 244a and an electrode 244b which are partly in contact with the semiconductor layer 242 and over the insulating layer 226. Part of the electrode 244a and part of the electrode 244b are formed over the insulating layer 225.

The insulating layer 225 can function as a channel protective layer. With the insulating layer 225 provided over the channel formation region, the semiconductor layer 242 can be prevented from being exposed at the time of forming the electrodes 244a and 244b. Thus, the channel formation region in the semiconductor layer 242 can be prevented from being etched at the time of forming the electrodes 244a and 244b. According to one embodiment of the present invention, a transistor with favorable electrical characteristics can be provided.

The transistor 410 includes an insulating layer 228 over the electrode 244a, the electrode 244b, and the insulating layer 225 and further includes an insulating layer 229 over the insulating layer 228.

In the case where an oxide semiconductor is used for the semiconductor layer 242, a material that is capable of removing oxygen from part of the semiconductor layer 242 to generate oxygen vacancies is preferably used at least for regions of the electrodes 244a and 244b that are in contact with the semiconductor layer 242. The carrier concentration of the regions of the semiconductor layer 242 in which oxygen vacancies are generated is increased, so that the regions become n-type regions (n$^+$ layers). Accordingly, the regions can function as a source region or a drain region. Examples of the material which is capable of removing oxygen from the oxide semiconductor to generate oxygen vacancies include tungsten and titanium.

Formation of the source region and the drain region in the semiconductor layer 242 makes it possible to reduce contact resistance between the semiconductor layer 242 and the electrode 244a and contact resistance between the semiconductor layer 242 and the electrode 244b. Accordingly, the electrical characteristics of the transistor, such as the field-effect mobility and the threshold voltage, can be favorable.

In the case where a semiconductor such as silicon is used for the semiconductor layer 242, a layer that functions as an n-type semiconductor or a p-type semiconductor is preferably provided between the semiconductor layer 242 and the electrode 244a and between the semiconductor layer 242 and the electrode 244b. The layer that functions as an n-type semiconductor or a p-type semiconductor can function as a source region or a drain region in the transistor.

The insulating layer 229 is preferably formed using a material that can prevent or reduce diffusion of impurities into the transistor from the outside. The formation of the insulating layer 229 may be omitted as appropriate.

When an oxide semiconductor is used for the semiconductor layer 242, heat treatment may be performed before and/or after the insulating layer 229 is formed. The heat treatment can fill oxygen vacancies in the semiconductor layer 242 by diffusing oxygen contained in the insulating layer 229 or other insulating layers into the semiconductor layer 242. Alternatively, the insulating layer 229 may be formed while the heat treatment is performed, so that oxygen vacancies in the semiconductor layer 242 can be filled.

A CVD method can be generally classified into a plasma enhanced CVD (PECVD) method using plasma, a thermal CVD (TCVD) method using heat, and the like. The CVD method can be also classified into a metal CVD (MCVD) method, a metal organic CVD (MOCVD) method, and the like according to a source gas to be used.

An evaporation method can be typically classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using the PECVD method, a high-quality film can be formed at a relatively low temperature. By using a deposition method that does not use plasma for deposition, such as the MOCVD method or the evaporation method, a film can be formed with few defects because damage is not easily caused on a surface on which the film is deposited.

A sputtering method is typically classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between the targets; thus, plasma damage to a substrate can be reduced. Further, step coverage can be improved because an incident angle of a sputtered particle to the substrate can be made smaller depending on the inclination of the target.

A transistor 411 illustrated in FIG. 25A2 is different from the transistor 410 in that an electrode 223 that can function as a back gate electrode is provided over the insulating layer 229. The electrode 223 can be formed using a material and a method similar to those of the electrode 246.

In general, the back gate electrode is formed using a conductive layer and positioned so that the channel formation region of the semiconductor layer is positioned between the gate electrode and the back gate electrode. Thus, the back gate electrode can function similarly to the gate electrode. The potential of the back gate electrode may be the same as that of the gate electrode or may be a ground (GND) potential or an arbitrary potential. By changing a potential of the back gate electrode independently of the potential of the gate electrode, the threshold voltage of the transistor can be changed.

The electrode 246 and the electrode 223 can each function as a gate electrode. Thus, the insulating layers 226, 225, 228, and 229 can each function as a gate insulating layer. The electrode 223 may be provided between the insulating layers 228 and 229.

In the case where one of the electrode 246 and the electrode 223 is simply referred to as a "gate electrode" or "gate", the other is referred to as a "back gate electrode" or "back gate". For example, in the transistor 411, in the case where the electrode 223 is referred to as a "gate electrode", the electrode 246 is referred to as a "back gate electrode". In the case where the electrode 223 is used as a "gate electrode", the transistor 411 can be regarded as a kind of top-gate transistor. Alternatively, one of the electrode 246 and the electrode 223 may be referred to as a "first gate electrode", and the other may be referred to as a "second gate electrode".

By providing the electrode 246 and the electrode 223 with the semiconductor layer 242 provided therebetween and setting the potentials of the electrode 246 and the electrode 223 to be the same, a region of the semiconductor layer 242 through which carriers flow is enlarged in the film thickness direction; thus, the amount of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current. With one embodiment of the present invention, the area occupied by a transistor can be reduced. Therefore, with one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrode 246 and the electrode 223 each have a function of blocking an electric field from the outside, electric charge of charged particles and the like generated on the insulating layer 272 side or above the electrode 223 do not influence the channel formation region in the semiconductor layer 242. Thus, degradation by a stress test (e.g., a negative gate bias temperature (−GBT) stress test in which negative charge is applied to a gate) can be reduced. Furthermore, a variation in gate voltage (rising voltage) at which on-state current starts flowing at different drain voltages can be reduced. Note that this effect is obtained when the electrodes 246 and 223 have the same potential or different potentials.

The BT stress test is one kind of accelerated test and can evaluate, in a short time, a change by long-term use (i.e., a change over time) in characteristics of transistors. In particular, the amount of change in threshold voltage of the transistor between before and after the BT stress test is an important indicator to examine the reliability of the transistor. As the change in the threshold voltage is smaller, the transistor has higher reliability.

By providing the electrodes 246 and 223 and setting the potentials of the electrodes 246 and 223 to be the same, the amount of change in threshold voltage is reduced. Accordingly, a variation in electrical characteristics among a plurality of transistors is also reduced.

The transistor including the back gate electrode has a smaller change in threshold voltage by a positive GBT stress test in which positive electric charge is applied to a gate than a transistor including no back gate electrode.

When the back gate electrode is formed using a light-blocking conductive film, light can be prevented from entering the semiconductor layer from the back gate electrode side. Therefore, light deterioration of the semiconductor layer can be prevented and deterioration in electrical characteristics of the transistor, such as a shift of the threshold voltage, can be prevented.

With one embodiment of the present invention, a transistor with high reliability can be provided. Moreover, a semiconductor device with high reliability can be provided.

FIG. 25B1 shows a cross-sectional view of a channel-protective transistor 420 that is a type of bottom-gate transistor. The transistor 420 has substantially the same structure as the transistor 410 but is different from the transistor 410 in that the insulating layer 225 covers the semiconductor layer 242. With the insulating layer 225, the semiconductor layer 242 can be prevented from being exposed at the time of forming the electrodes 244a and 244b. Thus, the semiconductor layer 242 can be prevented from being reduced in thickness at the time of forming the electrodes 244a and 244b.

The semiconductor layer 242 is electrically connected to the electrode 244a in an opening formed by selectively removing part of the insulating layer 225 which overlaps with the semiconductor layer 242. The semiconductor layer 242 is electrically connected to the electrode 244b in another opening formed by selectively removing part of the insulating layer 225 which overlaps with the semiconductor layer 242. A region of the insulating layer 225 which overlaps with the channel formation region can function as a channel protective layer.

A transistor 421 illustrated in FIG. 25B2 is different from the transistor 420 in that the electrode 223 that can function as a back gate electrode is provided over the insulating layer 229.

The distance between the electrodes 244a and 246 and the distance between the electrodes 244b and 246 in the transistors 420 and 421 are longer than those in the transistors 410 and 411. Thus, the parasitic capacitance generated between the electrodes 244a and 246 can be reduced. Furthermore, the parasitic capacitance generated between the electrodes 244b and 246 can be reduced. According to one embodiment of the present invention, a transistor with favorable electrical characteristics can be provided.

A transistor 425 illustrated in FIG. 25C1 is a channel-etched transistor that is a type of bottom-gate transistor. In the transistor 425, the insulating layer 225 is not provided and the electrodes 244a and 244b are formed to contact with the semiconductor layer 242. Thus, part of the semiconductor layer 242 that is exposed when the electrodes 244a and 244b are formed is etched in some cases. However, since the insulating layer 225 is not provided, the productivity of the transistor can be increased.

A transistor 426 illustrated in FIG. 25C2 is different from the transistor 425 in that the electrode 223 which can function as a back gate electrode is provided over the insulating layer 229.

[Top-gate transistor]

FIG. 26A1 is a cross-sectional view of a transistor 430 that is a type of top-gate transistor. The transistor 430 includes the semiconductor layer 242 over the substrate 271 with the insulating layer 272 therebetween, the electrodes 244a and 244b that are over the semiconductor layer 242 and the insulating layer 272 and in contact with part of the semiconductor layer 242, the insulating layer 226 over the semiconductor layer 242 and the electrodes 244a and 244b, and the electrode 246 over the insulating layer 226.

Since the electrode 246 overlaps with neither the electrode 244a nor the electrode 244b in the transistor 430, the parasitic capacitance generated between the electrodes 246 and 244a and the parasitic capacitance generated between the electrodes 246 and 244b can be reduced. After the formation of the electrode 246, an impurity 255 is introduced into the semiconductor layer 242 using the electrode 246 as a mask, so that an impurity region can be formed in the semiconductor layer 242 in a self-aligned manner (see FIG. 26A3). According to one embodiment of the present invention, a transistor with favorable electrical characteristics can be provided.

The introduction of the impurity 255 can be performed with an ion implantation apparatus, an ion doping apparatus, or a plasma treatment apparatus.

As the impurity 255, for example, at least one kind of element of Group 13 elements and Group 15 elements can be used. In the case where an oxide semiconductor is used for the semiconductor layer 242, it is possible to use at least one kind of element of a rare gas, hydrogen, and nitrogen as the impurity 255.

A transistor 431 illustrated in FIG. 26A2 is different from the transistor 430 in that the electrode 223 and an insulating layer 227 are included. The transistor 431 includes the electrode 223 formed over the insulating layer 272 and the insulating layer 227 formed over the electrode 223. The electrode 223 can function as a back gate electrode. Thus, the insulating layer 227 can function as a gate insulating layer. The insulating layer 227 can be formed using a material and a method similar to those of the insulating layer 226.

The transistor 431 as well as the transistor 411 has large on-state current for the area occupied thereby. That is, the area occupied by the transistor 431 can be small for required on-state current. With one embodiment of the present invention, the area occupied by a transistor can be reduced. Therefore, with one embodiment of the present invention, a semiconductor device having a high degree of integration can be provided.

A transistor 440 shown in FIG. 26B1 as an example is a type of top-gate transistor. The transistor 440 is different from the transistor 430 in that the semiconductor layer 242 is formed after the formation of the electrodes 244a and 244b. A transistor 441 illustrated in FIG. 26B2 is different from the transistor 440 in that the electrode 223 and the insulating layer 227 are included. Thus, in the transistors 440 and 441, part of the semiconductor layer 242 is formed over the electrode 244a and another part of the semiconductor layer 242 is formed over the electrode 244b.

The transistor 441 as well as the transistor 411 has a high on-state current for the area occupied thereby. That is, the area occupied by the transistor 441 can be small for required on-state current. With one embodiment of the present invention, the area occupied by a transistor can be reduced. Therefore, with one embodiment of the present invention, a semiconductor device having a high degree of integration can be provided.

A transistor 442 illustrated in FIG. 27A1 as an example is a type of top-gate transistor. The transistor 442 has the electrodes 244a and 244b over the insulating layer 229. The electrodes 244a and 244b are electrically connected to the semiconductor layer 242 in openings formed in the insulating layers 228 and 229.

Part of the insulating layer 226 that does not overlap with the electrode 246 is removed. The insulating layer 226 included in the transistor 442 is partly extended across the ends of the electrode 246.

The impurity 255 is added to the semiconductor layer 242 using the electrode 246 and the insulating layer 226 as masks, so that an impurity region can be formed in the semiconductor layer 242 in a self-aligned manner (see FIG. 27A3).

At this time, the impurity 255 is not added to the semiconductor layer 242 in a region overlapping with the electrode 246, and the impurity 255 is added to the semiconductor layer 242 in a region that does not overlap with the electrode 246. The semiconductor layer 242 in a region into which the impurity 255 is introduced through the insulating layer 226 has a lower impurity concentration than the semiconductor layer 242 in a region into which the impurity 255 is introduced without through the insulating layer 226. Thus, a lightly doped drain (LDD) region is formed in the semiconductor layer 242 in a region adjacent to the electrode 246 when seen from the above.

A transistor 443 illustrated in FIG. 27A2 is different from the transistor 442 in that the transistor 443 includes the electrode 223 under the semiconductor layer 242. The electrode 223 and the semiconductor layer 242 overlap with each other with the insulating layer 272 positioned therebetween. The electrode 223 can function as a back gate electrode.

As in a transistor 444 illustrated in FIG. 27B1 and a transistor 445 illustrated in FIG. 27B2, the insulating layer 226 in a region that does not overlap with the electrode 246 may be wholly removed. Alternatively, as in a transistor 446 illustrated in FIG. 27C1 and a transistor 447 illustrated in FIG. 27C2, the insulating layer 226 except for the openings may be left without being removed.

In the transistors 444 to 447, after the formation of the electrode 246, the impurity 255 is added to the semiconductor layer 242 using the electrode 246 as a mask, so that an impurity region can be formed in the semiconductor layer 242 in a self-aligned manner.

FIG. 28A is a cross-sectional view of a transistor 471 and a transistor 472 that use a semiconductor substrate as the substrate 271, which are examples of a top-gate transistor. A transistor manufactured using a semiconductor substrate can operate at high speed. In this embodiment, an example in which a p-type single-crystal silicon substrate is used as the substrate 271 is described. In each of the transistors 471 and 472, a channel is formed in the substrate 271.

The transistor 471 can function as an n-channel transistor. The transistor 471 includes a channel formation region 283, n-type impurity regions 284 functioning as lightly doped drain (LDD) regions or extension regions, n-type impurity regions 285 functioning as a source region and a drain region, an insulating layer 216, and an electrode 287. The electrode 287 functions as a gate electrode. The insulating layer 216 functions as a gate insulating layer. The n-type impurity regions 285 have a higher impurity concentration than the n-type impurity regions 284. A sidewall insulating layer 286 is provided on a side surface of the electrode 287. The n-type impurity regions 284 and the n-type impurity regions 285 can be formed in a self-aligned manner using the electrode 287 and the sidewall insulating layer 286 as masks.

The transistor 472 can function as a p-channel transistor. The transistor 472 is formed in an n-well 281. The n-well 281 is formed by adding an impurity element imparting n-type conductivity to part of the substrate 271. The transistor 472 includes a channel formation region 293, p-type impurity regions 294 functioning as LDD regions or extension regions, p-type impurity regions 295 functioning as a source region and a drain region, an insulating layer 216, and an electrode 297. The electrode 297 functions as a gate electrode. The insulating layer 216 functions as a gate insulating layer. The p-type impurity regions 295 have a higher impurity concentration than the p-type impurity regions 294. A sidewall insulating layer 296 is provided on a side surface of the electrode 297. The p-type impurity regions 294 and the p-type impurity regions 295 can be formed in a self-aligned manner using the electrode 297 and the sidewall insulating layer 296 as masks.

The transistors 471 and 472 are separated from another transistor formed in the substrate 271 by an element separation region 299. The insulating layers 228 and 229 are formed to cover the electrode 287, the sidewall insulating layer 286, the electrode 297, and the sidewall insulating layer 296. An insulating layer 275 that has a flat surface is formed over the insulating layer 229, and electrodes 289a, 289b, 292a, and 292b are formed over the insulating layer 275.

The element separation region 299 can be formed by a shallow trench isolation (STI) method or a local oxidation of silicon (LOCOS) method. The STI method can reduce the generation of a bird's beak in an element isolation region, which is caused in the LOCOS element isolation method, and can reduce the size of the element isolation region. Thus, it is preferable to employ the STI method to form the element separation region 299.

The sidewall insulating layers 286 and 296 can be formed by a known method, such as anisotropic etching of an insulating layer.

The electrode 289a is electrically connected to one of the n-type impurity regions 285, through a contact plug 288a in an opening formed by removing part of the insulating layers 275, 229, and 228. The electrode 289b is electrically connected to the other of the n-type impurity regions 285, through a contact plug 288b in an opening formed by removing part of the insulating layers 275, 229, and 228.

The electrode 292a is electrically connected to one of the p-type impurity regions 295, through a contact plug 298a in an opening formed by removing part of the insulating layers 275, 229, and 228. The electrode 292b is electrically connected to the other of the p-type impurity regions 295, through a contact plug 298b in an opening formed by removing part of the insulating layers 275, 229, and 228.

As the transistor 471 and/or the transistor 472, a transistor containing silicide (salicide) or a transistor that does not include a sidewall insulating layer may be used. When a structure that contains silicide (salicide) is used, the resistance of the source region and the drain region can be further lowered and the speed of the semiconductor device can be increased. Furthermore, the semiconductor device can be operated at low voltage, so that power consumption of the semiconductor device can be reduced.

[Fin-type transistor]

FIGS. 28B1 and 28B2 show another example of a transistor using a semiconductor substrate as the substrate 271. FIG. 28B1 is a cross-sectional view of a transistor 291 in the channel length direction, and FIG. 28B2 is a cross-sectional view of the transistor 291 in the channel width direction. The transistor 291 is a Fin-type transistor. The effective channel width is increased in the Fin-type transistor, whereby the on-state characteristics of the transistor can be improved. In addition, since contribution of the electric field of the gate electrode to the channel formation region can be increased, the off-state characteristics of the transistor can be improved.

In the transistor 291, an electrode 289c is formed over the insulating layer 275. The electrode 289c is electrically connected to the electrode 287, through a contact plug 288c in an opening formed by removing part of the insulating layers 275, 229, and 228 (see FIG. 28B2).

[S-channel transistor]

FIGS. 29A to 29C illustrate an example of the structure of a transistor using an oxide semiconductor for the semiconductor layer 242. In a transistor 450 illustrated in FIGS. 29A to 29C, a semiconductor layer 242b is formed over a semiconductor layer 242a, and a semiconductor layer 242c covers a top surface and a side surface of the semiconductor layer 242b and a side surface of the semiconductor layer 242a. FIG. 29A is the top view of the transistor 450. FIG. 29B is a cross-sectional view (in the channel length direction) taken along dashed-dotted line X1-X2 in FIG. 29A. FIG. 29C is a cross-sectional view (in the channel width direction) taken along dashed-dotted line Y1-Y2 in FIG. 29A.

The transistor 450 includes an electrode 243 functioning as a gate electrode. The electrode 243 can be formed using a material and a method similar to those of the electrode 246. The electrode 243 is formed of two stacked conductive layers in this embodiment.

Each of the semiconductor layer 242a, the semiconductor layer 242b, and the semiconductor layer 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn; the element M is one or more kinds of elements selected from Al, Ti, Ga, Y, Zr, La, Ce, Nd, and Hf and has a higher strength of bonding with oxygen than In has).

The semiconductor layer 242a and the semiconductor layer 242c are preferably formed using a material containing one or more kinds of metal elements contained in the semiconductor layer 242b. With the use of such a material, interface states at interfaces between the semiconductor layer 242a and the semiconductor layer 242b and between the semiconductor layer 242c and the semiconductor layer 242b are less likely to be generated. Accordingly, carriers are not likely to be scattered or captured at the interfaces, which results in an improvement in field-effect mobility of the transistor. Further, threshold-voltage variation of the transistor can be reduced. Thus, a semiconductor device having favorable electrical characteristics can be obtained.

Each of the thicknesses of the semiconductor layer 242a and the semiconductor layer 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer 242b is an In-M-Zn oxide and the semiconductor layers 242a and 242c are each an In-M-Zn oxide, the semiconductor layers 242a and 242c each have an atomic ratio of In:M:Zn=$x_1$:$y_1$:$z_1$, and the semiconductor layer 242b has an atomic ratio of In:M:Zn=$x_2$:$y_2$:$z_2$, for example. It is preferable that the compositions of the semiconductor layer 242a, the semiconductor layer 242c, and the semiconductor layer 242b are determined so that $y_1/x_1$ is 1.5 times or more as large as $y_2/x_2$. It is further preferable that the compositions of the semiconductor layer 242a, the semiconductor layer 242c, and the semiconductor layer 242b are determined so that $y_1/x_1$ is twice or more as large as $y_2/x_2$. It is still further preferable that the compositions of the semiconductor layer 242a, the semiconductor layer 242c, and the semiconductor layer 242b are determined so that $y_1/x_1$ is three times or more as large as $y_2/x_2$. It is preferred that $y_1$ be larger than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can each be a layer in which oxygen vacancies are less likely to be generated than in the semiconductor layer 242b.

In the case where the semiconductor layers 242a and 242c are each an In-M-Zn oxide and the summation of In and the element M is assumed to be 100 atomic %, the atomic percentages of In and an element M are preferably as follows: the percentage of In is lower than 50 atomic % and the percentage of M is higher than or equal to 50 atomic %. The percentages of In and M are more preferably as follows: the percentage of In is lower than 25 atomic % and the percentage of M is higher than or equal to 75 atomic %. In the case where the semiconductor layer 242b is an In-M-Zn oxide and the summation of In and M is assumed to be 100 atomic %, the atomic percentages of In and the element M are preferably more than or equal to 25 atomic % and less than 75 atomic %, respectively, further preferably more than or equal to 34 atomic % and less than 66 atomic %, respectively.

For example, an In—Ga—Zn oxide which is formed using a target having an atomic ratio of In:Ga:Zn=1:3:2, 1:3:4, 1:3:6, 1:6:4, or 1:9:6, an In—Ga oxide which is formed using a target having an atomic ratio of In:Ga=1:9, a gallium oxide, or the like can be used for each of the semiconductor layer 242a and the semiconductor layer 242c containing In or Ga. Furthermore, an In—Ga—Zn oxide which is formed using a target having an atomic ratio of In:Ga:Zn=3:1:2, 1:1:1, 5:5:6, 5:1:7, or 4:2:4.1 can be used for the semiconductor layer 242b. Note that the atomic ratio of each of the semiconductor layer 242a, the semiconductor layer 242b, and the semiconductor layer 242c may vary within a range of ±20% of any of the above-described atomic ratios as an error.

In order to give stable electrical characteristics to the transistor including the semiconductor layer 242b, it is preferable that impurities and oxygen vacancies in the semiconductor layer 242b be reduced to purify the semiconductor layer so that the semiconductor layer 242b can be an intrinsic or substantially intrinsic semiconductor layer. Furthermore, it is preferable that at least the channel formation region of the semiconductor layer 242b be a semiconductor layer that can be regarded as an intrinsic or substantially intrinsic semiconductor layer.

Note that the substantially intrinsic oxide semiconductor layer refers to an oxide semiconductor layer in which the carrier density is higher than or equal to $1\times10^{-9}/\text{cm}^3$ and lower than $8\times10^{11}/\text{cm}^3$, preferably lower than $1\times10^{11}/\text{cm}^3$, more preferably lower than $1\times10^{10}/\text{cm}^3$.

FIGS. 30A to 30C illustrate an example of the structure of a transistor including an oxide semiconductor layer as the semiconductor layer 242. In a transistor 422 illustrated in FIGS. 30A to 30C as an example, the semiconductor layer 242b is formed over the semiconductor layer 242a. The transistor 422 is a kind of bottom-gate transistor having a back-gate electrode. FIG. 30A is a top view of the transistor 422. FIG. 30B is a cross-sectional view (in the channel length direction) taken along dashed-dotted line X1-X2 in FIG. 30A. FIG. 30C is a cross-sectional view (in the channel width direction) taken along dash-dot line Y1-Y2 in FIG. 30A.

The electrode 223 provided over the insulating layer 229 is electrically connected to the electrode 246 in an opening 247a and an opening 247b provided in the insulating layers 226, 228, and 229. Thus, the same potential is supplied to the electrodes 223 and 246. Furthermore, either or both of the openings 247a and 247b may be omitted. In the case where neither the opening 247a nor the opening 247b are provided, different potentials can be applied to the electrode 223 and the electrode 246.

[Energy Band Structure of Oxide Semiconductor]

Figure 34A:
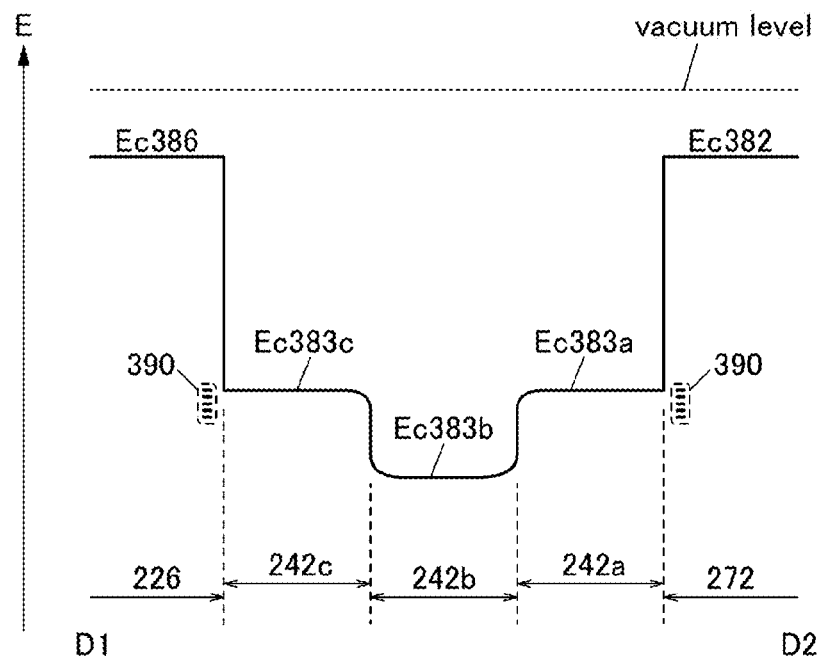
FIGS. 34A and 34B each show an energy band structure.
Figure 34B:
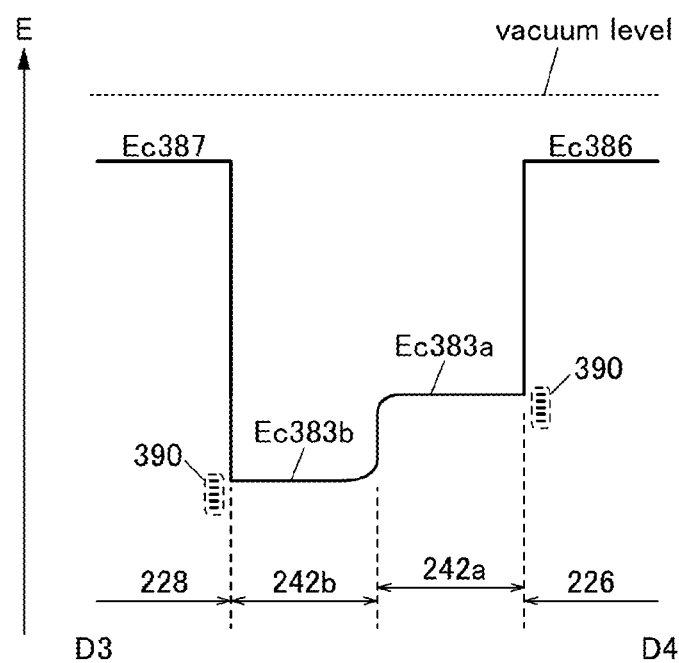

The function and effect of the semiconductor layer 242 that is a stacked layer including the semiconductor layers 242a, 242b, and 242c are described with an energy band structure diagrams shown in FIGS. 34A and 34B. FIG. 34A is the energy band structure diagram of a portion along dashed-dotted line D1-D2 in FIG. 29B. That is, FIG. 34A shows the energy band structure of a channel formation region of the transistor 450.

In FIG. 34A, Ec382, Ec383a, Ec383b, Ec383c, and Ec386 indicate the energy of the conduction band minimum of the insulating layer 272, the semiconductor layer 242a, the semiconductor layer 242b, the semiconductor layer 242c, and the insulating layer 226, respectively.

Here, a difference in energy between the vacuum level and the conduction band minimum (the difference is also referred to as "electron affinity") corresponds to a value obtained by subtracting an energy gap from a difference in energy between the vacuum level and the valence band maximum (the difference is also referred to as an ionization potential). Note that the energy gap can be measured using a spectroscopic ellipsometer (e.g., UT-300 manufactured by HORIBA JOBIN YVON S.A.S.). The difference in energy between the vacuum level and the valence band maximum can be measured using an ultraviolet photoelectron spectroscopy (UPS) device (e.g., VersaProbe manufactured by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 272 and the insulating layer 226 are insulators, Ec382 and Ec386 are closer to the vacuum level (have a smaller electron affinity) than Ec383a, Ec383b, and Ec383c.

Further, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Further, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of an interface between the semiconductor layer 242a and the semiconductor layer 242b and the vicinity of an interface between the semiconductor layer 242b and the semiconductor layer 242c, mixed regions are formed; thus, the energy of the conduction band minimum continuously changes. In other words, no state or few states exist at these interfaces.

Accordingly, electrons transfer mainly through the semiconductor layer 242b in the stacked-layer structure having the above energy band structure. Therefore, even when states exist at the interface between the semiconductor layer 242a and the insulating layer 272 or at the interface between the semiconductor layer 242c and the insulating layer 226, the states hardly influence the transfer of the electrons. In addition, the interface states do not exist or hardly exist at the interface between the semiconductor layer 242a and the semiconductor layer 242b and at the interface between the semiconductor layer 242c and the semiconductor layer 242b; thus, transfer of electrons are not prohibited in the regions. Accordingly, high field-effect mobility can be obtained in the transistor 450 having the above stacked-layer structure of the oxide semiconductor layers.

Note that although trap states 390 due to impurities or defects might be formed in the vicinity of the interface between the semiconductor layer 242a and the insulating layer 272 and in the vicinity of the interface between the semiconductor layer 242c and the insulating layer 226 as shown in FIG. 34A, the semiconductor layer 242b can be apart from the trap states owing to the existence of the semiconductor layer 242a and the semiconductor layer 242c.

In particular, in the transistor 450 described in this embodiment, an upper surface and a side surface of the semiconductor layer 242b are in contact with the semiconductor layer 242c, and a bottom surface of the semiconductor layer 242b is in contact with the semiconductor layer 242a. In this manner, the semiconductor layer 242b is surrounded by the semiconductor layer 242a and the semiconductor layer 242c, whereby the influence of the trap state can be further reduced.

However, in the case where an energy difference between Ec383a or Ec383c and Ec383b is small, electrons in the semiconductor layer 242b might reach the trap states by passing over the energy gap. The electrons are trapped by the trap states, which generates a negative fixed charge at the interface with the insulating layer, causing the threshold voltage of the transistor to be shifted in the positive direction.

Therefore, each of the energy differences between Ec383a and Ec383b and between Ec383c and Ec383b is preferably set to be larger than or equal to 0.1 eV, further preferably larger than or equal to 0.15 eV, in which case a change in the threshold voltage of the transistor can be reduced and the transistor can have favorable electrical characteristics.

Each of the band gaps of the semiconductor layer 242a and the semiconductor layer 242c is preferably larger than that of the semiconductor layer 242b.

FIG. 34B is the energy band structure diagram of a portion along dashed-dotted line D3-D4 in FIG. 30B. FIG. 34B shows the energy band structure of a channel formation region of the transistor 422.

In FIG. 34B, Ec387 represents the energy of the conduction band minimum of the insulating layer 228. The semiconductor layer 242 is formed using two layers, the semiconductor layers 242a and 242b; thus, the transistor can be manufactured with improved productivity. Since the semiconductor layer 242c is not provided, the transistor including the two semiconductor layers is easily affected by the trap states 390 but can have higher field-effect mobility than a transistor including one semiconductor layer as the semiconductor layer 242.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

Note that an oxide semiconductor has an energy gap as wide as 3.0 eV or more and high visible-light transmittance. In a transistor obtained by processing an oxide semiconductor under appropriate conditions, the off-state current at ambient temperature (e.g., 25° C.) can be less than or equal to 100 zA ($1 \times 10^{-19}$ A), less than or equal to 10 zA ($1 \times 10^{-20}$ A), or less than or equal to 1 zA ($1 \times 10^{-21}$ A). Therefore, a semiconductor device with low power consumption can be achieved.

With one embodiment of the present invention, a transistor with small power consumption can be provided. Accordingly, a display element or a semiconductor device such as a display device with low power consumption can be provided. Moreover, a display element or a semiconductor device such as a display device with high reliability can be provided.

The transistor 450 illustrated in FIGS. 29A to 29C is described again. A semiconductor layer 242b is provided over a projecting portion of the insulating layer 272, in which case the electrode 243 can cover a side surface of the semiconductor layer 242b. Thus, the transistor 450 has a structure in which the semiconductor layer 242b can be electrically surrounded by electric field of the electrode 243. The structure of a transistor in which the semiconductor layer including the channel is electrically surrounded by the electric field of the conductive film in this way is called a surrounded channel (s-channel) structure. A transistor having an s-channel structure is referred to as an s-channel transistor.

In the s-channel transistor, a channel can be formed in the whole (bulk) of the semiconductor layer 242b. In the s-channel structure, the drain current of the transistor is increased, so that a larger amount of on-state current can be obtained. Furthermore, the entire channel formation region of the semiconductor layer 242b can be depleted by the electric field of the electrode 243. Accordingly, off-state current of the transistor with an s-channel structure can be further reduced.

When the projecting portion of the insulating layer 272 is increased in height, and the channel width is shortened, the effects of the s-channel structure to increase the on-state current and reduce the off-state current can be enhanced. Part of the semiconductor layer 242a exposed in the formation of the semiconductor layer 242b may be removed. In this case, the side surfaces of the semiconductor layer 242a and the semiconductor layer 242b may be aligned to each other.

Figure 31A:
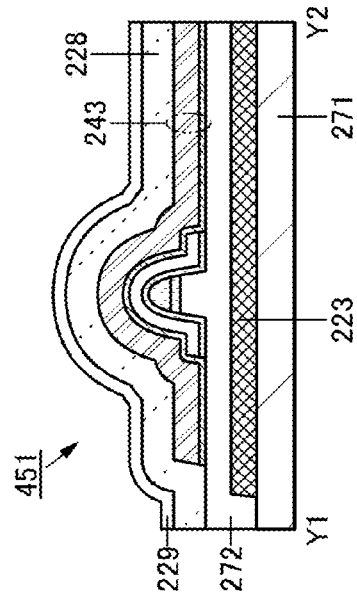
FIGS. 31A to 31C illustrate a semiconductor device.
Figure 31B:
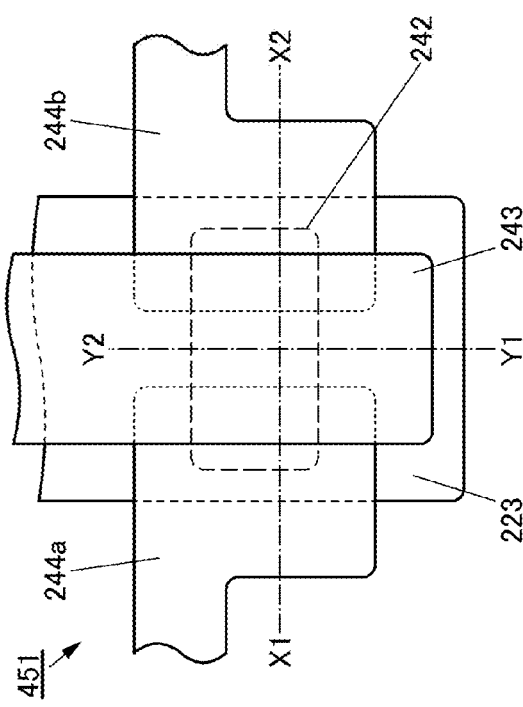
Figure 31C:
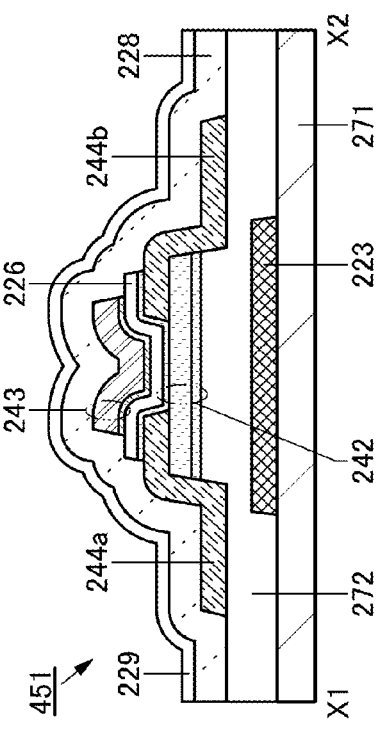

As in a transistor 451 illustrated in FIGS. 31A to 31C, the electrode 223 may be provided below the semiconductor layer 242 with an insulating layer provided therebetween. FIG. 31A is a top view of the transistor 451. FIG. 31B is a cross-sectional view taken along dashed-dotted line X1-X2 in FIG. 31A. FIG. 31C is a cross-sectional view taken along dashed-dotted line Y1-Y2 in FIG. 31A.

Figure 32A:
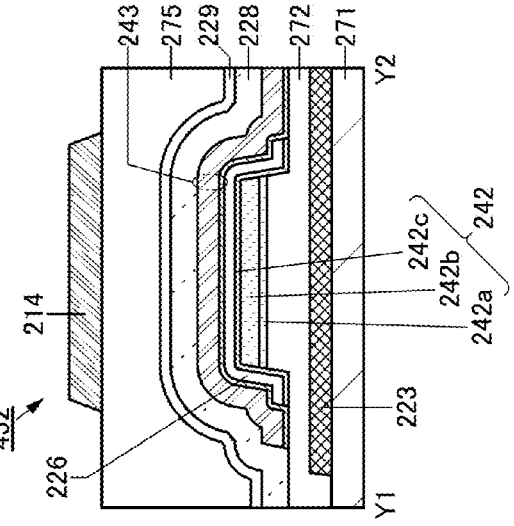
FIGS. 32A to 32C illustrate a semiconductor device.
Figure 32B:
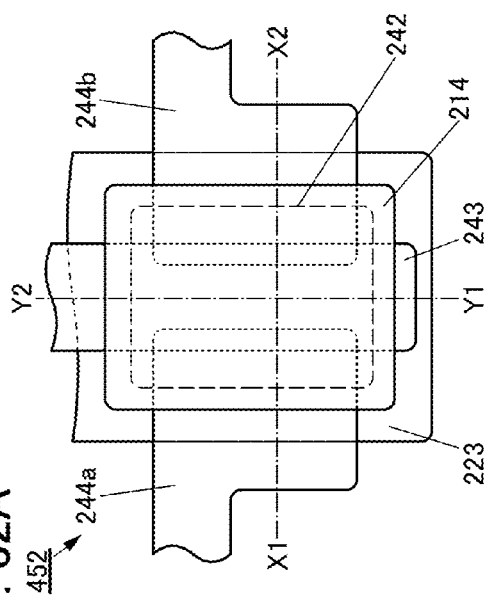
Figure 32C:
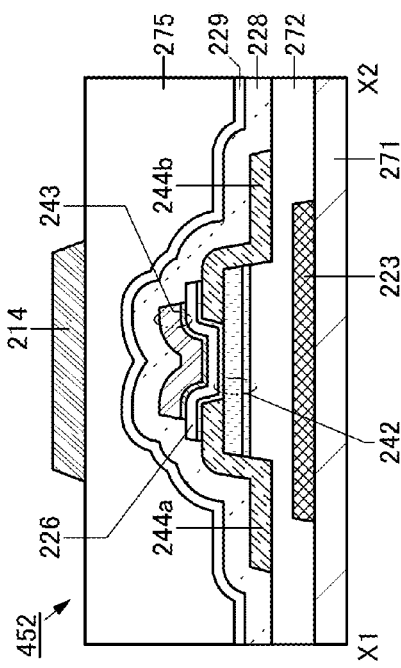

As in a transistor 452 illustrated in FIGS. 32A to 32C, an insulating layer 275 may be provided above the electrode 243 and a layer 214 may be provided over the insulating layer 275. FIG. 32A is a top view of the transistor 452. FIG. 32B is a cross-sectional view taken along dashed-dotted line X1-X2 in FIG. 32A. FIG. 32C is a cross-sectional view taken along dashed-dotted line Y1-Y2 in FIG. 32A.

Although the layer 214 is provided over the insulating layer 275 in FIGS. 32A to 32C, the layer 214 may be provided over the insulating layer 228 or 229. When the layer 214 is formed using a material having a light-blocking property, change in characteristics or decrease in reliability of the transistor that is caused by light irradiation can be prevented. When the layer 214 is formed at least larger than the semiconductor layer 242b such that the semiconductor layer 242b is covered with the layer 214, the above effects can be improved. The layer 214 can be formed using an organic material, an inorganic material, or a metal material. In the case where the layer 214 is formed using a conductive material, the layer 214 may be supplied with a voltage or may be set to an electrically-floating state.

Figure 33A:
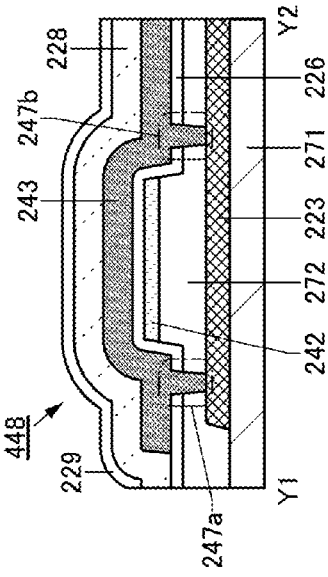
FIGS. 33A to 33C illustrate a semiconductor device.
Figure 33B:
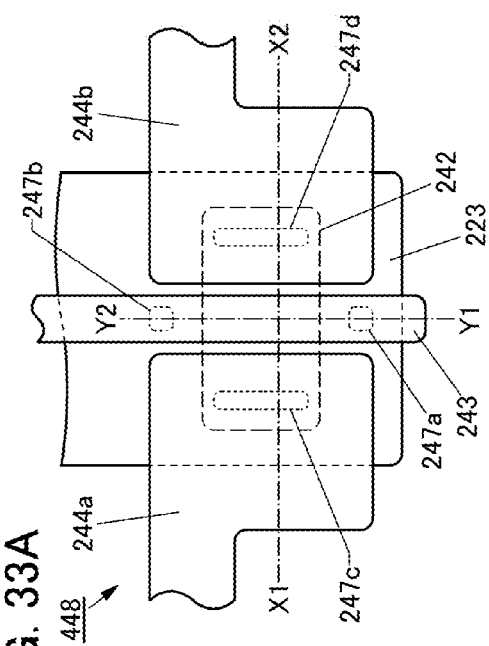
Figure 33C:
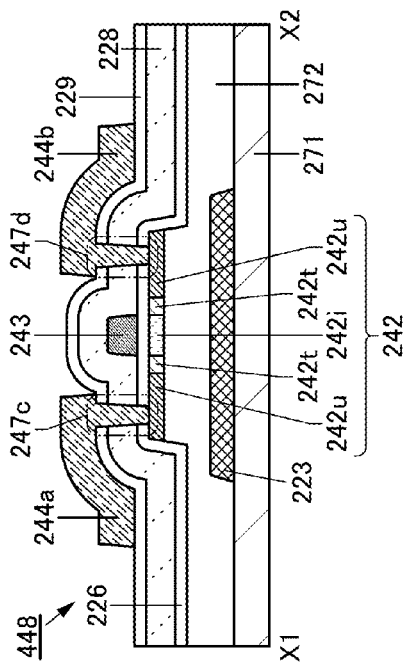

FIGS. 33A to 33C illustrate an example of a transistor with an s-channel structure. A transistor 448 in FIGS. 33A to 33C has almost the same structure as the transistor 447. In the transistor 448, the semiconductor layer 242 is formed over the projecting portion of the insulating layer 272. The transistor 448 is a kind of top-gate transistor having a back-gate electrode. FIG. 33A is a top view of the transistor 448. FIG. 33B is a cross-sectional view taken along dashed-dotted line X1-X2 in FIG. 33A. FIG. 33C is a cross-sectional view taken along dashed-dotted line Y1-Y2 in FIG. 33A.

FIGS. 33A to 33C illustrate an example in which an inorganic semiconductor layer such as a silicon layer is used as the semiconductor layer 242 in the transistor 448. In FIGS. 33A to 33C, the semiconductor layer 242 includes a semiconductor layer 242i in a region overlapping with the gate electrode 246, two semiconductor layers 242t, and two semiconductor layers 242u. The semiconductor layer 242i is sandwiched between the two semiconductor layers 242t. The semiconductor layer 242i and the two semiconductor layers 242t are sandwiched between the two semiconductor layers 242u.

A channel is formed in the semiconductor layer 242i when the transistor 448 is on. Therefore, the semiconductor layer 242i serves as a channel formation region. The semiconductor layers 242t serve as low concentration impurity regions (i.e., LDD). The semiconductor layers 242u serve as high concentration impurity regions. Note that one or both of the two semiconductor layers 242t are not necessarily provided. One of the two semiconductor layers 242u serves as a source region, and the other semiconductor layer 242u serves as a drain region.

The electrode 244a provided over the insulating layer 229 is electrically connected to one of the semiconductor layers 242u in an opening 247c formed in the insulating layers 226, 228, and 229. The electrode 244b provided over the insulating layer 229 is electrically connected to the other of the semiconductor layers 242u in an opening 247d formed in the insulating layers 226, 228, and 229.

The electrode 243 provided over the insulating layer 226 is electrically connected to the electrode 223 in an opening 247a and an opening 247b formed in the insulating layers 226 and 272. Accordingly, the same potential is supplied to the electrodes 243 and 223. Either or both of the openings 247a and 247b may be omitted. In the case where neither the opening 247a nor the opening 247b are provided, different potentials can be applied to the electrode 223 and the electrode 243.

<Substrate>

There is no great limitation on a material used for the substrate 271. The material may be determined in accordance with the required characteristics; for example, whether it has light-transmitting property or not or heat resistance that can endure heat treatment or not is taken into consideration for the determination. For example, a glass substrate of barium borosilicate glass, aluminoborosilicate glass, or the like, a ceramic substrate, a quartz substrate, or a sapphire substrate can be used. Alternatively, a semiconductor substrate, a flexible substrate, an attachment film, a base film, or the like may be used as the substrate 271.

As the semiconductor substrate, a single material semiconductor substrate of silicon, germanium, or the like or a compound semiconductor substrate of silicon carbide, silicon germanium, gallium arsenide, indium phosphide, zinc oxide, or gallium oxide, or the like is used, for example. The semiconductor substrate may be a single-crystal semiconductor substrate or a polycrystalline semiconductor substrate.

As materials of the flexible substrate, the attachment film, and the base material film, the following materials can be used: polyethylene terephthalate (PET), polyethylene naphthalate (PEN), polyether sulfone (PES), polytetrafluoroethylene (PTFE), polypropylene, polyester, polyvinyl fluoride, polyvinyl chloride, polyolefin, polyamide (e.g., nylon or aramid), polyimide, polycarbonate, aramid, an epoxy resin, an acrylic resin, and the like.

The flexible substrate used as the substrate 271 preferably has a lower coefficient of linear expansion because a lower coefficient of linear expansion suppresses deformation due to an environment. The flexible substrate used as the substrate 271 is formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. In particular, aramid is preferably used for the flexible substrate because of its low coefficient of linear expansion.

<Insulating Layer>

The insulating layers 272, 226, 225, 228, and 229 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layers 272 and 229 be formed using an insulating material that is relatively impermeable to impurities. The insulating layers 272 and 229 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. The insulating layer 272 or 229 may be formed using indium tin zinc oxide (In—Sn—Zn oxide) having an excellent insulating property or the like.

When the insulating material that is relatively impermeable to impurities is used for the insulating layer 272, impurity diffusion from the substrate 271 side can be suppressed, and the reliability of the transistor can be improved. When the insulating material that is relatively impermeable to impurities is used for the insulating layer 229, impurity diffusion from the insulating layer 229 side can be suppressed, and the reliability of the transistor can be improved.

A plurality of insulating layers formed of such materials may be stacked to form any of the insulating layers 272, 226, 225, 228, and 229. The formation method of the insulating layers 272, 226, 225, 228, and 229 is not particularly limited, and a sputtering method, a CVD method, an MBE method, a PLD method, an ALD method, a spin coating method, or the like can be used.

For example, in the case where an aluminum oxide film is formed by a thermal CVD method, two kinds of gases, e.g., $H_2O$ as an oxidizer and a source material gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

When an oxide semiconductor is used for the semiconductor layer 242, the hydrogen concentration in the insulating layers is preferably lowered in order to prevent an increase in hydrogen concentration in the semiconductor layer 242. It is particularly preferable to lower the hydrogen concentration of the insulating layer in contact with the semiconductor layer 242. Specifically, the hydrogen concentration in the insulating layer, which is measured by SIMS, is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. Furthermore, the nitrogen concentration in the insulating layers is preferably low in order to prevent an increase in the nitrogen concentration in the semiconductor layer 242. It is particularly preferable to lower the nitrogen concentration of the insulating layer in contact with the semiconductor layer 242. Specifically, the nitrogen concentration in the insulating layer, which is measured by SIMS, is lower than $5 \times 10^{19}$ atoms/cm$^3$, preferably lower than or equal to $5 \times 10^{18}$ atoms/ cm$^3$, further preferably lower than or equal to 1×10$^{18}$ atoms/cm$^3$, still further preferably lower than or equal to 5×10$^{17}$ atoms/cm$^3$.

The concentration measured by SIMS analysis may include a variation within a range of ±40%.

When an oxide semiconductor is used for the semiconductor layer 242, the insulating layers are preferably formed with insulating layers from which oxygen is released by heating (also referred to as insulating layers including excess oxygen). It is particularly preferable that the insulating layer in contact with the semiconductor layer 242 include excess oxygen. For example, the insulating layer is preferably an insulating layer of which the amount of released oxygen converted into oxygen atoms is greater than or equal to 1.0×10$^{18}$ atoms/cm$^3$, or greater than or equal to 3.0×10$^{20}$ atoms/cm$^3$ in TDS analysis in which heat treatment is performed so that the surface temperature of the insulating layer is higher than or equal to 100° C. and lower than or equal to 700° C., preferably higher than or equal to 100° C. and lower than or equal to 500° C.

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

The formation of an insulating layer by sputtering in an atmosphere including oxygen allows introduction of oxygen into the insulating layer.

Generally, a capacitor has such a structure that a dielectric is sandwiched between two electrodes that face to each other; as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, because of a tunnel effect or the like, current unintentionally flowing between the two electrodes (leakage current) tends to increase and the withstand voltage of the capacitor tends to be lower.

A portion where a gate electrode, a gate insulating layer, and a semiconductor layer of a transistor overlap with each other functions as a capacitor (hereinafter also referred to as "gate capacitor"). A channel is formed in a region of the semiconductor layer that overlaps with the gate electrode with the gate insulating layer provided therebetween. That is, the gate electrode and the channel formation region function as two electrodes of the capacitor. Furthermore, the gate insulating layer functions as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as hafnium silicate (HfSi$_x$O$_y$, (x>0, y>0)), hafnium silicate to which nitrogen is added (HfSi$_x$O$_y$N$_z$, (x>0, y>0, z>0)), hafnium aluminate to which nitrogen is added (HfAl$_x$O$_y$N$_z$ (x>0, y>0, z>0)), hafnium oxide, or yttrium oxide is used as a dielectric, even if the thickness of the dielectric is made thick, sufficient capacitance of the capacitor can be ensured.

For example, in the case where a high-k material with a high dielectric constant is used as the dielectric, even when the dielectric is made thick, a capacitance equivalent to that in the case of using silicon oxide as the dielectric can be obtained. This enables a reduction in leakage current between the two electrodes of the capacitor. The dielectric may have a stacked-layer structure of the high-k material and another insulating material.

The insulating layer 275 has a flat surface. As the insulating layer 275, an organic material having heat resistance, such as polyimide, an acrylic-based resin, a benzocyclobutene-based resin, polyamide, or an epoxy-based resin, can be used as well as the above-mentioned insulating materials. Other than such organic materials, it is possible to use a low-dielectric constant material (a low-k material), a siloxane-based resin, PSG (phosphosilicate glass), BPSG (borophosphosilicate glass), or the like. Note that a plurality of insulating layers formed of these materials may be stacked to form the insulating layer 275.

Note that the siloxane-based resin corresponds to a resin including an Si—O—Si bond formed using a siloxane-based material as a starting material. The siloxane-based resin may include an organic group (e.g., an alkyl group or an aryl group) or a fluoro group as a substituent. The organic group may include a fluoro group.

There is no particular limitation on the method for forming the insulating layer 275; depending on a material thereof, any of the following methods may be used: a sputtering method, an SOG method, spin coating, dipping, spray coating, a droplet discharging method (e.g., an ink-jet method), a printing method (e.g., screen printing or offset printing), or the like.

The sample surface may be subjected to CMP treatment. The CMP treatment can reduce unevenness of the surface, whereby coverage with an insulating layer or a conductive layer to be formed later can be increased.

<Semiconductor Layer>

A single-crystal semiconductor, a polycrystalline semiconductor, a microcrystalline semiconductor, an amorphous semiconductor, or the like may be used for the semiconductor layer 242. As a semiconductor material, silicon, germanium, or the like can be used. Alternatively, a compound semiconductor of silicon germanium, silicon carbide, gallium arsenide, oxide semiconductor, nitride semiconductor, or the like, an organic semiconductor, or the like may be used.

In the case of using an organic semiconductor for the semiconductor layer 242, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

As described above, the band gap of an oxide semiconductor is 2 eV or wider; thus, when the oxide semiconductor is used for the semiconductor layer 242, a transistor with an extremely low off-state current can be provided. An OS transistor has high withstand voltage between its source and drain. Thus, a transistor with high reliability can be provided. Furthermore, a display device, a semiconductor device, or the like with high reliability can be provided.

In this embodiment, the case where an oxide semiconductor is used for the semiconductor layer 242 is described. For the oxide semiconductor used for the semiconductor layer 242, an oxide semiconductor containing, for example, indium (In) is preferably used. An oxide semiconductor can have a high carrier mobility (electron mobility) by containing indium, for example. An oxide semiconductor preferably contains an element M.

The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, magnesium, and the like. Note that two or more of the above elements may be used in combination as the element M The element M is an element having a high bonding energy with oxygen, for example. The element M is an element that increases the energy gap of the oxide semiconductor, for example. Further, the oxide semiconductor preferably contains zinc. When the oxide semiconductor contains zinc, the oxide semiconductor is easily crystallized in some cases.

Note that the oxide semiconductor used for the semiconductor layer 242 is not limited to the oxide containing indium. The oxide semiconductor may be, for example, an oxide which does not contain indium and contains zinc, an oxide which does not contain indium and contains gallium, or an oxide which does not contain indium and contains tin, e.g., a zinc tin oxide, a gallium tin oxide, or gallium oxide.

For the oxide semiconductor used for the semiconductor layer 242, an oxide semiconductor with a wide energy gap is used, for example. For example, the energy gap of the oxide semiconductor used for the semiconductor layer 242 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide semiconductor film can be formed by a sputtering method, a chemical vapor deposition (CVD) method (including but not limited to a metal organic chemical vapor deposition (MOCVD) method, an atomic layer deposition (ALD) method, a thermal CVD method, or a plasma enhanced chemical vapor deposition (PECVD) method), a molecular beam epitaxy (MBE) method, or a pulsed laser deposition (PLD) method. By using the PECVD method, a high-quality film can be formed at a relatively low temperature. By using a deposition method that does not use plasma for deposition, such as the MOCVD method, the ALD method, or the thermal CVD method, damage is not easily caused on a surface on which a film is deposited and the film can be formed with few defects.

Unlike in a deposition method by which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, transistors or semiconductor devices can be manufactured with improved productivity.

For example, in the case where an $InGaZnO_X$ (X>0) film is formed by a thermal CVD method as the semiconductor layer 242, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where an $InGaZnO_X$ film (X>0) is formed as the semiconductor layer 242 by the ALD method, an $In(CH_3)_3$ gas and an $O_3$ gas are sequentially introduced a plurality of times to form an $InO_2$ layer, subsequently a $Ga(CH_3)_3$ gas and an $O_3$ gas are sequentially introduced a plurality of times to form a GaO layer, and then a $Zn(CH_3)_2$ gas and an $O_3$ gas are sequentially introduced a plurality of times to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by using these gases. Note that although an $H_2O$ gas which is obtained by bubbling water with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas or tris(acetylacetonato)indium may be used. Note that tris(acetylacetonato)indium is also referred to as $In(acac)_3$. In addition, instead of a $Ga(CH_3)_3$ gas, a $Ga(C_2H_5)_3$ gas or tris(acetylacetonato) gallium may be used. Note that tris(acetylacetonato)gallium is also referred to as $Ga(acac)_3$. Furthermore, a $Zn(CH_3)_2$ gas or zinc acetate may be used. However, the deposition gas is not limited to these.

In the case where the oxide semiconductor layer is formed by a sputtering method, a target containing indium is preferably used in order to reduce the number of particles. In addition, if an oxide target having a high atomic ratio of the element M is used, the conductivity of the target may be decreased. In the case where an oxide target with a high ratio of indium is used, the conductivity of the target can be increased and DC discharge or AC discharge is facilitated; thus, deposition over a large substrate can be easily performed. Thus, semiconductor devices can be manufactured with improved productivity.

As described above, in the case where the oxide semiconductor layer is formed by a sputtering method, the atomic ratio of In to M and Zn contained in the target may be 3:1:1, 3:1:2, 3:1:4, 1:1:0.5, 1:1:1, 1:1:2, 1:4:4, 5:1:7, or 4:2:4.1, for example.

When an oxide semiconductor layer is deposited by a sputtering method, an oxide semiconductor layer having an atomic ratio different from that of a target used may be deposited. Especially for zinc, the atomic ratio of zinc in the deposited film is smaller than the atomic ratio in the target in some cases. In other words, the proportion of zinc in the film may be smaller than the proportion of zinc in the target.

In order to give stable electrical characteristics to the OS transistor, it is preferable that impurities and oxygen vacancies in the oxide semiconductor layer be reduced to highly purify the oxide semiconductor layer so that the semiconductor layer 242 can be regarded as an intrinsic or substantially intrinsic oxide semiconductor layer. Furthermore, it is preferable that at least the channel formation region of the semiconductor layer 242 can be regarded as an intrinsic or substantially intrinsic oxide semiconductor layer.

When an oxide semiconductor is used for the semiconductor layer 242, the layer preferably includes c-axis aligned crystalline oxide semiconductor (CAAC-OS). A CAAC-OS is an oxide semiconductor having a plurality of c-axis aligned crystal parts.

In the oxide semiconductor layer used as the semiconductor layer 242, a region where CAAC is not formed preferably accounts for less than 20% of the whole oxide semiconductor layer.

The CAAC-OS has dielectric anisotropy. Specifically, the CAAC-OS has a larger dielectric constant in the c-axis direction than in the a-axis direction and the b-axis direction. In a transistor in which a CAAC-OS is used for a semiconductor layer where a channel is formed and a gate electrode is positioned in the c-axis direction, the dielectric constant in the c-axis direction is large; thus, the electric field generated from the gate electrode easily reaches the entire CAAC-OS. The subthreshold swing value (S value) can be made small. In addition, in the transistor in which a CAAC-OS is used for the semiconductor layer, an increase in S value due to miniaturization is less likely to occur.

Moreover, since the dielectric constant in the a-axis direction and the b-axis direction of an CAAC-OS is small, an influence of the electric field generated between a source and a drain is reduced. Thus, a channel length modulation effect, a short-channel effect, or the like is less likely to occur, whereby the reliability of the transistor can be increased.

Here, the channel length modulation effect is a phenomenon in which, when the drain voltage is higher than the threshold voltage, a depletion layer expands from the drain side, so that the effective channel length is decreased. The short-channel effect is a phenomenon in which a short channel length leads to deterioration in electrical characteristics such as a decrease in threshold voltage. The more a transistor is miniaturized, the more deterioration in electrical characteristics caused by the phenomena is likely to occur.

Note that after the oxide semiconductor layer is formed, oxygen doping treatment may be performed. In order to further decrease impurities such as water or hydrogen in the oxide semiconductor layer to highly purify the oxide semiconductor layer, heat treatment is preferably performed.

For example, the oxide semiconductor layer is subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and being filled with nitrogen or a rare gas.

By the heat treatment, at the same time as the release of the impurities, oxygen contained in the insulating layer 226 is diffused to the oxide semiconductor layer and oxygen vacancies in the oxide semiconductor layer can be reduced. Note that the heat treatment may be performed in such a manner that heat treatment is performed in an inert gas atmosphere, and then another heat treatment is performed in an atmosphere containing an oxidation gas at 10 ppm or more, 1% or more, or 10% or more in order to compensate for desorbed oxygen. The heat treatment may be performed at any time after the oxide semiconductor layer is formed.

There is no particular limitation on a heat treatment apparatus used for the heat treatment, and the apparatus may be an apparatus that heats an object to be processed by heat conduction or heat radiation from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

The heat treatment is performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

<Electrode>

As a conductive material for forming the electrodes 246, 223, 244a, 244b, 287, 297, 289a, 289b, 292a, and 292b, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, and the like can be used. Alternatively, a semiconductor having a high electric conductivity typified by polycrystalline silicon including an impurity element such as phosphorus, or silicide such as nickel silicide may be used. A plurality of stacked conductive layers formed with these materials may be used as the electrode.

The conductive material for forming the electrodes 246, 223, 244a, 244b, 287, 297, 289a, 289b, 292a, and 292b can also be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added, or a conductive material containing nitrogen, such as titanium nitride or tantalum nitride. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen. There is no particular limitation on the formation method of the conductive material, and any of a variety of formation methods such as an evaporation method, a CVD method, a sputtering method, and a spin coating method can be employed.

<Contact Plug>

A conductive material with high embeddability, such as tungsten or polysilicon, can be used for the contact plugs 288a, 288b, 288c, 298a, and 298b, for example. A side surface and a bottom surface of the material may be covered with a barrier layer (a diffusion prevention layer) of a titanium layer, a titanium nitride layer, or a stacked layer of these layers. In this case, the barrier layer is regarded as part of the contact plug in some cases.

According to one embodiment of the present invention, a transistor with favorable electrical characteristics can be provided. Furthermore, according to one embodiment of the present invention, a semiconductor device having a high degree of integration can be provided.

This embodiment can be implemented in an appropriate combination with any of the structures described in the other embodiments.

(Embodiment 5)

Some or all of driver circuits which include the transistors described in the above embodiments can be formed over a substrate where a pixel portion is formed, whereby a system-on-panel can be obtained. Structure examples of a display device to which the transistors described in the above embodiments can be used are described with reference to FIGS. 35A to 35C and FIGS. 36A and 36B.

[Liquid Crystal Display Device and EL Display Device]

Figure 35A:
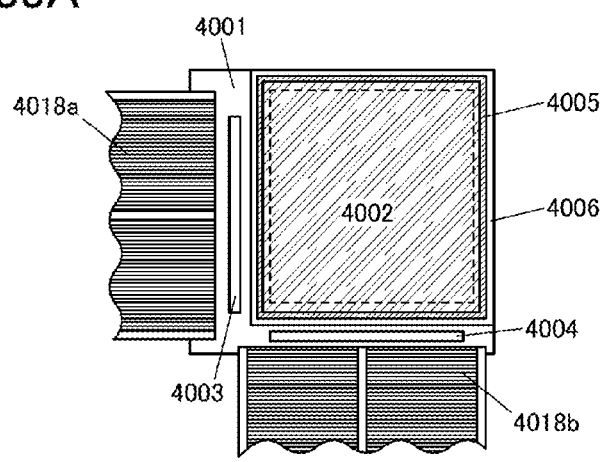
FIGS. 35A to 35C each illustrate an example of a display device.

A display device including a liquid crystal element and a display device including an EL element will be described as examples of the display device. In FIG. 35A, a sealant 4005 is provided so as to surround a pixel portion 4002 provided over a first substrate 4001, and the pixel portion 4002 is sealed by the sealant 4005 and a second substrate 4006. In FIG. 35A, a signal line driver circuit 4003 and a scan line driver circuit 4004 each are formed using a single-crystal semiconductor or a polycrystalline semiconductor over another substrate, and mounted in a region different from the region surrounded by the sealant 4005 over the first substrate 4001. Various signals and potentials are supplied to the signal line driver circuit 4003, and the scan line driver circuit 4004, and the pixel portion 4002 from flexible printed circuits (FPCs) 4018a and 4018b.

Figure 35B:
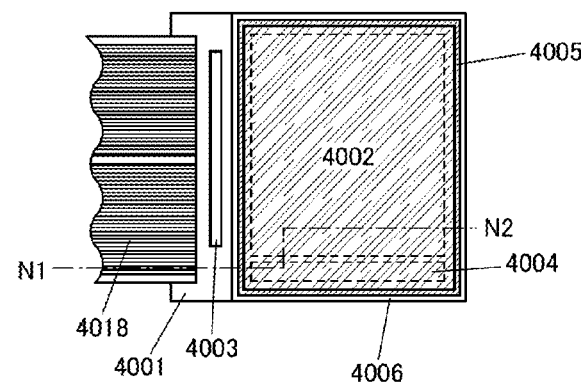
Figure 35C:
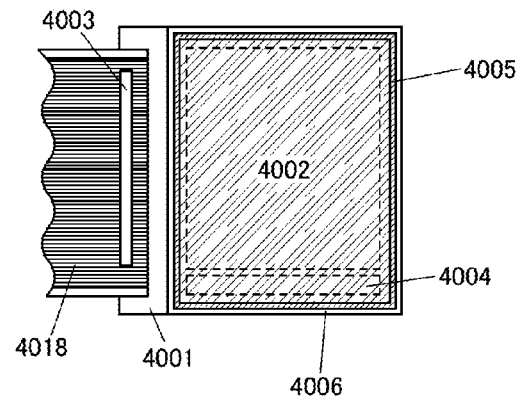

In FIGS. 35B and 35C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. Further, in FIGS. 35B and 35C, the signal line driver circuit 4003 which is formed using a single-crystal semiconductor or a polycrystalline semiconductor over another substrate is mounted in a region that is different from the region surrounded by the sealant 4005 over the first substrate 4001. In FIGS. 35B and 35C, various signals and potentials are supplied to the signal line driver circuit 4003, the scan line driver circuit 4004, and the pixel portion 4002 through an FPC 4018.

Although FIGS. 35B and 35C each illustrate an example in which the signal line driver circuit 4003 is formed separately and mounted on the first substrate 4001, an embodiment of the present invention is not limited to this structure. The scan line driver circuit may be separately formed and then mounted, or only part of the signal line driver circuit or part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 35A illustrates an example in which the signal line driver circuit 4003 and the scan line driver circuit 4004 are mounted by a COG; FIG. 35B illustrates an example in which the signal line driver circuit 4003 is mounted by a COG; FIG. 35C illustrates an example in which the signal line driver circuit 4003 is mounted by a TCP.

In some cases, the display device encompasses a panel in which a display element is sealed, and a module in which an IC or the like including a controller is mounted on the panel.

The pixel portion and the scan line driver circuit provided over the first substrate include a plurality of transistors and any of the transistors which are described in the above embodiments can be applied thereto.

Figure 36A:
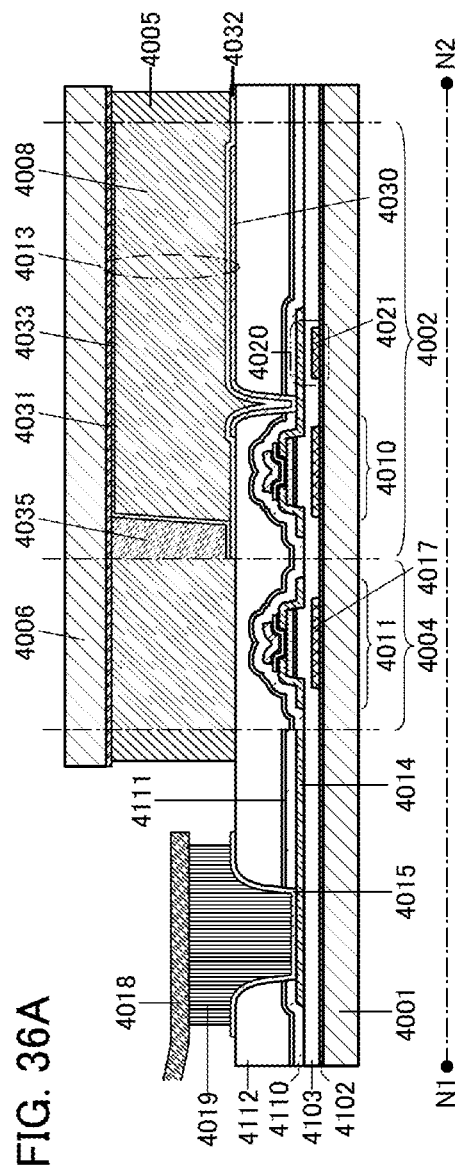
FIGS. 36A and 36B each illustrate an example of a display device.
Figure 36B:
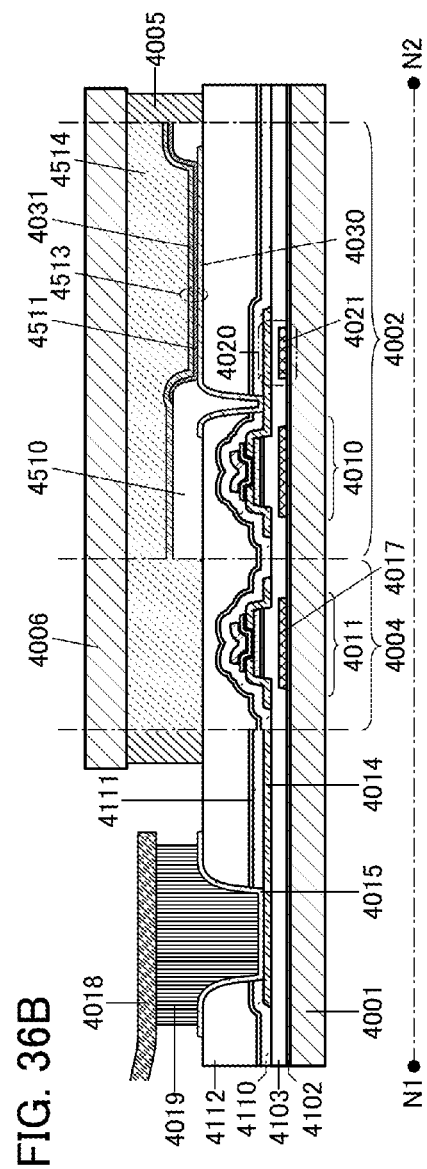

FIGS. 36A and 36B correspond to cross-sectional views taken along chain line N1-N2 in FIG. 35B. As shown in FIGS. 36A and 36B, the display device has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110.

The electrode 4015 is formed using the same conductive layer as a first electrode layer 4030, and the wiring 4014 is formed using the same conductive layer as source and drain electrodes of transistors 4010 and 4011.

The pixel portion 4002 and the scan line driver circuit 4004 provided over the first substrate 4001 include a plurality of transistors. In FIGS. 36A and 36B, the transistor 4010 included in the pixel portion 4002 and the transistor 4011 included in the scan line driver circuit 4004 are shown as an example. The insulating layers 4112, 4111, and 4110 are provided over the transistors 4010 and 4011 in FIG. 36A, and a bank 4510 is further provided over the insulating layer 4112 in FIG. 36B.

The transistors 4010 and 4011 are provided over an insulating layer 4102. The transistors 4010 and 4011 each include an electrode 4017 over the insulating layer 4102. An insulating layer 4103 is formed over the electrode 4017. The electrode 4017 can serve as a back gate electrode.

Any of the transistors described in the above embodiments can be applied to the transistors 4010 and 4011. A change in the electric characteristics of the transistors described in the above embodiments is suppressed and thus the transistors are electrically stable. Accordingly, the display devices of this embodiment illustrated in FIGS. 36A and 36B can be highly reliable display devices.

FIGS. 36A and 36B illustrate the case where a transistor having a structure similar to that of the transistor 451 described in the above embodiment is used as each of the transistors 4010 and 4011.

The display devices illustrated in FIGS. 36A and 36B each include a capacitor 4020. The capacitor 4020 includes a region where part of the source electrode or part of the drain electrode of the transistor 4010 overlaps with an electrode 4021 with the insulating layer 4103 positioned therebetween. The electrode 4021 is formed using the same conductive layer as the electrode 4017.

In general, the capacitance of a capacitor provided in a display device is set in consideration of leakage current or the like of transistors provided in a pixel portion so that charge can be held for a predetermined period. The capacitance of the capacitor may be set considering off-state current of the transistor or the like.

For example, when an OS transistor is used for a pixel portion of a liquid crystal display device, the capacitance of the capacitor can be one-third or smaller, furthermore, one-fifth or smaller of the liquid crystal capacitance. Using an OS transistor can omit the formation of a capacitor.

The transistor 4010 included in the pixel portion 4002 is electrically connected to the display element. An example of a liquid crystal display device using a liquid crystal element as a display element is illustrated in FIG. 36A. In FIG. 36A, a liquid crystal element 4013 which is a display element includes the first electrode layer 4030, a second electrode layer (a second electrode) 4031, and a liquid crystal layer 4008. Note that an insulating layer 4032 and an insulating layer 4033 functioning as alignment films are provided so that the liquid crystal layer 4008 is provided therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control the distance between the first electrode layer 4030 and the second electrode layer 4031 (a cell gap). Alternatively, a spherical spacer may be used.

OS transistors are preferably used as the transistors 4010 and 4011. In the OS transistor, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In the OS transistor, relatively high field-effect mobility can be obtained, whereby high-speed operation is possible. Consequently, when the above transistor is used in a pixel portion of a display device, high-quality images can be obtained. Since a driver circuit portion and the pixel portion can be formed over one substrate with the use of the above transistor, the number of components of the display device can be reduced.

In the display device, a black matrix (a light-blocking layer), an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a sidelight, or the like may be used as a light source.

As the display element included in the display device, a light-emitting element utilizing electroluminescence (also referred to as an "EL element") can be used. An EL element includes a layer containing a light-emitting compound (also referred to as an "EL layer") between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected from one electrode to the EL layer and holes are injected from the other electrode to the EL layer. The electrons and holes (i.e., carriers) are recombined; thus, the light-emitting organic compound becomes in an excited state. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by an evaporation method (including a vacuum evaporation method), a transfer method, a printing method, an inkjet method, a coating method, or the like.

Inorganic EL elements are classified into dispersed inorganic EL elements and thin-film inorganic EL elements, on the basis of their element structures. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

In order to extract light emitted from the light-emitting element, at least one of a pair of electrodes is transparent. The light-emitting element formed together with a transistor over a substrate can have a top emission structure in which light emission is extracted from the side opposite to the substrate; a bottom emission structure in which light emission is extracted from the substrate side; or a dual emission structure in which light emission is extracted from both the side opposite to the substrate and the substrate side.

FIG. 36B illustrates an example of a light-emitting display device (also referred to as an "EL display device") using a light-emitting element as a display element. A light-emitting element 4513 which is the display element is electrically connected to the transistor 4010 provided in the pixel portion 4002. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on a direction in which light is extracted from the light-emitting element 4513, or the like.

The bank 4510 is formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 may be formed using a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is formed with the first substrate 4001, the second substrate 4006, and the sealant 4005, a filler 4514 is provided for sealing. It is preferable that, in this manner, the light-emitting element be packaged (sealed) with a protective film (such as a laminate film or an ultraviolet curable resin film) or a cover member with high air-tightness and little degasification so that the light-emitting element is not exposed to the outside air.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

A glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if needed, an optical film, such as a polarizing plate, a circularly polarizing plate (including an elliptically polarizing plate), a retardation plate (a $\lambda/4$ plate or a $\lambda/2$ plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 each can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or more kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof, and nitrides thereof.

A conductive composition containing a conductive high molecule (also called conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protective circuit for protecting the driver circuit is preferably provided. The protection circuit is preferably formed using a nonlinear element.

With the use of the transistor described in the above embodiment, a highly reliable display device can be provided. With the use of the transistor described in the above embodiment, a display device that has a high resolution, a large size, and high display quality can be provided. Furthermore, a display device with low power consumption can be provided.

[Display Module]

Figure 37:
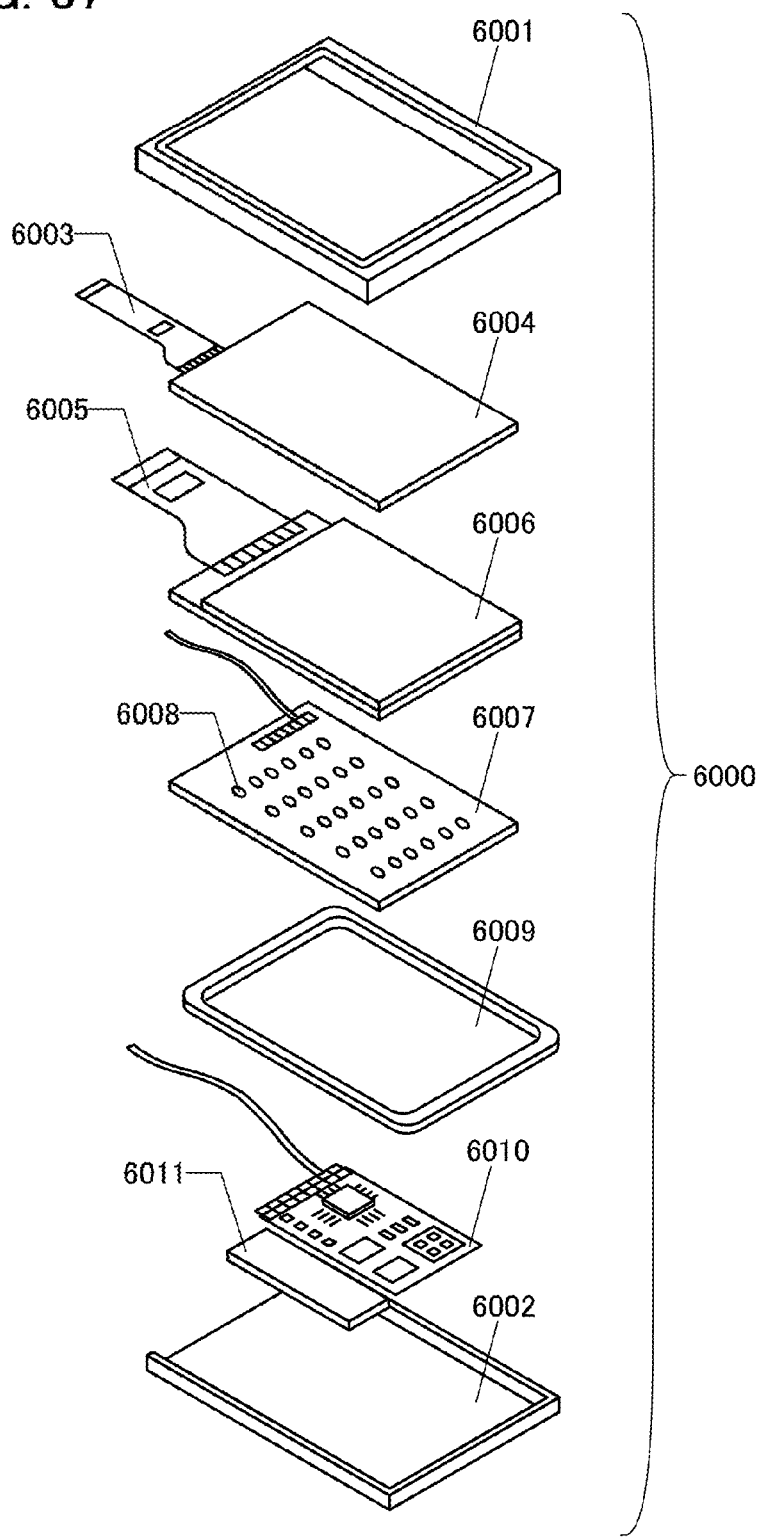
FIG. 37 illustrates an example of a display module.

A display module is described as an example of a semiconductor device using the above-described transistor. In a display module 6000 in FIG. 37, a touch sensor 6004 connected to an FPC 6003, a display panel 6006 connected to an FPC 6005, a backlight unit 6007, a frame 6009, a printed circuit board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, an integrated circuit mounted on the printed circuit board 6010, and the like. For example, the above-described display device can be used in the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch sensor or a capacitive touch sensor and may overlap with the display panel 6006. The display panel 6006 itself can have a touch sensor function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed circuit board 6010 side. The frame 6009 may function as a radiator plate.

The printed circuit board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a member such as a polarizing plate, a retardation plate, or a prism sheet.

This embodiment can be combined as appropriate with any of the other embodiments and examples in this specification.

(Embodiment 6)

In this embodiment, examples of electronic devices including any of the semiconductor devices disclosed in this specification and the like will be described.

Specific examples of the electronic device that uses the semiconductor device of one embodiment of the present invention are as follows: display devices of televisions, monitors, and the like, lighting devices, desktop and laptop personal computers, word processors, image reproduction devices that reproduce still images and moving images stored in recording media such as digital versatile discs (DVDs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Further, industrial equipment such as guide lights, traffic lights, belt conveyors, elevators, escalators, industrial robots, power storage systems, and power storage devices for leveling the amount of power supply and smart grid can be given. In addition, moving objects and the like driven by electric motors using power from secondary batteries and fuel engines may also be included in the range of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 38A:
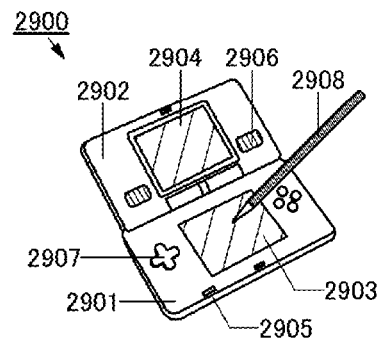
FIGS. 38A to 38H each illustrate an electronic device.

A portable game machine 2900 illustrated in FIG. 38A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 38A has the two display portions 2903 and 2904, the number of display portions included in a portable game machine is not limited to this. The display portion 2903 is provided with a touch screen as an input device, which can be handled with a stylus 2908 or the like.

Figure 38B:
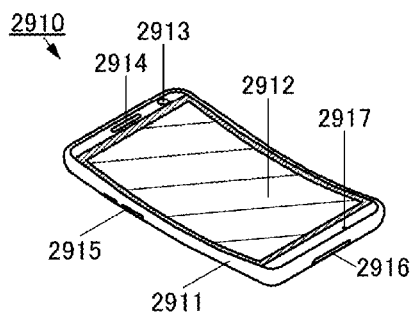

An information terminal 2910 illustrated in FIG. 38B includes a housing 2911, a display portion 2912, a microphone 2917, a speaker portion 2914, a camera 2913, an external connection portion 2916, an operation switch 2915, and the like. A display panel and a touch screen that use flexible substrates are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 38C:
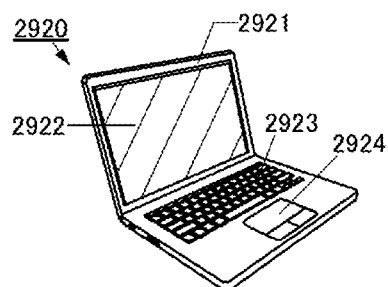

A notebook personal computer 2920 illustrated in FIG. 38C includes a housing 2921, a display portion 2922, a keyboard 2923, a pointing device 2924, and the like. In addition, the notebook personal computer 2920 includes an antenna, a battery, and the like inside the housing 2921.

Figure 38D:
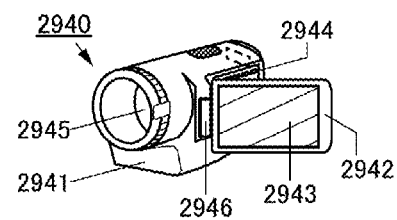

A video camera 2940 in FIG. 38D includes a housing 2941, a housing 2942, a display portion 2943, operation switches 2944, a lens 2945, a joint 2946, and the like. The operation switches 2944 and the lens 2945 are provided in the housing 2941, and the display portion 2943 is provided in the housing 2942. In addition, the video camera 2940 includes an antenna, a battery, and the like inside the housing 2941. The housings 2941 and 2942 are connected to each other with the joint 2946, and the angle between the housings 2941 and 2942 can be changed with the joint 2946. The direction of an image on the display portion 2943 may be changed and display and non-display of an image may be switched depending on the angle between the housings 2941 and 2942.

Figure 38E:
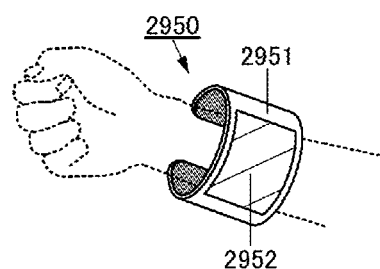

FIG. 38E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 38F:
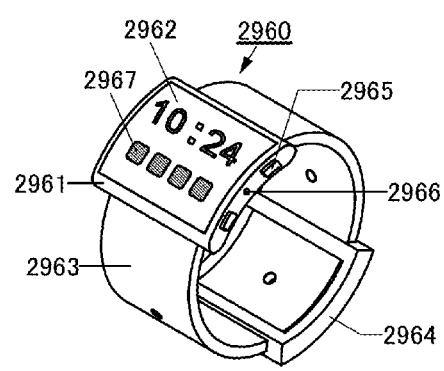

FIG. 38F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, viewing and editing texts, music reproduction, Internet communication, and computer games.

The display surface of the display portion 2962 is bent, and images can be displayed on the bent display surface. Further, the display portion 2962 includes a touch sensor, and operation can be performed by touching the screen with a finger, a stylus, or the like. For example, by touching an icon 2967 displayed on the display portion 2962, an application can be started. With the operation switch 2965, a variety of functions such as time setting, ON/OFF of the power, ON/OFF of wireless communication, setting and cancellation of a silent mode, and setting and cancellation of a power saving mode can be performed. For example, the functions of the operation switch 2965 can be set by setting the operating system incorporated in the information terminal 2960.

The information terminal 2960 can employ near field communication that is a communication method based on an existing communication standard. In that case, for example, mutual communication between the portable information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 38G:
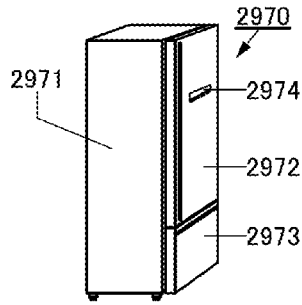

FIG. 38G illustrates an electric refrigerator-freezer as an example of a home electric appliance. An electric refrigerator-freezer 2970 includes a housing 2971, a refrigerator door 2972, a freezer door 2973, a display portion 2974, and the like.

Figure 38H:
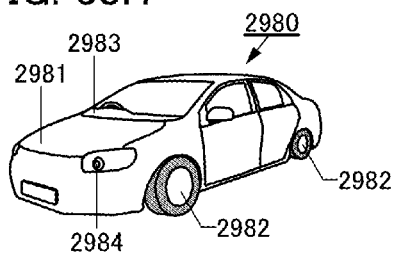

FIG. 38H is an external view illustrating an example of a car. A car 2980 includes a car body 2981, wheels 2982, a dashboard 2983, lights 2984, and the like. The car 2980 includes an antenna, a battery, and the like.

The electronic devices shown in this embodiment each include the semiconductor device of one embodiment of the present invention.

This embodiment can be implemented in an appropriate combination with any of the structures described in the other embodiments.

(Embodiment 7)

<Composition of CAC-OS>

Described below is the composition of a cloud aligned complementary oxide semiconductor (CAC-OS) applicable to the transistors described in the above embodiments.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ and $In_{X2}Zn_{Y2}O_{Z2}$ forming the mosaic pattern are evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are partly observed and nanoparticle regions including In as a main component are partly observed. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium, nanoparticle regions including the selected element(s) as a main component(s) are partly observed and nanoparticle regions including In as a main component are partly observed, and these nanoparticle regions are randomly dispersed to form a mosaic pattern in a CAC-OS.

<Analysis of CAC-OS>

Next, measurement results of an oxide semiconductor over a substrate by a variety of methods are described.

[Structure of Samples and Formation Method Thereof]

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

[Analysis by X-Ray Diffraction]

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 39:
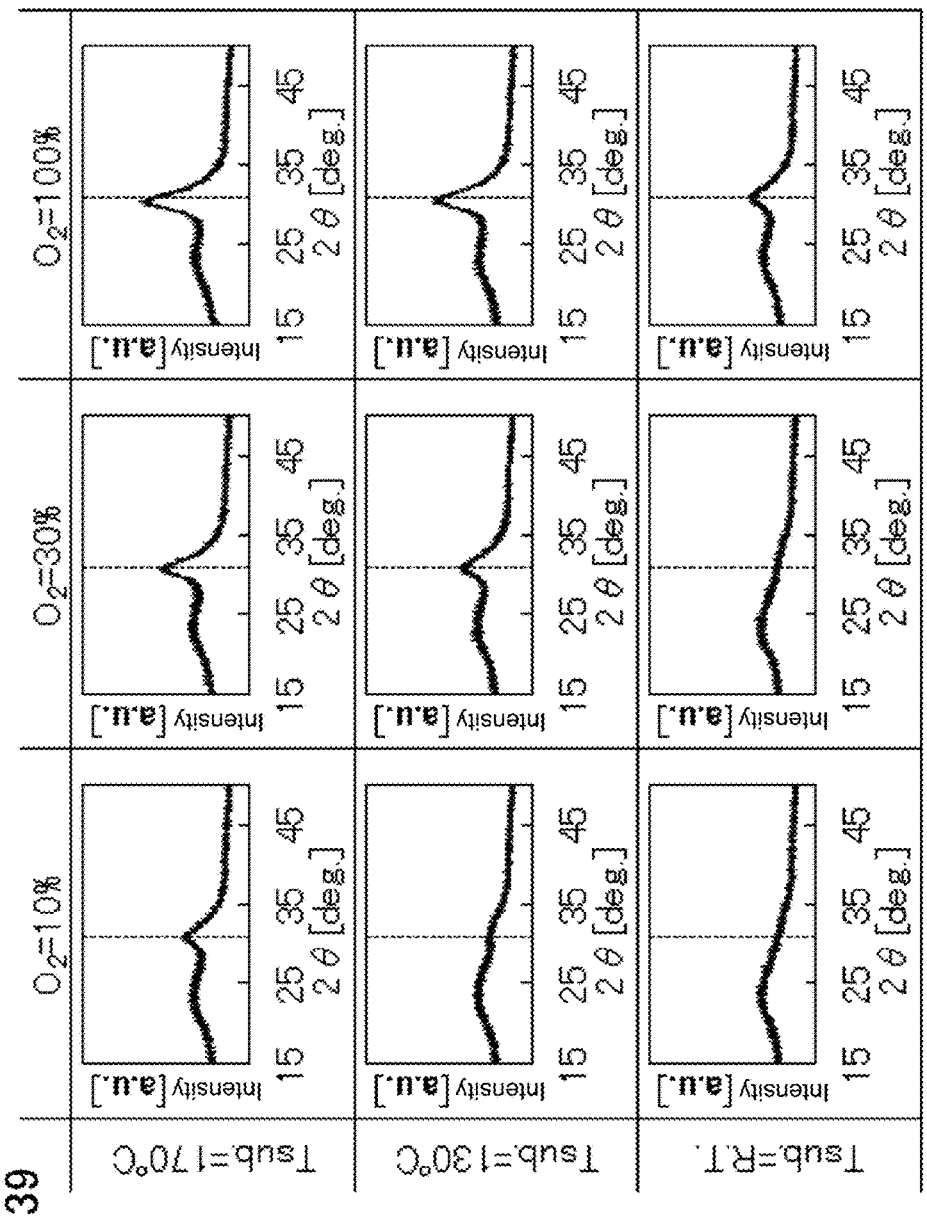
FIG. 39 shows measured XRD spectra of samples.

FIG. 39 shows XRD spectra measured by an out-of-plane method. In FIG. 39, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 39, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 39, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

[Analysis with Electron Microscope]

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 40A is a plan-view TEM image of the sample formed at a substrate temperature of R.T. and with an oxygen gas flow rate ratio of 10%. FIG. 40B is a cross-sectional TEM image of the sample formed at a substrate temperature of R.T. and with an oxygen gas flow rate ratio of 10%.

[Analysis of Electron Diffraction Patterns]

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 40A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 40C, 40D, 40E, 40F, and 40G show the results of the points indicated by the black dots a1, a2, a3, a4, and a5, respectively.

In FIGS. 40C, 40D, 40E, 40F, and 40G, regions with high luminance in a circular (ring) pattern can be shown. Furthermore, a plurality of spots can be seen in a ring-like shape.

Electron diffraction patterns of points indicated by black dots b1, b2, b3, b4, and b5 in the cross-sectional TEM image in FIG. 40B of the sample formed at a substrate temperature of R.T. and an oxygen gas flow rate ratio of 10% are observed. FIGS. 40H, 40I, 40J, 40K, and 40L show the results of the points indicated by the black dots b1, b2, b3, b4, and b5, respectively.

In FIGS. 40H, 40I, 40J, 40K, and 40L, regions with high luminance in a ring pattern can be shown. Furthermore, a plurality of spots can be seen in a ring-like shape.

For example, when an electron beam with a probe diameter of 300 nm is incident on a CAAC-OS including an InGaZnO$_4$ crystal in a direction parallel to the sample surface, a diffraction pattern including a spot derived from the (009) plane of the InGaZnO$_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

[Elementary Analysis]

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 41A:
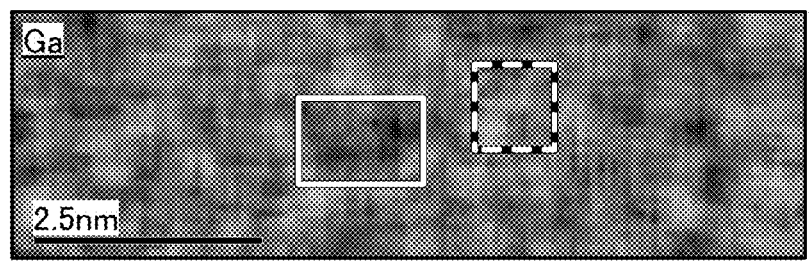
FIGS. 41A to 41C show EDX mapping images of a sample.
Figure 41B:
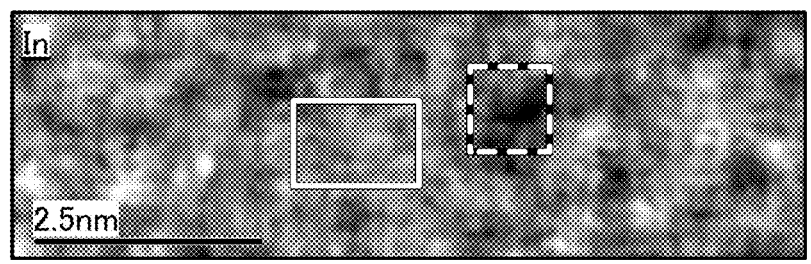
Figure 41C:
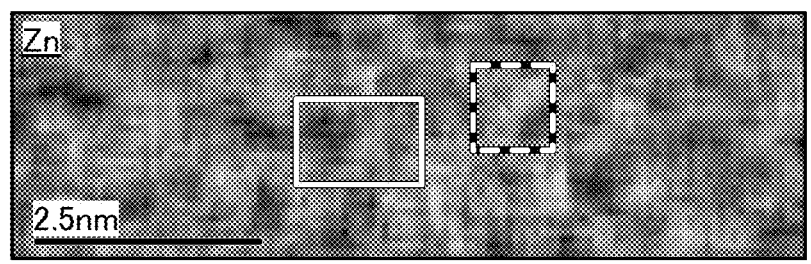

FIGS. 41A to 41C show EDX mapping images in a cross section of the sample formed at a substrate temperature of R.T. and with an oxygen gas flow rate ratio of 10%. FIG. 41A shows an EDX mapping image of Ga atoms. The proportion of the Ga atoms in all the atoms is 1.18 atomic % to 18.64 atomic %. FIG. 41B shows an EDX mapping image of In atoms. The proportion of the In atoms in all the atoms is 9.28 atomic % to 33.74 atomic %. FIG. 41C shows an EDX mapping image of Zn atoms. The proportion of the Zn atoms in all the atoms is 6.69 atomic % to 24.99 atomic %. FIGS. 41A to 41C show the same region in the cross section of the sample formed at a substrate temperature of R.T. and with an oxygen flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 41A to 41C is 7200000 times.

The EDX mapping images in FIGS. 41A to 41C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 41A to 41C are examined.

In FIG. 41A, a relatively dark region occupies a large area in the area surrounded by the solid line, while a relatively bright region occupies a large area in the area surrounded by the dashed line. In FIG. 41B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 41C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 41C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 41A to 41C, the In atoms are relatively more uniformly distributed than the Ga atoms, and regions including $InO_{X1}$ as a main component is seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a composition in which the regions including $GaO_{X3}$ or the like as a main component and the regions including $In_{X2}Zn_{Y2}O_{Z2}$ or $InO_{X1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, in addition to the several or more bright spots, the crystal structure is defined as having high luminance regions appearing in a ring pattern.

As shown in FIGS. 41A to 41C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor exhibits. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (μ) can be achieved.

A semiconductor element including a CAC-OS has high reliability. Thus, the CAC-OS is suitably used in a variety of semiconductor devices typified by a display.

This embodiment can be implemented in an appropriate combination with any of the structures described in the other embodiments.

This application is based on Japanese Patent Application serial no. 2015-133572 filed with Japan Patent Office on Jul. 2, 2015 and Japanese Patent Application serial no. 2016-118083 filed with Japan Patent Office on Jun. 14, 2016, the entire contents of which are hereby incorporated by reference.

What is claimed is:

1. A semiconductor device comprising:
   a first circuit; and
   a second circuit,
   wherein the first circuit includes t current sources $I_1$ to $I_t$ (t is a natural number of 2 or more) and t switches $S_1$ to $S_t$,
   wherein a j-th current source $I_j$ (j is a natural number larger than or equal to 1 and smaller than or equal to t) is electrically connected to one terminal of a j-th switch $S_j$,
   wherein the other terminal of each of the switches $S_1$ to $S_t$ is electrically connected to a first node,
   wherein the second circuit includes a third circuit and a fourth circuit,
   wherein the third circuit includes a first switch, a second switch, a third switch and a first capacitor,
   wherein one terminal of the first switch is electrically connected to the first node, and the other terminal of the first switch is electrically connected to a third node,
   wherein one terminal of the second switch is electrically connected to the third node, and the other terminal of the second switch is electrically connected to a fourth node,
   wherein one terminal of the third switch is electrically connected to the third node, and the other terminal of the third switch is electrically connected to a second node,
   wherein one terminal of the first capacitor is electrically connected to the third node, and the other terminal of the first capacitor is electrically connected the fourth node,
   wherein the fourth circuit includes a fourth switch, a fifth switch, a sixth switch and a second capacitor,
   wherein one terminal of the fourth switch is electrically connected to the first node, and the other terminal of the fourth switch is electrically connected to a fifth node,
   wherein one terminal of the fifth switch is electrically connected to the fifth node, and the other terminal of the fifth switch is electrically connected to a sixth node,
   wherein one terminal of the sixth switch is electrically connected to the fifth node, and the other terminal of the sixth switch is electrically connected to the second node, and
   wherein one terminal of the second capacitor is electrically connected to the fifth node, and the other terminal of the second capacitor is electrically connected to the sixth node.

2. The semiconductor device according to claim 1, wherein each of the switches $S_1$ to $S_t$ is a transistor.

3. The semiconductor device according to claim 2, wherein the transistor includes an oxide semiconductor in a semiconductor layer in which a channel is formed.

4. The semiconductor device according to claim 1, wherein at least one of the first to sixth switches is a transistor.

5. The semiconductor device according to claim 4, wherein the transistor includes an oxide semiconductor in a semiconductor layer in which a channel is formed.

6. The semiconductor device according to claim 1, wherein the second node is electrically connected to a fifth circuit.

7. The semiconductor device according to claim 6, wherein the fifth circuit has a function as a buffer.

8. The semiconductor device according to claim 6, wherein the fifth circuit has a function as a differential amplifier circuit.

9. An electronic device comprising:
   the semiconductor device according to claim 1; and
   at least one of an antenna, a battery, a housing, a speaker, a microphone, and an operation switch.

10. A semiconductor device comprising:
    a first current source;
    a second current source;
    a first switch;
    a second switch;
    a third switch, wherein one terminal of the third switch is electrically connected to the first current source through the first switch and electrically connected to the second current source through the second switch;
    a first transistor;
    a fourth switch;
    a capacitor, wherein one terminal of the capacitor is electrically connected to the other terminal of the third switch and one terminal of the fourth switch; and
    a circuit electrically connected to the other terminal of the fourth switch,
    wherein the one terminal of the capacitor is directly connected to one of a source and a drain of the first transistor, and
    wherein the other terminal of the capacitor is directly connected to the other of the source and the drain of the first transistor.

11. The semiconductor device according to claim 10, wherein each of third switch and the fourth switch is a second transistor.

12. The semiconductor device according to claim 11, wherein the second transistor includes an oxide semiconductor in a semiconductor layer in which a channel is formed.

13. The semiconductor device according to claim 10, wherein the circuit has a function as a buffer.

14. The semiconductor device according to claim 10, wherein the circuit has a function as a differential amplifier circuit.

15. An electronic device comprising:
    the semiconductor device according to claim 10; and
    at least one of an antenna, a battery, a housing, a speaker, a microphone, and an operation switch.

16. The semiconductor device according to claim 10, wherein the first transistor includes an oxide semiconductor in a semiconductor layer in which a channel is formed.

17. The semiconductor device according to claim 10, wherein the other terminal of the capacitor and the other of the source and the drain of the first transistor are electrically connected to a node which is supplied with a constant potential.

18. A semiconductor device comprising:
a first current source;
a second current source;
a first switch;
a second switch;
a third switch, wherein one terminal of the third switch is electrically connected to the first current source through the first switch and electrically connected to the second current source through the second switch;
a first transistor;
a capacitor, wherein one terminal of the capacitor is electrically connected to the other terminal of the third switch; and
a circuit electrically connected to the other terminal of the capacitor,
wherein the one terminal of the capacitor is directly connected to one of a source and a drain of the first transistor, and
wherein the other terminal of the capacitor is directly connected to the other of the source and the drain of the first transistor.

19. The semiconductor device according to claim 18, wherein the first transistor includes an oxide semiconductor in a semiconductor layer in which a channel is formed.

20. The semiconductor device according to claim 18, wherein the other terminal of the capacitor and the other of the source and the drain of the first transistor are electrically connected to a node which is supplied with a constant potential.

* * * * *